(12) United States Patent
Luby et al.

(10) Patent No.: US 9,419,749 B2
(45) Date of Patent: Aug. 16, 2016

(54) METHODS AND APPARATUS EMPLOYING FEC CODES WITH PERMANENT INACTIVATION OF SYMBOLS FOR ENCODING AND DECODING PROCESSES

(75) Inventors: Michael G. Luby, Berkeley, CA (US);
Mohammad Amin Shokrollahi, Preverenges (CH); Lorenz Christoph Minder, Palo Alto, CA (US)

(73) Assignee: QUALCOMM Incorporated, San Diego, CA (US)

( * ) Notice: Subject to any disclaimer, the term of this patent is extended or adjusted under 35 U.S.C. 154(b) by 408 days.

(21) Appl. No.: 12/859,161

(22) Filed: Aug. 18, 2010

(65) Prior Publication Data
US 2011/0299629 A1    Dec. 8, 2011

Related U.S. Application Data

(63) Continuation-in-part of application No. 12/604,773, filed on Oct. 23, 2009, now Pat. No. 7,956,772.

(60) Provisional application No. 61/353,910, filed on Jun. 11, 2010, provisional application No. 61/257,146, filed on Nov. 2, 2009, provisional application No. 61/235,285, filed on Aug. 19, 2009.

(51) Int. Cl.
*H03M 7/00* (2006.01)
*H04L 1/00* (2006.01)
(Continued)

(52) U.S. Cl.
CPC ......... *H04L 1/0041* (2013.01); *H03M 13/3761* (2013.01); *H03M 13/458* (2013.01); *H04L 1/0065* (2013.01); *H04L 1/0066* (2013.01)

(58) Field of Classification Search
CPC .......... H03M 13/3761; H03M 13/373; H03M 13/3746; H03M 13/47; H03M 13/00; H03M 13/1575; H03M 7/46
USPC .......... 341/50, 51, 60, 94; 714/746, 751, 752, 714/782, 786; 375/254, 340, 341
See application file for complete search history.

(56) References Cited

U.S. PATENT DOCUMENTS

| 3,909,721 A | 9/1975 | Bussgang et al. |
| 4,365,338 A | 12/1982 | McRae et al. |

(Continued)

FOREIGN PATENT DOCUMENTS

| CN | 1338839 A | 3/2002 |
| CN | 1425228 A | 6/2003 |

(Continued)

OTHER PUBLICATIONS

3GPP TS 26.234 V9.1.0, "3rd Generation Partnership Project; Technical Specification Group Services and System Aspects; Transparent end-to-end Packet-switched Streaming Service (PSS); Protocols and codecs (Release 9)", Dec. 2009, 179 pages.

(Continued)

*Primary Examiner* — Linh Nguyen

(57) ABSTRACT

Encoding of a plurality of encoded symbols is provided wherein an encoded symbol is generated from a combination of a first symbol generated from a first set of intermediate symbols and a second symbol generated from a second set of intermediate symbols, each set having at least one different coding parameter, wherein the intermediate symbols are generated based on the set of source symbols. A method of decoding data is also provided, wherein a set of intermediate symbols is decoded from a set of received encoded symbols, the intermediate symbols organized into a first and second sets of symbols for decoding, wherein intermediate symbols in the second set are permanently inactivated for the purpose of scheduling the decoding process to recover the intermediate symbols from the encoded symbols, wherein at least some of the source symbols are recovered from the decoded set of intermediate symbols.

114 Claims, 26 Drawing Sheets

(51) Int. Cl.
*H03M 13/37* (2006.01)
*H03M 13/45* (2006.01)

(56) References Cited

U.S. PATENT DOCUMENTS

| | | | |
|---|---|---|---|
| 4,589,112 A | 5/1986 | Karim |
| 4,901,319 A | 2/1990 | Ross |
| 5,043,909 A | 8/1991 | Meyers et al. |
| 5,136,592 A | 8/1992 | Weng |
| 5,153,591 A | 10/1992 | Clark |
| 5,329,369 A | 7/1994 | Willis et al. |
| 5,331,320 A | 7/1994 | Cideciyan et al. |
| 5,371,532 A | 12/1994 | Gelman et al. |
| 5,372,532 A | 12/1994 | Robertson, Jr. |
| 5,379,297 A | 1/1995 | Glover et al. |
| 5,421,031 A | 5/1995 | De Bey |
| 5,425,050 A | 6/1995 | Schreiber et al. |
| 5,432,787 A | 7/1995 | Chethik |
| 5,455,823 A | 10/1995 | Noreen et al. |
| 5,465,318 A | 11/1995 | Sejnoha |
| 5,517,508 A | 5/1996 | Scott |
| 5,524,025 A | 6/1996 | Lawrence et al. |
| 5,566,208 A | 10/1996 | Balakrishnan |
| 5,568,614 A | 10/1996 | Mendelson et al. |
| 5,583,784 A | 12/1996 | Kapust et al. |
| 5,608,738 A | 3/1997 | Matsushita |
| 5,617,541 A | 4/1997 | Albanese et al. |
| 5,642,365 A | 6/1997 | Murakami et al. |
| 5,659,614 A | 8/1997 | Bailey, III |
| 5,699,473 A | 12/1997 | Kim |
| 5,701,582 A | 12/1997 | DeBey |
| 5,751,336 A | 5/1998 | Aggarwal et al. |
| 5,754,563 A | 5/1998 | White |
| 5,757,415 A | 5/1998 | Asamizuya et al. |
| 5,802,394 A | 9/1998 | Baird et al. |
| 5,805,825 A | 9/1998 | Danneels et al. |
| 5,835,165 A | 11/1998 | Keate et al. |
| 5,844,636 A | 12/1998 | Joseph et al. |
| 5,852,565 A | 12/1998 | Demos |
| 5,870,412 A | 2/1999 | Schuster et al. |
| 5,903,775 A | 5/1999 | Murray |
| 5,917,852 A | 6/1999 | Butterfield et al. |
| 5,926,205 A | 7/1999 | Krause et al. |
| 5,933,056 A | 8/1999 | Rothenberg |
| 5,936,659 A | 8/1999 | Viswanathan et al. |
| 5,936,949 A | 8/1999 | Pasternak et al. |
| 5,953,537 A | 9/1999 | Balicki et al. |
| 5,970,098 A | 10/1999 | Herzberg |
| 5,983,383 A | 11/1999 | Wolf |
| 5,993,056 A | 11/1999 | Vaman et al. |
| 6,005,477 A | 12/1999 | Deck et al. |
| 6,011,590 A | 1/2000 | Saukkonen |
| 6,012,159 A | 1/2000 | Fischer et al. |
| 6,014,706 A | 1/2000 | Cannon et al. |
| 6,018,359 A | 1/2000 | Kermode et al. |
| 6,041,001 A | 3/2000 | Estakhri |
| 6,044,485 A | 3/2000 | Dent et al. |
| 6,061,820 A | 5/2000 | Nakakita et al. |
| 6,073,250 A | 6/2000 | Luby et al. |
| 6,079,041 A | 6/2000 | Kunisa et al. |
| 6,079,042 A | 6/2000 | Vaman et al. |
| 6,081,907 A | 6/2000 | Witty et al. |
| 6,081,909 A | 6/2000 | Luby et al. |
| 6,081,918 A | 6/2000 | Spielman |
| 6,088,330 A | 7/2000 | Bruck et al. |
| 6,097,320 A | 8/2000 | Kuki et al. |
| 6,134,596 A | 10/2000 | Bolosky et al. |
| 6,141,053 A | 10/2000 | Saukkonen |
| 6,141,787 A | 10/2000 | Kunisa et al. |
| 6,141,788 A | 10/2000 | Rosenberg et al. |
| 6,154,452 A | 11/2000 | Marko et al. |
| 6,163,870 A | 12/2000 | Luby et al. |
| 6,166,544 A | 12/2000 | Debbins et al. |
| 6,175,944 B1 | 1/2001 | Urbanke et al. |
| 6,178,536 B1 | 1/2001 | Sorkin |
| 6,185,265 B1 | 2/2001 | Campanella |
| 6,195,777 B1 | 2/2001 | Luby et al. |
| 6,223,324 B1 | 4/2001 | Sinha et al. |
| 6,226,259 B1 | 5/2001 | Piret |
| 6,226,301 B1 | 5/2001 | Cheng et al. |
| 6,229,824 B1 | 5/2001 | Marko |
| 6,243,846 B1 | 6/2001 | Schuster et al. |
| 6,272,658 B1 | 8/2001 | Steele et al. |
| 6,278,716 B1 | 8/2001 | Rubenstein et al. |
| 6,298,462 B1 | 10/2001 | Yi |
| 6,307,487 B1 | 10/2001 | Luby |
| 6,314,289 B1 | 11/2001 | Eberlein et al. |
| 6,320,520 B1 | 11/2001 | Luby |
| 6,332,163 B1 | 12/2001 | Bowman-Amuah |
| 6,333,926 B1 | 12/2001 | Van Heeswyk et al. |
| 6,373,406 B2 | 4/2002 | Luby |
| 6,393,065 B1 | 5/2002 | Piret et al. |
| 6,411,223 B1 * | 6/2002 | Haken .................. H04L 1/0041 341/50 |
| 6,415,326 B1 | 7/2002 | Gupta et al. |
| 6,420,982 B1 | 7/2002 | Brown |
| 6,421,387 B1 | 7/2002 | Rhee |
| 6,430,233 B1 | 8/2002 | Dillon et al. |
| 6,445,717 B1 | 9/2002 | Gibson et al. |
| 6,459,811 B1 | 10/2002 | Hurst, Jr. |
| 6,466,698 B1 | 10/2002 | Creusere |
| 6,473,010 B1 | 10/2002 | Vityaev et al. |
| 6,486,803 B1 | 11/2002 | Luby et al. |
| 6,487,692 B1 | 11/2002 | Morelos-Zaragoza |
| 6,496,980 B1 | 12/2002 | Tillman et al. |
| 6,497,479 B1 | 12/2002 | Stoffel et al. |
| 6,510,177 B1 | 1/2003 | De Bonet et al. |
| 6,523,147 B1 | 2/2003 | Kroeger et al. |
| 6,535,920 B1 | 3/2003 | Parry et al. |
| 6,577,599 B1 | 6/2003 | Gupta et al. |
| 6,584,543 B2 | 6/2003 | Williams et al. |
| 6,609,223 B1 | 8/2003 | Wolfgang |
| 6,614,366 B2 | 9/2003 | Luby |
| 6,618,451 B1 * | 9/2003 | Gonikberg .......... H04L 25/03229 375/229 |
| 6,631,172 B1 | 10/2003 | Shokrollahi et al. |
| 6,633,856 B2 | 10/2003 | Richardson et al. |
| 6,641,366 B2 * | 11/2003 | Nordhoff ............ F03D 11/0041 416/146 R |
| 6,643,332 B1 | 11/2003 | Morelos-Zaragoza et al. |
| 6,677,864 B2 | 1/2004 | Khayrallah |
| 6,678,855 B1 | 1/2004 | Gemmell |
| 6,694,476 B1 | 2/2004 | Sridharan et al. |
| 6,704,370 B1 | 3/2004 | Chheda et al. |
| 6,732,325 B1 | 5/2004 | Tash et al. |
| 6,742,154 B1 | 5/2004 | Barnard |
| 6,748,441 B1 | 6/2004 | Gemmell |
| 6,751,772 B1 | 6/2004 | Kim et al. |
| 6,765,866 B1 | 7/2004 | Wyatt |
| 6,804,202 B1 | 10/2004 | Hwang |
| 6,810,499 B2 | 10/2004 | Sridharan et al. |
| 6,820,221 B2 | 11/2004 | Fleming |
| 6,831,172 B1 | 12/2004 | Barbucci et al. |
| 6,849,803 B1 | 2/2005 | Gretz |
| 6,850,736 B2 | 2/2005 | McCune, Jr. |
| 6,856,263 B2 | 2/2005 | Shokrollahi |
| 6,868,083 B2 | 3/2005 | Apostolopoulos et al. |
| 6,876,623 B1 | 4/2005 | Lou et al. |
| 6,882,618 B1 | 4/2005 | Sakoda et al. |
| 6,895,547 B2 | 5/2005 | Eleftheriou et al. |
| 6,909,383 B2 | 6/2005 | Shokrollahi |
| 6,928,603 B1 | 8/2005 | Castagna et al. |
| 6,937,618 B1 | 8/2005 | Noda et al. |
| 6,956,875 B2 | 10/2005 | Kapadia et al. |
| 6,965,636 B1 | 11/2005 | DesJardins et al. |
| 6,985,459 B2 | 1/2006 | Dickson |
| 6,995,692 B2 | 2/2006 | Yokota et al. |
| 7,010,052 B2 | 3/2006 | Dill et al. |
| 7,030,785 B2 | 4/2006 | Shokrollahi et al. |
| 7,031,257 B1 | 4/2006 | Lu et al. |
| 7,057,534 B2 * | 6/2006 | Luby .................. H03M 13/1191 341/50 |
| 7,068,681 B2 | 6/2006 | Chang et al. |

(56) References Cited

U.S. PATENT DOCUMENTS

| | | | |
|---|---|---|---|
| 7,068,729 B2 * | 6/2006 | Shokrollahi | H04L 1/0041 375/296 |
| 7,072,971 B2 * | 7/2006 | Lassen | H04L 67/32 341/50 |
| 7,073,191 B2 | 7/2006 | Srikantan et al. | |
| 7,100,188 B2 | 8/2006 | Hejna et al. | |
| 7,110,412 B2 | 9/2006 | Costa et al. | |
| 7,139,660 B2 | 11/2006 | Sarkar et al. | |
| 7,139,960 B2 | 11/2006 | Shokrollahi | |
| 7,143,433 B1 | 11/2006 | Duan et al. | |
| 7,151,754 B1 | 12/2006 | Boyce et al. | |
| 7,154,951 B2 | 12/2006 | Wang | |
| 7,164,370 B1 | 1/2007 | Mishra | |
| 7,164,882 B2 | 1/2007 | Poltorak | |
| 7,168,030 B2 | 1/2007 | Ariyoshi | |
| 7,219,289 B2 | 5/2007 | Dickson | |
| 7,231,404 B2 | 6/2007 | Paila et al. | |
| 7,233,264 B2 * | 6/2007 | Luby | H03M 13/1191 341/50 |
| 7,240,236 B2 | 7/2007 | Cutts et al. | |
| 7,240,358 B2 | 7/2007 | Horn et al. | |
| 7,243,285 B2 | 7/2007 | Foisy et al. | |
| 7,249,291 B2 | 7/2007 | Rasmussen et al. | |
| 7,254,754 B2 | 8/2007 | Hetzler et al. | |
| 7,257,764 B2 | 8/2007 | Suzuki et al. | |
| 7,265,688 B2 | 9/2007 | Shokrollahi et al. | |
| 7,293,222 B2 * | 11/2007 | Shokrollahi | H03M 13/6502 714/777 |
| 7,295,573 B2 | 11/2007 | Yi et al. | |
| 7,304,990 B2 | 12/2007 | Rajwan | |
| 7,318,180 B2 | 1/2008 | Starr | |
| 7,320,099 B2 | 1/2008 | Miura et al. | |
| 7,363,048 B2 | 4/2008 | Cheng et al. | |
| 7,391,717 B2 | 6/2008 | Klemets et al. | |
| 7,394,407 B2 | 7/2008 | Shokrollahi et al. | |
| 7,398,454 B2 | 7/2008 | Cai et al. | |
| 7,409,626 B1 | 8/2008 | Schelstraete | |
| 7,412,641 B2 | 8/2008 | Shokrollahi | |
| 7,418,651 B2 | 8/2008 | Luby et al. | |
| 7,451,377 B2 | 11/2008 | Shokrollahi | |
| 7,483,447 B2 | 1/2009 | Chang et al. | |
| 7,483,489 B2 | 1/2009 | Gentric et al. | |
| 7,512,697 B2 * | 3/2009 | Lassen | H04L 67/32 341/50 |
| 7,525,994 B2 | 4/2009 | Scholte | |
| 7,529,806 B1 | 5/2009 | Shteyn | |
| 7,532,132 B2 | 5/2009 | Shokrollahi et al. | |
| 7,555,006 B2 | 6/2009 | Wolfe et al. | |
| 7,559,004 B1 | 7/2009 | Chang et al. | |
| 7,570,665 B2 | 8/2009 | Ertel et al. | |
| 7,574,706 B2 | 8/2009 | Meulemans et al. | |
| 7,590,118 B2 | 9/2009 | Giesberts et al. | |
| 7,597,423 B2 | 10/2009 | Silverbrook | |
| 7,613,183 B1 | 11/2009 | Brewer et al. | |
| 7,633,413 B2 | 12/2009 | Shokrollahi et al. | |
| 7,633,970 B2 | 12/2009 | Van Kampen et al. | |
| 7,650,036 B2 | 1/2010 | Lei et al. | |
| 7,668,198 B2 | 2/2010 | Yi et al. | |
| 7,676,735 B2 | 3/2010 | Luby et al. | |
| 7,711,068 B2 * | 5/2010 | Shokrollahi | H04L 1/0041 375/296 |
| 7,720,096 B2 | 5/2010 | Klemets | |
| 7,720,174 B2 | 5/2010 | Shokrollahi et al. | |
| 7,721,184 B2 | 5/2010 | Luby et al. | |
| 7,812,743 B2 | 10/2010 | Luby | |
| 7,831,896 B2 | 11/2010 | Amram et al. | |
| 7,839,311 B2 | 11/2010 | Bao et al. | |
| 7,924,913 B2 | 4/2011 | Sullivan et al. | |
| 7,956,772 B2 | 6/2011 | Shokrollahi et al. | |
| 7,961,700 B2 | 6/2011 | Malladi et al. | |
| 7,971,129 B2 | 6/2011 | Watson et al. | |
| 7,979,769 B2 | 7/2011 | Lee et al. | |
| 8,027,328 B2 | 9/2011 | Yang et al. | |
| 8,028,322 B2 | 9/2011 | Riedl et al. | |
| 8,081,716 B2 | 12/2011 | Kang et al. | |
| 8,135,073 B2 | 3/2012 | Shen | |
| 8,185,794 B2 | 5/2012 | Lohmar et al. | |
| 8,185,809 B2 | 5/2012 | Luby et al. | |
| RE43,741 E | 10/2012 | Shokrollahi et al. | |
| 8,301,725 B2 | 10/2012 | Biderman et al. | |
| 8,327,403 B1 | 12/2012 | Chilvers et al. | |
| 8,340,133 B2 | 12/2012 | Kim et al. | |
| 8,422,474 B2 | 4/2013 | Park et al. | |
| 8,433,984 B2 | 4/2013 | Khandekar et al. | |
| 8,462,643 B2 | 6/2013 | Walton et al. | |
| 8,544,043 B2 | 9/2013 | Parekh et al. | |
| 8,572,646 B2 | 10/2013 | Haberman et al. | |
| 8,615,023 B2 | 12/2013 | Oh et al. | |
| 8,638,796 B2 | 1/2014 | Dan et al. | |
| 8,713,624 B1 | 4/2014 | Harvey et al. | |
| 8,737,421 B2 | 5/2014 | Zhang et al. | |
| 8,812,735 B2 | 8/2014 | Igarashi | |
| 8,958,375 B2 | 2/2015 | Watson et al. | |
| 2001/0015944 A1 | 8/2001 | Takahashi et al. | |
| 2001/0033586 A1 | 10/2001 | Takashimizu et al. | |
| 2002/0009137 A1 | 1/2002 | Nelson et al. | |
| 2002/0053062 A1 | 5/2002 | Szymanski | |
| 2002/0083345 A1 | 6/2002 | Halliday et al. | |
| 2002/0085013 A1 | 7/2002 | Lippincott | |
| 2002/0133247 A1 | 9/2002 | Smith et al. | |
| 2002/0141433 A1 | 10/2002 | Kwon et al. | |
| 2002/0143953 A1 | 10/2002 | Aiken | |
| 2002/0191116 A1 | 12/2002 | Kessler et al. | |
| 2003/0005386 A1 | 1/2003 | Bhatt et al. | |
| 2003/0037299 A1 | 2/2003 | Smith | |
| 2003/0086515 A1 | 5/2003 | Trans et al. | |
| 2003/0101408 A1 | 5/2003 | Martinian et al. | |
| 2003/0106014 A1 | 6/2003 | Dohmen et al. | |
| 2003/0138043 A1 | 7/2003 | Hannuksela | |
| 2003/0194211 A1 | 10/2003 | Abecassis | |
| 2003/0207696 A1 | 11/2003 | Willenegger et al. | |
| 2003/0224773 A1 | 12/2003 | Deeds | |
| 2004/0015768 A1 | 1/2004 | Bordes et al. | |
| 2004/0031054 A1 | 2/2004 | Dankworth et al. | |
| 2004/0049793 A1 | 3/2004 | Chou | |
| 2004/0081106 A1 | 4/2004 | Bruhn | |
| 2004/0096110 A1 | 5/2004 | Yogeshwar et al. | |
| 2004/0117716 A1 | 6/2004 | Shen | |
| 2004/0151109 A1 | 8/2004 | Batra et al. | |
| 2004/0162071 A1 | 8/2004 | Grilli et al. | |
| 2004/0207548 A1 | 10/2004 | Kilbank | |
| 2004/0240382 A1 | 12/2004 | Ido et al. | |
| 2004/0255328 A1 | 12/2004 | Baldwin et al. | |
| 2005/0018635 A1 | 1/2005 | Proctor, Jr. | |
| 2005/0028067 A1 | 2/2005 | Weirauch | |
| 2005/0041736 A1 | 2/2005 | Butler-Smith et al. | |
| 2005/0071491 A1 | 3/2005 | Seo | |
| 2005/0091697 A1 | 4/2005 | Tanaka et al. | |
| 2005/0097213 A1 | 5/2005 | Barrett et al. | |
| 2005/0105371 A1 | 5/2005 | Johnson et al. | |
| 2005/0123058 A1 | 6/2005 | Greenbaum et al. | |
| 2005/0138286 A1 | 6/2005 | Franklin et al. | |
| 2005/0160272 A1 | 7/2005 | Teppler | |
| 2005/0163468 A1 | 7/2005 | Takahashi et al. | |
| 2005/0180415 A1 | 8/2005 | Cheung et al. | |
| 2005/0193309 A1 | 9/2005 | Grilli et al. | |
| 2005/0195752 A1 | 9/2005 | Amin et al. | |
| 2005/0195899 A1 | 9/2005 | Han | |
| 2005/0195900 A1 | 9/2005 | Han | |
| 2005/0207392 A1 | 9/2005 | Sivalingham et al. | |
| 2005/0216472 A1 | 9/2005 | Leon et al. | |
| 2005/0216951 A1 | 9/2005 | MacInnis | |
| 2005/0254575 A1 | 11/2005 | Hannuksela et al. | |
| 2006/0015568 A1 | 1/2006 | Walsh et al. | |
| 2006/0020796 A1 | 1/2006 | Aura et al. | |
| 2006/0031738 A1 | 2/2006 | Fay et al. | |
| 2006/0037057 A1 | 2/2006 | Xu | |
| 2006/0093634 A1 | 5/2006 | Lutz et al. | |
| 2006/0107174 A1 | 5/2006 | Heise | |
| 2006/0109805 A1 | 5/2006 | Malamal Vadakital et al. | |
| 2006/0120464 A1 | 6/2006 | Hannuksela | |
| 2006/0193524 A1 | 8/2006 | Tarumoto et al. | |
| 2006/0212444 A1 | 9/2006 | Handman et al. | |
| 2006/0212782 A1 | 9/2006 | Li | |

(56) References Cited

U.S. PATENT DOCUMENTS

| | | |
|---|---|---|
| 2006/0229075 A1 | 10/2006 | Kim et al. |
| 2006/0244824 A1 | 11/2006 | Debey |
| 2006/0244865 A1 | 11/2006 | Simon |
| 2006/0248195 A1 | 11/2006 | Toumura et al. |
| 2006/0256851 A1 | 11/2006 | Wang et al. |
| 2006/0279437 A1 | 12/2006 | Luby et al. |
| 2006/0280254 A1 | 12/2006 | Luby |
| 2007/0002953 A1 | 1/2007 | Kusunoki |
| 2007/0006274 A1 | 1/2007 | Paila et al. |
| 2007/0016594 A1 | 1/2007 | Visharam et al. |
| 2007/0022215 A1 | 1/2007 | Singer et al. |
| 2007/0028099 A1 | 2/2007 | Entin et al. |
| 2007/0078876 A1 | 4/2007 | Hayashi et al. |
| 2007/0081562 A1 | 4/2007 | Ma |
| 2007/0110074 A1 | 5/2007 | Bradley et al. |
| 2007/0140369 A1 | 6/2007 | Limberg et al. |
| 2007/0162568 A1 | 7/2007 | Gupta et al. |
| 2007/0162611 A1 | 7/2007 | Yu et al. |
| 2007/0176800 A1* | 8/2007 | Rijavec .......... H03M 7/40 341/50 |
| 2007/0177811 A1 | 8/2007 | Yang et al. |
| 2007/0185973 A1 | 8/2007 | Wayda et al. |
| 2007/0195894 A1 | 8/2007 | Shokrollahi |
| 2007/0200949 A1 | 8/2007 | Walker et al. |
| 2007/0201549 A1 | 8/2007 | Hannuksela et al. |
| 2007/0204196 A1 | 8/2007 | Watson et al. |
| 2007/0230568 A1 | 10/2007 | Eleftheriadis et al. |
| 2007/0233784 A1 | 10/2007 | O'Rourke et al. |
| 2007/0255844 A1 | 11/2007 | Shen et al. |
| 2007/0277209 A1 | 11/2007 | Yousef |
| 2007/0300127 A1 | 12/2007 | Watson et al. |
| 2008/0010153 A1 | 1/2008 | Pugh-O'Connor et al. |
| 2008/0034273 A1 | 2/2008 | Luby |
| 2008/0052753 A1 | 2/2008 | Huang et al. |
| 2008/0058958 A1 | 3/2008 | Cheng |
| 2008/0059532 A1 | 3/2008 | Kazmi et al. |
| 2008/0066136 A1 | 3/2008 | Dorai et al. |
| 2008/0075172 A1 | 3/2008 | Koto |
| 2008/0086751 A1 | 4/2008 | Horn et al. |
| 2008/0101478 A1 | 5/2008 | Kusunoki |
| 2008/0134005 A1 | 6/2008 | Izzat et al. |
| 2008/0152241 A1 | 6/2008 | Itoi et al. |
| 2008/0170564 A1 | 7/2008 | Shi et al. |
| 2008/0170806 A1 | 7/2008 | Kim |
| 2008/0172430 A1 | 7/2008 | Thorstensen |
| 2008/0172712 A1 | 7/2008 | Munetsugu |
| 2008/0181296 A1 | 7/2008 | Tian et al. |
| 2008/0189419 A1 | 8/2008 | Girle et al. |
| 2008/0192818 A1 | 8/2008 | DiPietro et al. |
| 2008/0215317 A1 | 9/2008 | Fejzo |
| 2008/0232357 A1 | 9/2008 | Chen |
| 2008/0243918 A1 | 10/2008 | Holtman |
| 2008/0256418 A1 | 10/2008 | Luby et al. |
| 2008/0281943 A1 | 11/2008 | Shapiro |
| 2008/0285556 A1 | 11/2008 | Park et al. |
| 2008/0303893 A1 | 12/2008 | Kim et al. |
| 2008/0303896 A1 | 12/2008 | Lipton et al. |
| 2008/0313191 A1 | 12/2008 | Bouazizi |
| 2009/0003439 A1 | 1/2009 | Wang et al. |
| 2009/0019229 A1 | 1/2009 | Morrow et al. |
| 2009/0031199 A1 | 1/2009 | Luby et al. |
| 2009/0043906 A1 | 2/2009 | Hurst et al. |
| 2009/0055705 A1 | 2/2009 | Gao |
| 2009/0067551 A1 | 3/2009 | Chen et al. |
| 2009/0083806 A1 | 3/2009 | Barrett et al. |
| 2009/0089445 A1 | 4/2009 | Deshpande |
| 2009/0092138 A1 | 4/2009 | Joo et al. |
| 2009/0100496 A1 | 4/2009 | Bechtolsheim et al. |
| 2009/0103523 A1 | 4/2009 | Katis et al. |
| 2009/0106356 A1 | 4/2009 | Brase et al. |
| 2009/0125636 A1 | 5/2009 | Li et al. |
| 2009/0150557 A1 | 6/2009 | Wormley et al. |
| 2009/0158114 A1 | 6/2009 | Shokrollahi |
| 2009/0164653 A1 | 6/2009 | Mandyam et al. |
| 2009/0189792 A1 | 7/2009 | Shokrollahi et al. |
| 2009/0195640 A1 | 8/2009 | Kim et al. |
| 2009/0201990 A1 | 8/2009 | Leprovost et al. |
| 2009/0204877 A1 | 8/2009 | Betts |
| 2009/0210547 A1 | 8/2009 | Lassen et al. |
| 2009/0222873 A1 | 9/2009 | Einarsson |
| 2009/0248697 A1 | 10/2009 | Richardson et al. |
| 2009/0257508 A1 | 10/2009 | Aggarwal et al. |
| 2009/0287841 A1 | 11/2009 | Chapweske et al. |
| 2009/0297123 A1 | 12/2009 | Virdi et al. |
| 2009/0300203 A1 | 12/2009 | Virdi et al. |
| 2009/0300204 A1 | 12/2009 | Zhang et al. |
| 2009/0307565 A1 | 12/2009 | Luby et al. |
| 2009/0319563 A1 | 12/2009 | Schnell |
| 2009/0328228 A1 | 12/2009 | Schnell |
| 2010/0011061 A1 | 1/2010 | Hudson et al. |
| 2010/0011117 A1 | 1/2010 | Hristodorescu et al. |
| 2010/0011274 A1 | 1/2010 | Stockhammer et al. |
| 2010/0020871 A1 | 1/2010 | Hannuksela et al. |
| 2010/0023525 A1 | 1/2010 | Westerlund et al. |
| 2010/0046906 A1 | 2/2010 | Kanamori et al. |
| 2010/0049865 A1 | 2/2010 | Hannuksela et al. |
| 2010/0061444 A1 | 3/2010 | Wilkins et al. |
| 2010/0067495 A1 | 3/2010 | Lee et al. |
| 2010/0103001 A1* | 4/2010 | Shokrollahi ...... H03M 13/1191 341/94 |
| 2010/0131671 A1 | 5/2010 | Kohli et al. |
| 2010/0153578 A1 | 6/2010 | Van Gassel et al. |
| 2010/0165077 A1 | 7/2010 | Yin et al. |
| 2010/0174823 A1 | 7/2010 | Huang |
| 2010/0189131 A1 | 7/2010 | Branam et al. |
| 2010/0198982 A1 | 8/2010 | Fernandez |
| 2010/0211690 A1 | 8/2010 | Pakzad et al. |
| 2010/0223533 A1 | 9/2010 | Stockhammer et al. |
| 2010/0235472 A1 | 9/2010 | Sood et al. |
| 2010/0235528 A1 | 9/2010 | Bocharov et al. |
| 2010/0257051 A1 | 10/2010 | Fernandez |
| 2010/0318632 A1 | 12/2010 | Yoo et al. |
| 2011/0019769 A1 | 1/2011 | Shokrollahi et al. |
| 2011/0055881 A1 | 3/2011 | Yu et al. |
| 2011/0083144 A1 | 4/2011 | Bocharov et al. |
| 2011/0096828 A1 | 4/2011 | Chen et al. |
| 2011/0103519 A1 | 5/2011 | Shokrollahi et al. |
| 2011/0119394 A1 | 5/2011 | Wang et al. |
| 2011/0119396 A1 | 5/2011 | Kwon et al. |
| 2011/0216541 A1* | 9/2011 | Inoue ............ F21V 7/07 362/296.09 |
| 2011/0231519 A1 | 9/2011 | Luby et al. |
| 2011/0231569 A1 | 9/2011 | Luby et al. |
| 2011/0238789 A1 | 9/2011 | Luby et al. |
| 2011/0239078 A1 | 9/2011 | Luby et al. |
| 2011/0258510 A1 | 10/2011 | Watson et al. |
| 2011/0268178 A1 | 11/2011 | Park et al. |
| 2011/0280311 A1 | 11/2011 | Chen et al. |
| 2011/0280316 A1 | 11/2011 | Chen et al. |
| 2011/0307545 A1 | 12/2011 | Bouazizi |
| 2011/0307581 A1 | 12/2011 | Furbeck et al. |
| 2012/0013746 A1 | 1/2012 | Chen et al. |
| 2012/0016965 A1 | 1/2012 | Chen et al. |
| 2012/0020413 A1 | 1/2012 | Chen et al. |
| 2012/0023249 A1 | 1/2012 | Chen et al. |
| 2012/0023254 A1 | 1/2012 | Park et al. |
| 2012/0033730 A1 | 2/2012 | Lee |
| 2012/0042050 A1 | 2/2012 | Chen et al. |
| 2012/0042089 A1 | 2/2012 | Chen et al. |
| 2012/0042090 A1 | 2/2012 | Chen et al. |
| 2012/0047280 A1 | 2/2012 | Park et al. |
| 2012/0099593 A1 | 4/2012 | Luby |
| 2012/0151302 A1 | 6/2012 | Luby et al. |
| 2012/0185530 A1 | 7/2012 | Reza |
| 2012/0202535 A1 | 8/2012 | Chaddha et al. |
| 2012/0207068 A1 | 8/2012 | Watson et al. |
| 2012/0208580 A1 | 8/2012 | Luby et al. |
| 2012/0210190 A1 | 8/2012 | Luby et al. |
| 2012/0317305 A1 | 12/2012 | Einarsson et al. |
| 2013/0002483 A1 | 1/2013 | Rowitch et al. |
| 2013/0007223 A1 | 1/2013 | Luby et al. |
| 2013/0067295 A1 | 3/2013 | Luby et al. |
| 2013/0091251 A1 | 4/2013 | Walker et al. |
| 2013/0246643 A1 | 9/2013 | Luby et al. |

(56) References Cited

U.S. PATENT DOCUMENTS

| | | | |
|---|---|---|---|
| 2013/0254634 A1 | 9/2013 | Luby et al. | |
| 2013/0287023 A1 | 10/2013 | Bims | |
| 2014/0009578 A1 | 1/2014 | Chen et al. | |
| 2014/0380113 A1 | 12/2014 | Luby et al. | |
| 2016/0087755 A1 | 3/2016 | Luby | |

FOREIGN PATENT DOCUMENTS

| | | | |
|---|---|---|---|
| CN | 1481643 A | 3/2004 | |
| CN | 1708934 A | 12/2005 | |
| CN | 1714577 A | 12/2005 | |
| CN | 1792056 A | 6/2006 | |
| CN | 1806392 A | 7/2006 | |
| CN | 1819661 A | 8/2006 | |
| CN | 1868157 A | 11/2006 | |
| CN | 101390399 A | 3/2009 | |
| CN | 101729857 A | 6/2010 | |
| EP | 0669587 A2 | 8/1995 | |
| EP | 0701371 A1 | 3/1996 | |
| EP | 0784401 A2 | 7/1997 | |
| EP | 0853433 A1 | 7/1998 | |
| EP | 0854650 A2 | 7/1998 | |
| EP | 0903955 A1 | 3/1999 | |
| EP | 0986908 A1 | 3/2000 | |
| EP | 1024672 A1 | 8/2000 | |
| EP | 1051027 A1 | 11/2000 | |
| EP | 1124344 A1 | 8/2001 | |
| EP | 1298931 A2 | 4/2003 | |
| EP | 1406452 A2 | 4/2004 | |
| EP | 1455504 A2 | 9/2004 | |
| EP | 1468497 A1 | 10/2004 | |
| EP | 1501318 A1 | 1/2005 | |
| EP | 1670256 A2 | 6/2006 | |
| EP | 1755248 A1 | 2/2007 | |
| EP | 2071827 A2 | 6/2009 | |
| EP | 1241795 A2 | 8/2009 | |
| EP | 2096870 A2 | 9/2009 | |
| EP | 1700410 B1 | 4/2010 | |
| JP | H07183873 | 7/1995 | |
| JP | 08186570 | 7/1996 | |
| JP | 8289255 A | 11/1996 | |
| JP | 9252253 A | 9/1997 | |
| JP | 11041211 A | 2/1999 | |
| JP | 11112479 | 4/1999 | |
| JP | 11164270 A | 6/1999 | |
| JP | 2000151426 A | 5/2000 | |
| JP | 2000216835 A | 8/2000 | |
| JP | 2000513164 A | 10/2000 | |
| JP | 2000307435 A | 11/2000 | |
| JP | 2000353969 A | 12/2000 | |
| JP | 2001036417 | 2/2001 | |
| JP | 2001094625 | 4/2001 | |
| JP | 2001223655 A | 8/2001 | |
| JP | 2001251287 A | 9/2001 | |
| JP | 2001274776 A | 10/2001 | |
| JP | 2001274855 A | 10/2001 | |
| JP | 2002073625 A | 3/2002 | |
| JP | 2002204219 A | 7/2002 | |
| JP | 2002543705 A | 12/2002 | |
| JP | 2003507985 | 2/2003 | |
| JP | 2003092564 A | 3/2003 | |
| JP | 2003510734 A | 3/2003 | |
| JP | 2003174489 | 6/2003 | |
| JP | 2003256321 A | 9/2003 | |
| JP | 2003318975 A | 11/2003 | |
| JP | 2003319012 | 11/2003 | |
| JP | 2003333577 A | 11/2003 | |
| JP | 2004048704 A | 2/2004 | |
| JP | 2004070712 A | 3/2004 | |
| JP | 2004135013 A | 4/2004 | |
| JP | 2004165922 A | 6/2004 | |
| JP | 2004516717 A | 6/2004 | |
| JP | 2004192140 A | 7/2004 | |
| JP | 2004193992 A | 7/2004 | |
| JP | 2004529533 A | 9/2004 | |
| JP | 2004289621 A | 10/2004 | |
| JP | 2004343701 A | 12/2004 | |
| JP | 2004348824 A | 12/2004 | |
| JP | 2004362099 A | 12/2004 | |
| JP | 2005094140 A | 4/2005 | |
| JP | 2005136546 A | 5/2005 | |
| JP | 2005514828 T | 5/2005 | |
| JP | 2005204170 A | 7/2005 | |
| JP | 2005223433 A | 8/2005 | |
| JP | 2005277950 A | 10/2005 | |
| JP | 2006503463 A | 1/2006 | |
| JP | 2006505177 A | 2/2006 | |
| JP | 2006506926 A | 2/2006 | |
| JP | 2006074335 A | 3/2006 | |
| JP | 2006074421 A | 3/2006 | |
| JP | 2006115104 A | 4/2006 | |
| JP | 3809957 | 6/2006 | |
| JP | 2006174032 A | 6/2006 | |
| JP | 2006174045 A | 6/2006 | |
| JP | 2006186419 A | 7/2006 | |
| JP | 2006519517 A | 8/2006 | |
| JP | 2006287422 A | 10/2006 | |
| JP | 2006319743 A | 11/2006 | |
| JP | 2007013675 A | 1/2007 | |
| JP | 2007089137 A | 4/2007 | |
| JP | 3976163 | 6/2007 | |
| JP | 2007158592 A | 6/2007 | |
| JP | 2007174170 A | 7/2007 | |
| JP | 2007520961 A | 7/2007 | |
| JP | 2007228205 A | 9/2007 | |
| JP | 2008011404 A | 1/2008 | |
| JP | 2008016907 A | 1/2008 | |
| JP | 2008508761 A | 3/2008 | |
| JP | 2008508762 A | 3/2008 | |
| JP | 2008283232 A | 11/2008 | |
| JP | 2008283571 A | 11/2008 | |
| JP | 2008543142 A | 11/2008 | |
| JP | 2008546361 A | 12/2008 | |
| JP | 2009027598 A | 2/2009 | |
| JP | 2009522921 A | 6/2009 | |
| JP | 2009522922 A | 6/2009 | |
| JP | 2009171558 A | 7/2009 | |
| JP | 2009527949 A | 7/2009 | |
| JP | 2009277182 A | 11/2009 | |
| JP | 2009544991 A | 12/2009 | |
| JP | 2010539832 A | 12/2010 | |
| JP | 2008502212 A | 1/2011 | |
| JP | 2001189665 A | 2/2011 | |
| JP | 2011087103 A | 4/2011 | |
| JP | 4971144 B2 | 7/2012 | |
| JP | 5231218 | 3/2013 | |
| KR | 1020030071815 | 9/2003 | |
| KR | 1020030074386 A | 9/2003 | |
| KR | 20040107152 A | 12/2004 | |
| KR | 20040107401 A | 12/2004 | |
| KR | 20050009376 A | 1/2005 | |
| KR | 100809086 B1 | 3/2008 | |
| KR | 20080083299 A | 9/2008 | |
| KR | 20090098919 A | 9/2009 | |
| RU | 99117925 A | 7/2001 | |
| RU | 2189629 C2 | 9/2002 | |
| RU | 2265960 C2 | 12/2005 | |
| RU | 2290768 C1 | 12/2006 | |
| RU | 2297663 C2 | 4/2007 | |
| RU | 2312390 C2 | 12/2007 | |
| RU | 2357279 C2 | 5/2009 | |
| TW | 1246841 B | 1/2006 | |
| TW | 1354908 | 12/2011 | |
| TW | 1355168 | 12/2011 | |
| WO | WO9634463 A1 | 10/1996 | |
| WO | WO-9750183 A1 | 12/1997 | |
| WO | WO9804973 A1 | 2/1998 | |
| WO | WO-9832256 A1 | 7/1998 | |
| WO | WO98032231 | 7/1998 | |
| WO | WO0014921 A1 | 3/2000 | |
| WO | WO0018017 | 3/2000 | |
| WO | WO0052600 A1 | 9/2000 | |
| WO | WO0120786 A1 | 3/2001 | |

(56) References Cited

FOREIGN PATENT DOCUMENTS

| | | |
|---|---|---|
| WO | WO0157667 A1 | 8/2001 |
| WO | WO0158130 A2 | 8/2001 |
| WO | WO0158131 A2 | 8/2001 |
| WO | WO0227988 A2 | 4/2002 |
| WO | WO0247391 | 6/2002 |
| WO | 02063461 A1 | 8/2002 |
| WO | WO-03046742 A1 | 6/2003 |
| WO | WO03056703 | 7/2003 |
| WO | WO03105350 | 12/2003 |
| WO | WO-03105484 A1 | 12/2003 |
| WO | WO2004015948 A1 | 2/2004 |
| WO | WO2004019521 A1 | 3/2004 |
| WO | WO2004030273 A1 | 4/2004 |
| WO | WO2004034589 A2 | 4/2004 |
| WO | WO-2004036824 A1 | 4/2004 |
| WO | WO2004040831 A1 | 5/2004 |
| WO | WO-2004047019 A2 | 6/2004 |
| WO | WO2004047455 A1 | 6/2004 |
| WO | WO-2004088988 A1 | 10/2004 |
| WO | WO-2004109538 A1 | 12/2004 |
| WO | WO2005036753 A2 | 4/2005 |
| WO | WO2005041421 A1 | 5/2005 |
| WO | WO2005078982 A1 | 8/2005 |
| WO | WO-2005107123 | 11/2005 |
| WO | WO2005112250 A2 | 11/2005 |
| WO | WO-2006013459 A1 | 2/2006 |
| WO | WO2006020826 A2 | 2/2006 |
| WO | WO-2006036276 | 4/2006 |
| WO | 2006060036 A1 | 6/2006 |
| WO | WO-2006057938 A2 | 6/2006 |
| WO | WO2006084503 A1 | 8/2006 |
| WO | WO-2006116102 A2 | 11/2006 |
| WO | WO-2006135878 A2 | 12/2006 |
| WO | 2007078253 A2 | 7/2007 |
| WO | WO2007090834 A2 | 8/2007 |
| WO | WO-2007098397 A2 | 8/2007 |
| WO | WO-2007098480 A1 | 8/2007 |
| WO | 2008011549 A2 | 1/2008 |
| WO | WO-2008023328 A3 | 4/2008 |
| WO | WO2008054100 A1 | 5/2008 |
| WO | 2008086313 A1 | 7/2008 |
| WO | WO2008085013 A1 | 7/2008 |
| WO | WO-2008092040 | 7/2008 |
| WO | WO-2008131023 A1 | 10/2008 |
| WO | 2008144004 A1 | 11/2008 |
| WO | WO-2009029797 | 3/2009 |
| WO | WO-2009065526 A1 | 5/2009 |
| WO | WO-2009137705 A2 | 11/2009 |
| WO | 2009143741 A1 | 12/2009 |
| WO | WO2010085361 A2 | 7/2010 |
| WO | WO2010088420 A1 | 8/2010 |
| WO | WO2010120804 A1 | 10/2010 |
| WO | WO-2011038013 | 3/2011 |
| WO | WO-2011038034 A1 | 3/2011 |
| WO | 2011059286 A2 | 5/2011 |
| WO | 2011070552 A1 | 6/2011 |
| WO | 2011102792 A1 | 8/2011 |
| WO | WO-2012021540 | 2/2012 |
| WO | WO-2012109614 A1 | 8/2012 |

OTHER PUBLICATIONS

3GPP TS 26.244 V9.1.0, 3rd Generation Partnership Project; Technical Specification Group Services and System Aspects; Transparent end-to-end packet switched streaming service (PSS); 3GPP file format (3GP), (Release 9), Mar. 2010, 55 pp.

3GPP TS 26.247, v1.5.0, 3rd Generation Partnership Project; Technical Specification Group Services and System Aspects Transparent end-to-end Packet-switched Streaming Service (PSS); Progressive Download and Dynamic Adaptive Streaming over HTTP (3GP-DASH) (Release 10), 2010, 91 pages.

3rd Generation Partnership Project, Technical Specification Group Services and System Aspects Transparent end-to-end packet switched streaming service (PSS); 3GPP file format (3GP) (Release 9), 3GPP Standard, 3GPP TS 26.244, 3rd Generation Partnership Project (3GPP), Mobile Competence Centre, 650, Route Des Lucioles, F-06921 Sophia-Antipolis Cedex, France, No. V8.1.0, Jun. 1, 2009, pp. 1-52, XP050370199.

3rd Generation Partnership Project; Technical Specification Group Services and System Aspects; Transparent end-to-end packet switched streaming service (PSS); 3GPP file format (3GP) (Release 9), 3GPP Standard; 3GPP TS 26.244, 3rd Generation Partnership Project (3GPP), Mobile Competence Centre; 650, Route Des Lucioles; F-06921 Sophia-Antipolis Cedex; France, No. V9.2.0, Jun. 9, 2010, pp. 1-55, XP050441544, [retrieved on Jun. 9, 2010].

Aggarwal, C. et al.: "A Permutation-Based Pyramid Broadcasting Scheme for Video-on-Demand Systems," Proc. IEEE Int'l Conf. on Multimedia Systems, Hiroshima, Japan (Jun. 1996).

Aggarwal, C. et al.: "On Optimal Batching Policies for Video-on-Demand Storage Servers," Multimedia Systems, vol. 4, No. 4, pp. 253-258 (1996).

Albanese, A., et al., "Priority Encoding Transmission", IEEE Transactions on Information Theory, vol. 42, No. 6, pp. 1-22, (Nov. 1996).

Alex Zambelli,"IIS Smooth Streaming Technical Overview", Microsoft 25 Mar. 2009, XP002620446, Retrieved from the Internet: URL:http://www.microsoft.com/downloads/en/ details. aspx"FamilyID=03d22583-3ed6-44da-8464-blb4b5ca7520, [retrieved on Jan. 21, 2011].

Almeroth, et al., "The use of multicast delivery to provide a scalable and interactive video-on-demand service", IEEE Journal on Selected Areas in Communication, 14(6): 1110-1122, (1996).

Alon, et al.: "Linear Time Erasure Codes with Nearly Optimal Recovery," Proceedings of the Annual Symposium on Foundations of Computer Science, US, Los Alamitos, IEEE Comp. Soc. Press, vol. Symp. 36, pp. 512-516 (Oct. 23, 1995) XP000557871.

Amin Shokrollahi: "LDPC Codes: An Introduction" Internet Citation 2 Apr. 1, 2003 (Apr. 2, 2003), XP002360065 Retrieved from the Internet: URL: http://www.ipm.ac.ir/IPM/homepage/Amin2.pdf [retrieved on Dec. 19, 2005].

Amon P et al., "File Format for Scalable Video Coding", IEEE Transactions on Circuits and Systems for Video Technology, IEEE Service Center, Piscataway, NJ, US, vol. 17, No. 9, Sep. 1, 2007, pp. 1174-1185, XP011193013, ISSN: 1051-8215, DOI:10.1109/TCSVT.2007.905521.

Anonymous: [Gruneberg, K., Narasimhan, S. and Chen, Y., editors] "Text of ISO/IEC 13818-1:2007/PDAM 6 MVC operation point descriptor", 90 MPEG Meeting; Oct. 26, 2009-Oct. 30, 2009; Xian; (Motion Picture Expertgroup or ISO/IEC JTC1/SC29/WG111), No. N10942, Nov. 19, 2009, XP030017441.

Anonymous: "Text of ISO/IEC 14496-12 3rd Edition", 83 MPEG Meeting; Jan. 14, 2008-Jan. 18, 2008; Antalya; (Motion PictureExpert Group or ISO/IEC JTC1/SC29/WG11), No. N9678, Apr. 22, 2008, XP030016172.

Anonymous: "Text of ISO/IEC 14496-15 2nd edition", 91 MPEG Meeting; Jan. 18, 2010-Jan. 22, 2010; Kyoto; (Motion Picture Expertgroup or ISO/IEC JTC1/SC29/WG11) No. N11139, Jan. 22, 2010, XP030017636.

Bar-Noy, et al., "Competitive on-line stream merging algorithms for media-on-demand", Draft (Jul. 2000), pp. 1-34.

Bar-Noy et al. "Efficient algorithms for optimal stream merging for media-on-demand," Draft (Aug. 2000), pp. 1-43.

Bigloo, A. et al.: "A Robust Rate-Adaptive Hybrid ARQ Scheme and Frequency Hopping for Multiple-Access Communication Systems," IEEE Journal on Selected Areas in Communications, US, IEEE Inc, New York (Jun. 1, 1994) pp. 889-893, XP000464977.

Bitner, J.R., et al.: "Efficient Generation of the Binary Reflected Gray code and Its Applications," Communications of the ACM, pp. 517-521, vol. 19 (9), 1976.

Blomer, et al., "An XOR-Based Erasure-Resilient Coding Scheme," ICSI Technical Report No. TR-95-048 (1995) [avail. At ftp://ftp.icsi.berkeley.edu/pub/techreports/1995/tr-95-048.pdf].

(56) References Cited

OTHER PUBLICATIONS

Byers, J.W. et al.: "A Digital Fountain Approach to Reliable Distribution of Bulk Data," Computer Communication Review, Association for Computing Machinery. New York, US, vol. 28, No. 4 (Oct. 1998) pp. 56-67 XP000914424 ISSN:0146-4833.

Byers, J.W. et al.: "Accessing multiple mirror sites in parallel: using Tornado codes to speed up downloads," 1999, Eighteenth Annual Joint Conference of the IEEE Comupter and Communications Socities, pp. 275-283, Mar. 21, 1999, XP000868811.

Cataldi et al., " Sliding-Window Raptor Codes for Efficient Scalable Wireless Video Broadcasting With Unequal Loss Protection", IEEE Transactions on Image Processing, Jun. 1, 2010, pp. 1491-1503, vol. 19, No. 6, IEEE Service Center, XP011328559, ISSN: 1057-7149, DOI: 10.1109/TIP.2010.2042985.

Charles Lee L.H, "Error-Control Block Codes for Communications Engineers", 2000, Artech House, XP002642221 pp. 39-45.

Chen, et al., U.S. Appl. No. titled "Frame Packing for Asymmetric Stereo Video", filed Feb. 25, 2011.

Chen, et al., U.S. Patent Application titled "One-Stream Coding for Asymmetric Stereo Video", filed Feb. 25, 2011.

Chen Ying et al., "Coding techniques in Multiview Video Coding and Joint Multiview Video Model", Picture Coding Symposium, 2009, PCS 2009, IEEE, Piscataway, NJ, USA, May 6, 2009, pp. 1-4, XP031491747, ISBN: 978-1-4244-4593-6.

Choi S: "Temporally enhanced erasure codes for reliable communication protocols" Computer Networks, Elsevier Science Publishers B.V., Amsterdam, NL, vol . 38, No. 6, Apr. 22, 2002, pp. 713-730, XP004345778, ISSN: 1389-1286, DOI:10.1016/S1389-1286(01)00280-8.

Clark G.C., et al., "Error Correction Coding for Digital Communications, System Applications," Error Correction Coding for Digital Communications, New York, Plenum Press, US, Jan. 1, 1981, pp. 339-341.

D. Gozalvez et,al. "AL-FEC for Improved Mobile Reception of MPEG-2 DVB-Transport Streams" Hindawi Publishing Corporation, International Journal of Digital Multimedia Broadcasting vol. 2009, Dec. 31, 2009, pp. 1-10, XP002582035 Retrieved from the Internet: URL:http://www.hindawi.com/journals/ijdmb/2009/614178.html> [retrieved on May 12, 2010].

Dan, A. et al.: "Scheduling Policies for an On-Demand Video Server with Batching," Proc. ACM Multimedia, pp. 15-23 (Oct. 1998).

Davey, M.C. et al.: "Low Density Parity Check Codes over GF(q)" IEEE Communications Letters, vol. 2, No. 6 pp. 165-167 (1998).

Digital Fountain: "Specification Text for Raptor Forward Error Correction," TDOC S4-050249 of 3GPP TSG SA WG 4 Meeting #34 [Online] (Feb. 25, 2005) pp. 1-23, XP002425167, Retrieved from the Internet: URL:http://www.3gpp.org/ftp/tsg_sa/WG4_CODEC/TSGS4_34/Docs.

Digital Fountain: "Raptor code specification for MBMS file download," 3GPP SA4 PSM AD-HOC #31 (May 21, 2004) XP002355055 pp. 1-6.

"Digital Video Broadcasting (DVB); Guidelines for the implementation of DVB-IP Phase 1 specifications; ETSI TS 102 542" ETSI Standards, LIS, Sophia Antipoliscedex, France, vol. BC, No. V1.2.1, Apr. 1, 2008, XP014041619 ISSN: 0000-0001 p. 43 p. 66 pp. 70, 71.

DVB-IPI Standard: DVB BlueBook A086r4 (Mar. 2007) Transport of MPEG 2 Transport Streatm (TS) Based DVB Services over IP Based Networks, ETSI Technical Specification 102 034 v1.3.1.

Eager, et al. "Minimizing bandwidth requirements for on-demand data delivery," Proceedings of the International Workshop on Advances in Multimedia Information Systems, pp. 80-87 (Indian Wells, CA Oct. 1999).

Eager, et al., "Optimal and efficient merging schedules for video-on-demand servers", Proc. ACM Multimedia, vol. 7, pp. 199-202 (1999).

Esaki, et al.: "Reliable IP Multicast Communication Over ATM Networks Using Forward Error Correction Policy," IEICE Transactions on Communications, JP, Institute of Electronics Information and Comm. Eng. Tokyo, vol. E78-V, No. 12, (Dec. 1995), pp. 1622-1637, XP000556183.

Feng, G., Error Correcting Codes over Z2m for Algorithm-Based Fault-Tolerance, IEEE Transactions on Computers, vol. 43, No. 3, Mar. 1994, pp. 370-374.

Fernando, et al., "httpstreaming of MPEG Media—Response to CfP", 93 MPEG Meeting; Jul. 26, 2010-Jul. 30, 2010; Geneva; (Motion Picture Expert Group or ISO/IEC JTC1/SCE29/WG11), No. M17756, Jul. 22, 2010, XP030046346.

Fielding et al., "RFC 2616: Hypertext Transfer Protocol HTTP/1.1", Internet Citation, Jun. 1999, pp. 165, XP002196143, Retrieved from the Internet: URL:http://www.rfc-editor-org/ [retrieved on Apr. 15, 2002].

Gao, L. et al.: "Efficient Schemes for Broadcasting Popular Videos," Proc. Inter. Workshop on Network and Operating System Support for Digital Audio and Video, pp. 1-13 (1998).

Gasiba, Tiago et al., "System Design and Advanced Receiver Techniques for Mbms Broadcast Services" Proc. 2006 International Conference on Communications (ICC 2006), Jun. 1, 2006, pp. 5444-5450, XP031025781 ISBN: 978-1-4244-0354-7.

Gemmell, et al., "A Scalable Multicast Architecture for One-To-Many Telepresentations", Multimedia Computing and Systems, 1998/ Proceedings. IEEE International Conference on Austin, TX, USA Jun. 28,-Jul. 1, 1998, Los Alamitos, CA USA, IEEE Comput. Soc, US, Jun. 28, 1998, pp. 128-139, XP010291559.

Goya!: "Multiple Description Coding: Compression Meets the Network," In Signal Processing Magazine, IEEE, vol. 18., Issue 5 (Sep. 2001) pp. 74-93 URL:http://www.rle.mit.edu/stir/documents/Goyal_SigProcMag2001_MD.pdf [Nov. 4, 2007].

Gozalvez D et, al: "Mobile reception of DVB-T services by means of AL-FEC protection" Proc. IEEE Intern. Symposium on Broadband Multimedia Systems and Broadcasting (BMSD '09), IEEE, Piscataway, NJ, USA, May 13, 2009, pp. 1-5, XP031480155 ISBN: 978-1-4244-2590-7.

Gracie et al., " Turbo and Turbo-Like Codes: Principles and Applications in Telecommunications", Proceedings of the IEEE, Jun. 1, 2007, pp. 1228-1254, vol. 95, No. 6, IEEE, XP011189323, ISSN: 0018-9219, DOI: 10.1109/JPROC.2007.895197.

Grineberg, et al., "Deliverable D3.2 MVC/SVC storage format" Jan. 29, 2009, XP002599508 Retrieved from the Internet: URL:http://www.ist-sea.eu/Public/SEA_D3.2_HHI FF_20090129.pdf [retrieved on Sep. 1, 2010] paragraph [02.3].

Hagenauer, J. : "Soft is better than hard" Communications, Coding and Cryptology, Kluwer Publication May 1994, XP002606615 Retrieved from the Internet: URL: http://www.Int . ei .turn. de/veroeffentlic hungen/l994/ccc94h. pdf [retrieved on Oct. 25, 2010].

He Wenge et al., "Asymmetric Stereoscopic Video Encoding Algorithm Based on Joint Compensation Prediction", IEEE International Conference on Communications and Mobile Computing, Jan. 6, 2009, pp. 191-194, XP031434775, ISBN: 978-0-7695-3501-2.

Hershey, et al., "Random Parity Coding (RPC)", 1996 IEEE International Conference on Communications (ICC). Converging Technologies for Tomorrow's Applications. Dallas, Jun. 23-27, 1996, IEEE International Conference on Communications (ICC), New York, IEEE, US, vol. 1, jun. 23, 1996, pp. 122-126, XP000625654.

Hitachi Ltd. et al., "High-Definition Multimedia Interface," Specification Version 1.4, Jun. 5, 2009, 425 pp.

Hua, et al., "Skyscraper broadcasting: A new broadcsting system for metropolitan videoon-demand systems", Proc. ACM SIGCOMM, pp. 89-100 (Cannes, France, 1997).

Huawei et al., "Implict mapping between CCE and PUCCH for ACK/NACK TDD", 3GPP Draft; R1-082359, 3rd Generation Partnership Project (3GPP), Mobile Competence Centre; 650, Route Des Lucioles; F-06921 Sophia-Antipolis Cedex France, vol. RAN WG1, No. Warsaw, Poland, Jun. 24, 2008, XP050110650, [retrieved on Jun. 24, 2008].

Ian Trow, "Is 3D Event Coverage Using Existing Broadcast Infrastructure Technically Possible", International Broadcasting Conference, Sep. 9, 2009-Sep. 13, 2009, XP030081671, pp. 4-5, "3D transmission over broadcast infrastructure" pp. 7-8, "Screen signaling"— Conclusions on 3D systems.

IETF RFC 2733: Rosenberg, J. et al. "An RTP Payload Format for Generic Forward Error Correction," Network Working Group, RFC 2733 (Dec. 1999).

(56) References Cited

OTHER PUBLICATIONS

International Search Report and Written Opinion—PCT/US2010/046027, ISA/EPO—Aug. 17, 2011.
International Standard ISO/IEC 14496-12, Information Technology—Coding of audio-visual objects—Part 12: ISO base media file format, Third Edition, Oct. 15, 2008, 120 pp.
International Telecommunication Union, "ITU-T H.264, Series H: Audiovisual and Multimedia Systems, Infrastructure of audiovisual services—Coding of moving video, Advanced video coding for generic audiovisual services," Mar. 2010, 669 pp.
ISO/IEC JTC 1/SC 29, ISO/IEC FCD 23001-6, Information technology—MPEG systems technologies—Part 6: Dynamic adaptive streaming over HTTP (DASH), Jan. 28, 2011.
Jin Li, "The Efficient Implementation of Reed-Solomon High Rate Erasure Resilient Codes" Proc. 2005 IEEE International Conference on Acoustics, Speech, and Signal Processing, Philadelphia, PA, USA, IEEE, Piscataway, NJ, vol. 3, Mar. 18, 2005, pp. 1097-1100, XP010792442, DOI: 10.1109/ICASSP.2005.1415905 ISBN: 978-0-7803-8874-1.
Juhn, L. et al.: "Adaptive Fast Data Broadcasting Scheme for Video-on-Demand Service," IEEE Transactions on Broadcasting, vol. 44, No. 2, pp. 182-185 (Jun. 1998).
Juhn, L. et al.: "Harmonic Broadcasting for Video-on-Demand Service," IEEE Transactions on Broadcasting, vol. 43, No. 3, pp. 268-271 (Sep. 1997).
Kallel, "Complementary Punctured Convolutional (CPC) Codes and Their Applications", IEEE Transactions on Communications, IEEE Inc., New York, US, Vol. 43, No. 6, Jun. 1, 1995, pp. 2005-2009.
Kimata H et al., "Inter-View Prediction With Downsampled Reference Pictures", ITU Study Group 16—Video Coding Experts Group—ISO/IEC MPEG & ITU-T VCEG(ISO/IEC JTC1/SC29/WG11 and ITU-T SG16 Q6), No. JVT-W079, Apr. 19, 2007, XP030007039.
Kimura et al., "A Highly Mobile SDM-OFDM System Using Reduced-Complexity-and-Latency Processing", IEEE International Symposium on Personal, Indoor and Mobile Radio Communications (PIMRC), Sep. 1, 2007, pp. 1-5, IEEE, XP031168836, ISBN: 978-1-4244-1143-6, DOI: 10.1109/PIMRC.2007.4394758.
Kozamernik F: "Media streaming over the Internet", Internet Citation, Oct. 2002, XP002266291, Retrieved from the Internet: URL: http://www.ebu.ch/trev_292-kozamerni k. pdf [retrieved on Jan. 8, 2004] section "Video codecs for scalable streaming".
Lee L., et al.,"VLSI implementation for low density parity check decoder", Proceedings of the 8th IEEE International Conference on Elecctronics, Circuits and Systems, 2001. ICECS 2001, Sep. 2, 2001, vol. 3, pp. 1223-1226.
Lin, S. et al.: "Error Control Coding-Fundamentals and Applications," 1983, Englewood Cliffs, pp. 288, XP002305226.
Luby Digital Fountain A Shokrollahi Epfl M Watson Digital Fountain T Stockhammer Nomor Research M: "Raptor Forward Error Correction Scheme for Object Delivery; rfc5053.txt", IETF Standard, Internet Engineering Task Force, IETF, Ch, Oct. 1, 2007, XP015055125, ISSN: 0000-0003.
Luby, et al., "Analysis of Low Density Codes and Improved Designs Using Irregular Graphs", 1998, Proceedings of the 30th Annual ACM Symposium on Theory of Computing, May 23, 1998, pp. 249-258, XP000970907.
Luby, et al.: "Analysis of Low Density Codes and Improved Designs Using Irregular Graphs," International Computer Science Institute Technical Report TR-97-045 (Nov. 1997) [available at ftp://ftp.icsi.berkeley.edu/pub/techreports/1997/tr-97-045.pdf].
Luby, et al., "FLUTE—File Delivery over Unidirectional Transport", IETF RFC 3926, pp. 1-35, (Oct. 2004).
Luby et al., "Improved Low-Density Parity-Check Codes Using Irregular Graphs and Belief Propagation", Information Theory, 1998. Proceedings. 1998 IEEE International Symposium on Cambridge, MA, USA Aug. 16-21, 1998, pp. 1-9, New York, NY, USA, IEEE, US Aug. 16, 199.
Luby et, al. "Layered Coding Transport (LCT) Building Block", IETF RFC 5651, pp. 1-42, (Oct. 2009).
Luby, M. et al.: "Efficient Erasure Correction Codes," 2001, IEEE Transactions on Information Theory, vol. 47, No. 2, pp. 569-584, XP002305225.
Luby, M., et, al. "Forward Error Correction (FEC) Building Block", IETF RFC 5052, pp. 1-31, (Aug. 2007).
Luby M et al: "IPTV Systems, Standards and Architectures: Part II—Application Layer FEC in IPTV Services" IEEE Communications Magazine, IEEE Service Center, Piscataway, US LNKDDOI: 10.1109/MCOM.2008.4511656, vol. 46, No. 5, May 1, 2008, pp. 94-101, XP011226858 ISSN: 0163-6804.
Luby, M. et al.: "Pairwise Independence and Derandomization," Foundations and Trends in Theoretical Computer Science, vol. 1, Issue 4, 2005, Print ISSN 1551-305X, Online ISSN 1551-3068.
Luby, M. et al., "Practical Loss-Resilient Codes: Tornado Codes," 29th Annual ACM Symposium on Theory of Computing, vol. Symp. 29, May 4, 1997, pp. 150-159, XP002271229.
Luby, M., et al., "Raptor Forward Error Correction Scheme for Object Delivery", IETF RFC5053, pp. 1-46 (Sep. 2007).
Luby M. et al., "RaptorQ Forward Error Correction Scheme for Object Delivery", IETF draft ietf-rmt-bb-fec-raptorq-04, Reliable Multicast Transport, Internet Engineering Task Force (IETF), Standard Workingdraft, Internet Society (ISOC), Aug. 24, 2010, pp. 168, XP015070705, [retrieved on Aug. 24, 2010].
Luby, M., et al., "Request for Comments: 3453: The Use of Forward Error Correction (FEC) in Reliable Multicast," Internet Article, [Online] Dec. 2002, pp. 1-19.
Luby, Michael G. "Analysis of Random Processes via And-Or Tree Evaluation," Proceedings of the 9th Annual ACM-SIAM Symposium on Discrete Algorithms,TR-97-0, 1998, pp. 364-373, (search date: Jan. 25, 2010) URL: <http://portal.acm.prg.citation.cfm"id=314722>.
Luby Qualcomm Incorporated, "Universal Object Delivery using RaptorQ; draft-luby-uod-raptorq-OO.txt", Internet Engineering Task Force (IETF), Standardworkingdraft, Internet Society (ISOC), Mar. 7, 2011, pp. 1-10, XP015074424, [retrieved on Mar. 7, 2011].
MacKay, "Fountain codes Capacity approaching codes design and implementation", IEE Proceedings: Communications, Dec. 9, 2005, pp. 1062-1068, vol. 152, No. 6, Institution of Electrical Engineers, XP006025749, ISSN: 1350-2425, DOI: 10.1049/IP-COM:20050237.
Mandelbaum D.M., "An Adaptive-Feedback Coding Scheme Using Incremental Redundancy", IEEE Trans on Information Theory, vol. May 1974, May 1974, pp. 388-389, XP002628271, the whole document.
Marpe, et al., "The H.264/MPEG4 Advanced Video Coding Standard and its Applications," Standards Report, IEEE Communications Magazine, Aug. 2006, pp. 134-143.
Matsuoka H., et al., "Low-Density Parity-Check Code Extensions Applied for Broadcast-Communication Integrated Content Delivery", Research Laboratories, NTT DOCOMO, Inc., 3-6, Hikari-No-Oka, Yokosuka, Kanagawa, 239-8536, Japan, ITC-SS21, 2010 IEICE, pp. 59-63.
Mimnaugh, A et, al. "Enabling Mobile Coverage for DVB-T" Digital Fountain Whitepaper Jan. 29, 2008, pp. 1-9, XP002581808 Retrieved from the Internet: URL:http://www.digitalfountain.com/ufiles/library/DVB-T-whitepaper.pdf> [retrieved on May 10, 2010].
Min-Goo Kim: "On systematic punctured convolutional codes", IEEE Trans on Communications, vol. 45, No. 2, Feb. 1997, XP002628272, the whole document, pp. 133-139.
Muller, et al., "A test-bed for the dynamic adaptive streaming over HTTP featuring session mobility" MMSys '11 Proceedings of the second annual ACM conference on Multimedia systems, Feb. 23-25, 2011, San Jose, CA, pp. 271-276.
Naguib, Ayman, et al., "Applications of Space-Time Block Codes and Interference Suppression for High Capacity and High Data Rate Wireless Systems," IEEE, 1998, pp. 1803-1810.
Narayanan, et al., "Physical Layer Design for Packet Data Over Is-136", Vehicular Technology Conference, 1997, IEEE 47TH Phoenix, AZ, USA May 4-7, 1997, New York, NY, USA, IEEE, US May 4, 1997, pp. 1029-1033.

(56) References Cited

OTHER PUBLICATIONS

Nokia: "Reed-Solomon Code Specification for. MBMS Download and Streaming Services", 3GPP Draft; S4-050265_RS_SPEC, 3rd Generation Partnership Project (3GPP), Mobile Competence Centre; 650, Route Des Lucioles; F-06921 Sophia-Antipolis Cedex; France, vol. SA WG4, No. San Diego, USA; Apr. 15, 2005, XP050287675, [retrieved on Apr. 15, 2005].
Nokia Corp., "Usage of 'mfra' box for Random Access and Seeking," S4-AHI127, 3GPP TSG-SA4 Ad-Hoc Meeting, Dec. 14th-16th, 2009, Paris, FR, 2 pp.
Nonnenmacher, et al., "Parity-Based Loss Recovery for Reliable Multicast Transmission", IEEE / ACM Transactions on Networking, IEEE Inc. New York, US, Vol. 6, No. 4, Aug. 1, 1998, pp. 349-361.
Ozden, B. et al.: "A Low-Cost Storage Service for Movie on Demand Databases," Proceedings of the 20th Very Large DataBases (VLDB) Conference, Santiago, Chile (1994).
PA. Chou, A. Mohr, A. Wang, S. Mehrotra, "FEC and Pseudo-ARQ for Receiver-Driven Layered Multicast of Audio and Video," pp. 440-449, IEEE Computer Society, Data Compression Conference (2000).
Pantos R et al., "HTTP Live Streaming; draft-pantos-http-1ive-streaming-OT.txt ", Http Live Streaming; Draft-Pantos-Http-Live-Streaming-01.Txt, Internet Engineering Task Force, IETF; Standardworkingdraft, Internet Society (ISOC) 4, Rue Des Falaises CH- 1205 Geneva, Switzerland, No. 1, Jun. 8, 2009, XP015062692.
Paris, et al., "A low bandwidth broadcasting protocol for video on demand", Proc. International Conference on Computer Communications and Networks, vol. 7, pp. 690-697 (Oct. 1998).
Paris, et al., "Efficient broadcasting protocols for video on demand", International Symposium on Modeling, Analysis and Simulation of Computer and Telecommunication systems (MASCOTS), vol. 6, pp. 127-132 (Jul. 1998).
Perkins, et al.: "Survey of Packet Loss Recovery Techniques for Streaming Audio," IEEE Network; Sep./Oct. 1998, pp. 40-48.
Petition decision for Petition Under 37 C.F.R. § 1.78 to Accept an Unintentionally Delayed Priority Claim under 35 U.S.C. § 120 in U.S. Pat. No. 7,532,132, dated Jul. 21, 2011, 2 pages.
Petition under 37 C.F.R. § 1.78 to Accept an Unintentionally Delayed Priority Claim under 35 U.S.C. § 120 in U.S. Pat. No. 7,532,132, dated May 27, 2011, 2 pages.
Plank J. S., "A Tutorial on Reed-Solomon Coding for Fault-Tolerance In Raid-Like Systems", Software Practice & Experience, Wiley & Sons, Bognor Regis, GB, vol. 27, No. 9, Sep. 1, 1997, pp. 995-1012, XP00069594.
Pless and WC Huffman Eds V S: Algebraic geometry codes, Handbook of Coding Theory, 1998, pp. 871-961, XP002300927.
Pursley, et al.: "Variable-Rate Coding for Meteor-Burst Communications," IEEE Transactions on Communications, US, IEEE Inc. New York (1989) vol. 37, No. 11, pp. 1105-1112 XP000074533.
Pursley, M. et al.: "A Correction and an Addendum for Variable-Rate Coding for Meteor-Burst Communications," IEEE Transactions on Communications, vol. 43, No. 12 pp. 2866-2867 (Dec. 1995).
Pyle, et al., "Microsoft http smooth Streaming: Microsoft response to the Call for Proposal on httpstreaming", 93 MPEG Meeting; Jul. 26, 2010-Jul. 30, 2010; Geneva; (Motion Picture Expert Group or ISO/IEC JTC1/SCE29/WG11), No. M17902, Jul. 22, 2010, XP030046492.
Qualcomm Europe S A R L: "Baseline Architecture and Definitions for HTTP Streaming", 3GPP Draft; 54-090603_HTTP_Streaming_Architecture, 3rd Generation Partnership Project (3GPP), Mobile Competence Centre; 650, Route Des Lucioles; F-06921 Sophia-Antipolis Cedex; France, No. Kista; 20090812, Aug. 12, 2009, XP050356889.
Qualcomm Incorporated: "Use Cases and Examples for Adaptive httpstreaming", 3GPP Draft; 54-100408-Usecases-HSD, 3rd Generation Partnership Project (JGPP), Mobile Competence Centre; 650, Route Des Lucioles; F-06921 Sophia-Antipolis Cedex; France, vol. SA WG4, No. Prague, Czech Republic; 20100621, Jun. 17, 2010, XP050438085, [retrieved on Jun. 17, 2010].
Rangan, et al., "Designing an On-Demand Multimedia Service," IEEE Communication Magazine, vol. 30, pp. 56-64, (Jul. 1992).
RealNetworks Inc, et al., "Format for httpstreaming Media Presentation Description", 3GPP Draft; S4-100020, 3rd Generation Partnership Project (3GPP), Mobile Competence Centre; 650, Route Des Lucioles; F-06921 Sophia-Antipolis Cedex; France, vol. SA WG4, No. St Julians, Malta; 20100125, Jan. 20, 2010, XP050437753, [retrieved on Jan. 20, 2010].
Research in Motion UK Limited: "An MPD delta file for httpstreaming", 3GPP Draft; S4-100453, 3rd Generation Partnership Project (SGPP), Mobile Competence Centre; 650, Route Des Lucioles; F-06921 Sophia-Antipolis Cedex; France, vol. SA WG4, No. Prague, Czech Republic; 20100621, Jun. 16, 2010, XP050438066, [retrieved on Jun. 16, 2010].
Rhyu, et al., "Response to Call for Proposals on httpstreaming of MPEG Media", 93 MPEG Meeting; Jul. 26, 2010-Jul. 30, 2010; Geneva; (Motion Picture Expert Group or ISO/IEC JTC1/SCE29/WG11) No. M17779, Jul. 26, 2010, XP030046369.
Rizzo, L. "Effective Erasure Codes for Reliable Computer Communication Protocols," Computer Communication Review, 27 (2) pp. 24-36 (Apr. 1, 1997), XP000696916.
Roca, V. et al.: "Design, Evaluation and Comparison of Four Large Block FEC Codecs, LDPC, LDGM, LDGM Staircase and LDGM Triangle, plus a Reed-Solomon Small Block FEC Codec," INRIA Research Report RR-5225 (2004).
Roca, V., et, al. "Low Density Parity Check (LDPC) Staircase and Triangle Forward Error Correction (FEC) Schemes", IETF RFC 5170 (Jun. 2008), pp. 1-34.
Rost, S. et al., "The Cyclone Server Architecture: streamlining delivery of popular content," 2002, Computer Communications, vol. 25, No. 4, pp. 1-10.
Roth, R., et al., "A Construction of Non-Reed-Solomon Type MDS Codes", IEEE Transactions of Information Theory, vol. 35, No. 3, May 1989, pp. 655-657.
Roth, R., "On MDS Codes via Cauchy Matrices", IEEE Transactions on Information Theory, vol. 35, No. 6, Nov. 1989, pp. 1314-1319.
Seshan, S. et al., "Handoffs in Cellular Wireless Networks: The Daedalus Implementation and Experience," Wireless Personal Communications, Nl; Kluwer Academic Publishers, vol. 4, No. 2 (Mar. 1, 1997) pp. 141-162, XP000728589.
Shacham: "Packet Recovery and Error Correction in High-Speed Wide-Area Networks," Proceedings of the Military Communications Conference. (Milcom), US, New York, IEEE, vol. 1, pp. 551-557 (1989) XP000131876.
Shierl T; Gruneberg K; Narasimhan S; Vetro A: "ISO/IEC 13818-1:2007/FPDAM 4—Information Technology Generic Coding of Moving Pictures and Audio Systems amendment 4: Transport of Multiview Video over ITU-T Rec H.222.0 ISO/IEC 13818-1" ITU-T Rec. H.222.0(May 2006)FPDAM 4, vol. MPEG2009, No. 10572, May 11, 2009, pp. 1-20, XP002605067 p. 11, last two paragraphs sections 2.6.78 and 2.6.79 table T-1.
Shokrollahi, A.: "Raptor Codes," Internet Citation [Online] (Jan. 13, 2004) XP002367883, Retrieved from the Internet: URL:http://www.cs.huji.ac.il/labs/danss/p2p/resources/raptor.pdf.
Shokrollahi, Amin. "Raptor Codes," IEEE Transactions on Information Theory, Jun. 2006, vol. 52, No. 6, pp. 2551-2567, (search date: Feb. 1, 2010) URL: <http://portal.acm.org/citation.cfm"id=1148681>.
Shokrollahi et al., "Design of Efficient Easure Codes with Differential Evolution", IEEE International Symposium on Information Theory, Jun. 25, 2000, pp. 5-5.
Sincoskie, W. D., "System Architecture for Large Scale Video on Demand Service," Computer Network and ISDN Systems, pp. 155-162, (1991).
Smolic et al., "Development of a new MPEG standard for advanced 3D video applications", Proceedings of 6th International Symposium on Image and Signal Processing and Analysis (ISPA), Sep. 16, 2009, pp. 400-407, IEEE, XP031552049, ISBN: 978-953-184-135-1.
Stockhammer, "WD 0.1 of 23001-6 Dynamic Adaptive Streaming over HTTP (DASH)" MPEG-4 Systems, International Organisation for Standardisation, ISO/IEC JTC1/SC29/WG11, Coding of Moving Pictures and Audio, MPEG 2010 Geneva/m11398, Jan. 6, 2011, 16 pp.

(56) References Cited

OTHER PUBLICATIONS

Sullivan et al., Document: JVT-AA007, "Editors' Draft Revision to ITU-T Rec. H.264|ISO/IEC 14496-10 Advanced Video Coding—In Preparation for ITU-T SG 16 AAP Consent (in integrated form)," Joint Video Team (JVT) of ISO/IEC MPEG & ITU-T VCEG (ISO/IEC JTC1/SC29/WG11 and ITU-T SG16 Q.6), 30th Meeting: Geneva, CH, Jan. 29,-Feb. 3, 2009, pp. 1-683, http://wftp3.itu.int/av-arch/jvt-site/2009_01_Geneva/JVT-AD007.zip.

Sun, et al., "Seamless Switching of Scalable Video Bitstreams for Efficient Streaming," IEEE Transactions on Multimedia, vol. 6, No. 2, Apr. 2004, pp. 291-303.

Telefon AB LM Ericsson, et al., "Media Presentation Description in httpstreaming", 3GPP Draft; S4-100080-MPD, 3rd Generation Partnership Project (3GPP), Mobile Competence Centre; 650, Route Des Lucioles; F-06921 Sophia-Antipolis Cedex; France, vol. SA WG4, No. St Julians, Malta; 20100125, Jan. 20, 2010, XP050437773, [retrieved on Jan. 20, 2010].

Todd, "Error Correction Coding: Mathematical Methods and Algorithms", Mathematical Methods and Algorithms, Jan. 1, 2005, pp. 451-534, Wiley, XP002618913.

Tsunoda T., et al., "Reliable Streaming Contents Delivery by Using Multiple Paths," Technical Report of the Institute of Electronics, Information and Communication Engineers, Japan, Mar. 2004, vol. 103, No. 692, pp. 187-190, NS2003-331, IN2003-286.

U.S. Appl. No. 12/840,146, by Ying Chen et al., filed Jul. 20, 2010.
U.S. Appl. No. 12/908,537, by Ying Chen et al., filed Oct. 20, 2010.
U.S. Appl. No. 12/908,593, by Ying Chen et al., filed Oct. 20, 2010.
U.S. Appl. No. 13/082,051, by Ying Chen et al., filed Apr. 7, 2011.
U.S. Appl. No. 13/205,559, by Ying Chen et al., filed Aug. 8, 2011.
U.S. Appl. No. 13/205,565, by Ying Chen et al., filed Aug. 8, 2011.
U.S. Appl. No. 13/205,574, by Ying Chen et al., filed Aug. 8, 2011.

Universal Mobile Telecommunications System (UMTS); LTE; Transparent end-to-end Packet-switched Streaming Service (PSS); Protocols and codecs (3GPP TS 26.234 version 9.3.0 Release 9), Technical Specification, European Telecommunications Standards Institute (ETSI), 650, Route Des Lucioles; F-06921 Sophia-Antipolis; France, vol. 3GPP SA, No. V9.3.0, Jun. 1, 2010, XP014047290, paragraphs [5.5.4.2], [5.5.4.3], [5.5.4.4], [5.4.5], [5.5.4.6] paragraphs [10.2.3], [11.2.7], [12.2.3], [12.4.2], [12.6.2] paragraphs [12.6.3], [12.6.3.1], [12.6.4], [12.6.6].

Viswanathan, et al., "Metropolitan area video-on-demand services using pyramid broadcasting", Multimedia Systems, 4(4): 197-208 (1996).

Viswanathan, et al., "Pyramid Broadcasting for Video-on-Demand Service", Proceedings of the SPIE Multimedia Computing and Networking Conference, vol. 2417, pp. 66-77 (San Jose, CA, Feb. 1995).

Viswanathan,Subramaniyam R., "Publishing in Wireless and Wireline Environments," Ph. D Thesis, Rutgers, The State University of New Jersey (1994-11), 180pages.

Watson, M., et, al. "Asynchronous Layered Coding (ALC) Protocol Instantiation", IETF RFC 5775, pp. 1-23, (Apr. 2010).

Wong, J.W., "Broadcast delivery", Proceedings of the IEEE, 76(12): 1566-1577, (1988).

Yamauchi, Nagamasa. "Application of Lost Packet Recovery by Front Error Correction to Internet Multimedia Transfer" Proceedings of Workshop for Multimedia Communication and Distributed Processing, Japan, Information Processing Society of Japan (IPS), Dec. 6, 2000, vol. 2000, No. 15, pp. 145-150.

Yin et al., "Modified Belief-Propogation algorithm for Decoding of Irregular Low-Density Parity-Check Codes", Electronics Letters, IEE Stevenage, GB, vol. 38, No. 24, Nov. 21, 2002, pp. 1551-1553.

Ying Chen et al: "Response to the CfP on HTTP Streaming: Adaptive Video Streaming based on AVC", 93 MPEG Meeting; Jul. 26, 2010-Jul. 30, 2010; Geneva; (Motion Picture Expert Group or ISO/IEC JTC1/SC29/WG11), No. M17909, Jul. 26, 2010, XP030046499.

Zorzi, et al.: "On the Statistics of Block Errors in Bursty Channels," IEEE Transactions on Communications, vol. 45, No. 6, Jun. 1997, pp. 660-667.

Bross, et al., "High efficiency video coding (HEVC) text specification draft 6," Joint Collaborative Team on Video Coding (JCT-VC) of ITU-T SG16 WP3 and ISO/IEC JTC1/SC29/WG11 JCTVC-H1003, 7th Meeting: Geneva, Ch, 21-30 Nov. 2011, pp. 259.

Bross, et al., "High efficiency video coding (HEVC) text specification draft 7," Joint Collaborative Team on Video Coding (JCT-VC) of ITU-T SG16 WP3 and ISO/IEC JTC1/SC29/WG11 9th Meeting: Geneva, Ch, Apr. 27-May 7, 2012, JCTVC-I1003_d21, pp. 290.

Bross, et al., "High efficiency video coding (HEVC) text specification draft 8," Joint Collaborative Team on Video Coding (JCT-VC) of ITU-T SG16 WP3 and ISO/IEC JTC1/SC29/WG11 10th Meeting: Stockholm, SE, Jul. 11-20, 2012, JCTVC-J1003_d7, pp. 261.

Bross et al., "WD4: Working Draft 4 of High-Efficiency Video Coding," JCTVC-F803_d2, (JCT-VC) of ITU-T SG16 WP3 and ISO/IEC JTC1/SC29/WG11 Joint Collaborative Team on Video Coding, 6th Meeting, Torino, IT, Jul. 14-22, 2011, 226 pages.

Bross et al., "WD5: Working Draft 5 of High-Efficiency Video Coding," JCTVC-G1103_d2, (JCT-VC) of ITU-T SG16 WP3 and ISO/IEC JTC1/SC29/WG11 Joint Collaborative Team on Video Coding, 7th Meeting, Geneva, Switzerland (Nov. 2011), 214 pages.

ITU-T H.264, Series H: Audiovisual and Multimedia Systems, Infrastructure of audiovisual services—Coding of moving video, Advanced video coding for generic audiovisual services, The International Telecommunication Union. Jun. 2011, 674 pp.

Jiang., File Format for Scalable Video Coding, PowerPoint Presentation for CMPT 820, Summer 2008.

Pantos, "HTTP Live Streaming draft-pantos-http-live-streaming-02", Informational, Internet-Draft, Intended status: Informational, Expires: Apr. 8, 2010, http://tools.ietf.org/html/draft-pantos-http-live-streaming-02, pp. 1-20, Oct. 5, 2009.

Thomas Wiegand et al.," WD1: Working Draft 1 of High-Efficiency Video Coding", JCTVC-C403, Joint Collaborative Team on Video Coding (JCT-VC), of ITU-T SG16 WP3 and ISO/IEC JTC1/SC29/WG11, 3rd Meeting: Guangzhou, CN, Oct. 7-15 , 2010.

Wiegand et al., "WD3: Working Draft 3 of High-Efficiency Video Coding," Document JCTVC-E603, 5th Meeting: Geneva, CH, Mar. 16-23, 2011, 193 pp.

Wiegand T. et al., "WD2: Working Draft 2 of High-Efficiency Video Coding", 20110128, No. JCTVC-D503, 28 Jan. 28, 2011, XP002679642, Retrieved from the Internet: URL: http://wftp3.itu.int/av-arch/jctvc-site/2011_01_D_Daegu/ [retrieved on Jul. 11, 2012].

Yamanouchi N., et al., "Internet Multimedia Transmission with Packet by Using Forward Error Correction," Proceedings of DPS Workshop, The Information Processing Society of Japan, Dec. 6, 2000, vol. 2000, No. 15, pp. 145-150.

Anonymous: "Technologies under Consideration", 100. MPEG Meeting; Apr. 30, 2012-Apr. 5, 2012; Geneva; (Motion Picture Expert Group or ISO/IEC JTC1 /SC29/WG11) No. N12682, Jun. 7, 2012, XP030019156.

Hannuksela M.M., et al., "DASH: Indication of Subsegments Starting with SAP, 97. MPEG Meeting; Jul. 18, 2011-Jul. 22, 2011; Torino; (Motion Picture Expert Group or ISO/IEC JTC1/SC29/WG11)" No. m21096, Jul. 21, 2011, XP030049659.

Hannuksela M.M., et al., "Isobmff: Sap definitions and 'sidx' box", 97. Mpeg Meeting; 18/7/2011 - 22/7/2011; Torino; (Motion Picture Expert Group or Iso/Iec JTC1/SC29NVG11) no. m21435, 22 Jul. 2011 (2011-07-22), XP030049998.

Stockhammer T., et al., "DASH: Improvements on Representation Access Points and related flags", 97. MPEG Meeting; Jul. 18, 2011-Jul. 22,2011; Torino; (Motion Picture Expert Group or ISO/IEC JTC1/SC29/WG11) No. m20339, Jul. 24, 2011, XP030048903.

Gil A., et al., "Personalized Multimedia Touristic Services for Hybrid Broadcast/Broadband Mobile Receivers," IEEE Transactions on Consumer Electronics, 2010, vol. 56 (1), pp. 211-219.

Li, M., et al., "Playout Buffer and Rate Optimization for Streaming over IEEE 802.11 Wireless Networks", Aug. 2009, Worcester Polytechnic Institute, USA.

(56) References Cited

OTHER PUBLICATIONS

Luby et al., RaptorQ Forward Error Correction Scheme for Object Delivery draft-ietf-rmt-bb-fec-raptorq-00, Qualcomm, Inc. Jan. 28, 2010.

Michael G et al., "Improved low-density parity-check codes using irregular graphs", Information Theory, IEEE Transactions on, Feb. 2001, vol. 47, No. 2, pp. 585-598.

Ohashi A et al., "Low-Density Parity-Check (LDPC) Decoding of Quantized Data," Technical Report of the Institute of Electronics, Information and Communication Engineers, Aug. 23, 2002, vol. 102, No. 282, pp. 47-52, RCS2002-154.

Roumy A., et al., "Unequal Erasure Protection and Object Bundle Protection with the Generalized Object Encoding Approach", Inria-00612583, Version 1, Jul. 29, 2011, 25 pages.

Schulzrinne, et al., "Real Time Streaming Protocol (RTSP)" Network Working Group, Request for Comments: 2326, Apr. 1998, pp. 1-92.

Wadayama T, "Introduction to Low Density Parity Check Codes and Sum-Product Algorithm," Technical Report of the Institute of Electronics, Information and Communication Engineers, Dec. 6, 2001, vol. 101, No. 498, pp. 39-46, MR2001-83.

Yamazaki M., et al., "Multilevel Block Modulation Codes Construction of Generalized DFT," Technical Report of the Institute of Electronics, Information and Communication Engineers, Jan. 24, 1997, vol. 96, No. 494, pp. 19-24, IT96-50.

3GPP: "3rd Generation Partnership Project; Technical Specification Group Services and system Aspects; Multimedia Broadcast/Multicast Service (MBMS); Protocols and codecs (Release 6)", Sophia Antipolis, France, Jun. 1, 2005, XP002695256, Retrieved from the Internet: URL:http://www.etsi.org/deliver/etsi_ts/126300_126399/126346/06.01.00_60/ts_126346v060100p.pdf.

3rd Generation Partnership Project; Technical Specification Group Services and System Aspects; Transparent end-to-end Packet-switched Streaming Service (PSS); Progressive Download and Dynamic Adaptive Streaming over HTTP (3GP-DASH) (Release 10), 3GPP Standard; 3GPP TS 26.247, 3rd Generation Partnership Project (3GPP), Mobile Competence Centre; 650, Route Des Lucioles; F-06921 Sophia-Antipolis Cedex; France, vol. SA WG4, No. V10.0.0, Jun. 17, 2011, pp. 1-94, XP050553206, [retrieved on Jun. 17, 2011].

Anonymous: "Technologies under Consideration", 98. MPEG Meeting; Nov. 28, 2011-Feb. 12, 2011; Geneva; (Motion Picture Expert Group or ISO/IEC JTC1/SC29/WG11) No. N12330, Dec. 3, 2011, XP030018825.

Anonymous: "Text of ISO/IEC IS 23009-1 Media Presentation Description and Segment Formats", 98. MPEG Meeting; Nov. 28, 2011-Feb. 12, 2012; Geneva; (Motion Picture Expert Group or ISO/IEC JTC1/SC29/WG11) No. N12329, Jan. 6, 2012, XP030018824.

Atis: "PTV Content on Demand Service", IIF-WT-063R44, Nov. 11, 2010, pp. 1-124, XP055045168, Retrieved from the Internet: URL:ftp://vqeg.its.bldrdoc.gov/Documents/VQEG_Atlanta_Nov10/MeetingFiles/Liaison/IIF-WT-063R44_Content_on_Demand.pdf [retrieved on Nov. 22, 2012].

Bouazizi I., et al., "Proposals for ALC/FLUTE server file format (14496-12Amd.2)", 77. MPEG Meeting; Jul. 17, 2006-Jul. 21, 2006; Klagenfurt; (Motion Pictureexpert Group or ISO/IEC JTC1/WG11), No. M13675, Jul. 12, 2006, XP030042344, ISSN: 0000-0236.

"Digital Video Broadcasting (DVB); Framing structure, channel coding and modulation for digital terrestrial television; ETSI EN 300 744" ETSI Standards, LIS, Sophia Antipolis Cedex, France, V1.6.1, pp. 9, Jan. 10, 2009.

Frojdh P., et al., "Study on 14496-12:2005/PDAM2 ALU/ FLUTE Server File Format", 78.MPEG Meeting; Oct. 23, 2006-Oct. 27, 2006; Hangzhou: (Motion Pictureexpert Group or ISO/IEC JTC1/SC29/WG11) No. M13855, Oct. 13, 2006, XP030042523, ISSN: 0000-0233.

Kim J., et al., "Enhanced Adaptive Modulation and Coding Schemes Based on Multiple Channel Reportings for Wireless Multicast Systems", 62nd IEEE Vehicular Technology Conference, VTC-2005-Fall, Sep. 25-28, 2005, vol. 2, pp. 725-729, XP010878578, DOI: 10.11 09/VETECF.2005.1558019, ISBN: 978-0-7803-9152-9.

Moriyama, S., "5. Present Situation of Terrestrial Digital Broadcasting in Europe and USA", Journal of the Institute of Image Information and Television Engineers, Nov. 20, 1999, vol. 53, No. 11, pp. 1476-1478.

Motorola et al: "An Analysis of DCD Channel Mapping to BCAST File Delivery Sessions; OMA-CD-DCD-2007-0112-INP_DCD_Channel_Mapping_to_BCAST_File_Delivery", OMA-CD-DCD-2007-0112-INP_DCD_Channel_Mapping_to_BCAST_File_Delivery, Open Mobile Alliance (OMA), 4330 La Jolla Village Dr., Suite 110 San Diego, CA 92122; USA Oct. 2, 2007, pp. 1-13, XP064036903.

Bross, et al., "High efficiency video coding (HEVC) text specification draft 6," JCTVC-H1003, Joint Collaborative Team on Video Coding (JCT-VC) of ITU-T SG16 WP3 and ISO/IEC JTC1/SC29/WG11, 8th Meeting: San José, CA, USA, Feb. 1-10, 2012, 259 pp.

Makoto N., et al., "On Tuning of Blocking LU decomposition for VP2000 series" The 42th Information Processing Society of Japan Conference (1st term in 1991), Feb. 25, 1991, pp. 71-72, 4B-8.

Miller G., et al., "Bounds on the maximum likelihood decoding error probability of low density parity check codes", Information Theory, 2000. Proceedings. IEEE International Symposium on, 2000, p. 290.

Muramatsu J., et al., "Low density parity check matrices for coding of multiple access networks", Information Theory Workshop, 2003. Proceedings. 2003 IEEE, Apr. 4, 2003, pp. 304-307.

Qualcomm Incorporated: "RaptorQ Technical Overview", pp. 1-12, Oct. 1, 2010.

Samukawa, H. "Blocked Algorithm for LU Decomposition" Journal of the Information Processing Society of Japan, Mar. 15, 1993, vol. 34, No. 3, pp. 398-408.

3GPP TSG-SA4 #57 S4-100015, IMS based PSS and MBMS User Service extensions, Jan. 19, 2010, URL: http://www.3gpp.org/ftp/tsg_sa/WG4_CODEC/TSGS4_57/docs/S4-100015.zip.

3rd Generation Partnership Project; Technical Specification Group Services and System Aspects; Transparent end-to-end Packet-switched Streaming Service (PSS);Protocols and codecs(Release 9) 3GPP TS 26.234 V9.3.0, Jun. 23, 2010 pp. 85-102, URL,http://www.3gpp.org/ftp/TSG_SA/WG4_CODEC/TSGS4_59/Docs/S4-100511.zip, 26234-930.zip.

Lee, J.Y., "Description of Evaluation Experiments on ISO/IEC 23001-6, Dynamic Adaptive Streaming over HTTP", ISO/IEC JTC1/SC29/VVG11MPEG2010/N11450, Jul. 31, 2010, 16 pp.

Luby M., "Simple Forward Error Correction (FEC) Schemes," draft-luby-rmt-bb-fec-supp-simple-00.txt, pp. 1-14, Jun., 2004.

Luby M., "LT Codes", Foundations of Computer Science, 2002, Proceedings, The 43rd Annual IEEE Symposium on, 2002.

Morioka S., "A Verification Methodology for Error Correction Circuits over Galois Fields", Tokyo Research Laboratory, IBM Japan Ltd, pp. 275- 280, Apr. 22-23, 2002.

Qualcomm Incorporated: "Adaptive HTTP Streaming: Complete Proposal", 3GPP TSG-SA4 AHI Meeting S4-AHI170, Mar. 2, 2010, URL, http://www.3gpp.org/FTP/tsg_sa/WG4_CODEC/Ad-hoc_MBS/Docs_AHI/S4-AHI170.zip, S4-AH170_CR_AdaptiveHTTPStreaming-Full.doc.

Qualcomm Incorporated: "Corrections to 3GPP Adaptive HTTP Streaming", 3GPP TSG-SA4 #59 Change Request 26.234 CR0172 S4-100403, Jun. 16, 2010, URL, http://www.3gpp.org/FTP/TSG_SA/WG4_CODEC/TSGS4_59/Docs/S4-100403.zip, S4-100403_CR_26234-0172-AdaptiveHTTPStreaming-Rel-9.doc.

Taiwan Search Report—TW099127778—TIPO—Mar. 5, 2014.

Gerard F., et al., "HTTP Streaming MPEG media—Response to CFP", 93. MPEG Meeting, Geneva Jul. 26, 2010 to Jul. 30, 2010.

Chikara S., et al., " Add-on Download Scheme for Multicast Content Distribution Using LT Codes", IEICE. B, Communications, Aug. 1, 2006, J89-B (8), pp. 1379-1389.

(56) References Cited

OTHER PUBLICATIONS

Hasan M A., et al., "Architecture for a Low Complexity Rate-Adaptive Reed-Solomon Encoder", IEEE Transactions on Computers, IEEE Service Center, Los Alamitos, CA, US, vol. 44, No. 7, Jul. 1, 1995, pp. 938-942, XP000525729, ISSN: 0018-9340, DOI: 10.1109/12.392853.

Tetsuo M., et al., "Comparison of Loss Resilient Ability between Multi-Stage and Reed Solomon Coding", Technical report of IEICE. CQ, Communication Quality, vol. 103 (178), Jul. 4, 2003, pp. 19-24.

Watson M., et al., "Forward Error Correction (FEC) Framework draft-ietf-fecframe-framework-11," 2011, pp. 1-38, URL, http://tools.ietf.org/pdf/draft-ietf-fecframe-framework-11.pdf.

Watson M., et al., "Raptor FEC Schemes for FECFRAME draft-ietf-fecframe-raptor-04," 2010, pp. 1-21, URL, http://tools.ietf.org/pdf/draft-ietf-fecframe-raptor-04.pdf.

Qualcomm Incorporated: "RatorQ Forward Error Correction Scheme for Object Delivery draft-ietf-rmt-bb-fec-raptorq-04", Internet Engineering Task Force, IETF, pp. 1-68, Aug. 24, 2010.

Ramsey B, "HTTP Status: 206 Partial Content and Range Requests," May 5, 2008 obtained at http://benramsey.com/blog/2008/05/206-partial-content-and-rand-requests/.

Taiwan Search Report—TW103113056—TIPO—Dec. 16, 2015.

Luby, et al.: "Efficient Erasure Correcting Codes," IEEE Transactions on Information Theory, vol. 47, No. 2, 2001, pp. 569-584.

\* cited by examiner

DATA VALUES USED

| | |
|---|---|
| K | Number of source symbols |
| R | Number of redundant symbols |
| L | Number of intermediate symbols (L = K+R) |
| S | Number of LDPC symbols |
| H | Number of HDPC symbols |
| P | Number of permanently inactive (PI) symbols |
| N | Number of received encoded symbols |
| A | Number of overhead symbols (A = N-K) |

SYMBOL ARRAYS

| | |
|---|---|
| (C(0), ..., C(K-1)) | Source Symbols |
| (C(K), ..., C(L-1)) | Redundant Symbols |
| (C(0), ..., C(L-1)) | Intermediate Symbols |
| (C(0), ..., C(L-P-1)) | LT Intermediate Symbols |
| (C(L-P), ..., C(L-1)) | Permanently Inactive (PI) Symbols (i.e., "PI List") |
| (D(0), ..., D(N-1)) | Encoded Symbols Received by Decoder 155 |

Fig. 2

| d | m[d] |
|---|---|
| 30 | 1048576 |
| 29 | 1017662 |
| 28 | 1016370 |
| 27 | 1014983 |
| 26 | 1013490 |
| 25 | 1011876 |
| 24 | 1010129 |
| 23 | 1008229 |
| 22 | 1006157 |
| 21 | 1003887 |
| 20 | 1001391 |
| 19 | 998631 |
| 18 | 995565 |
| 17 | 992138 |
| 16 | 988283 |
| 15 | 983914 |
| 14 | 978921 |
| 13 | 973160 |
| 12 | 966438 |
| 11 | 958494 |
| 10 | 948962 |
| 9 | 937311 |
| 8 | 922747 |
| 7 | 904023 |
| 6 | 879057 |
| 5 | 844104 |
| 4 | 791675 |
| 3 | 704294 |
| 2 | 529531 |
| 1 | 5243 |
| 0 | 0 |

Fig. 8

$$Q = (\Delta_1 | \Delta_2 | \cdots | \Delta_{k+S-1} | Y) \cdot \Gamma, \Gamma = \begin{pmatrix} 1 & 0 & 0 & \cdots & 0 & 0 \\ \alpha & 1 & 0 & \cdots & 0 & 0 \\ 0 & \alpha & 1 & \cdots & 0 & 0 \\ \vdots & \vdots & \vdots & \ddots & \vdots & \vdots \\ 0 & 0 & 0 & \cdots & 1 & 0 \\ 0 & 0 & 0 & \cdots & \alpha & 1 \end{pmatrix}^{-1}, Y = \begin{pmatrix} a^0 \\ a^1 \\ \vdots \\ a^{H-2} \\ a^{H-1} \end{pmatrix}$$

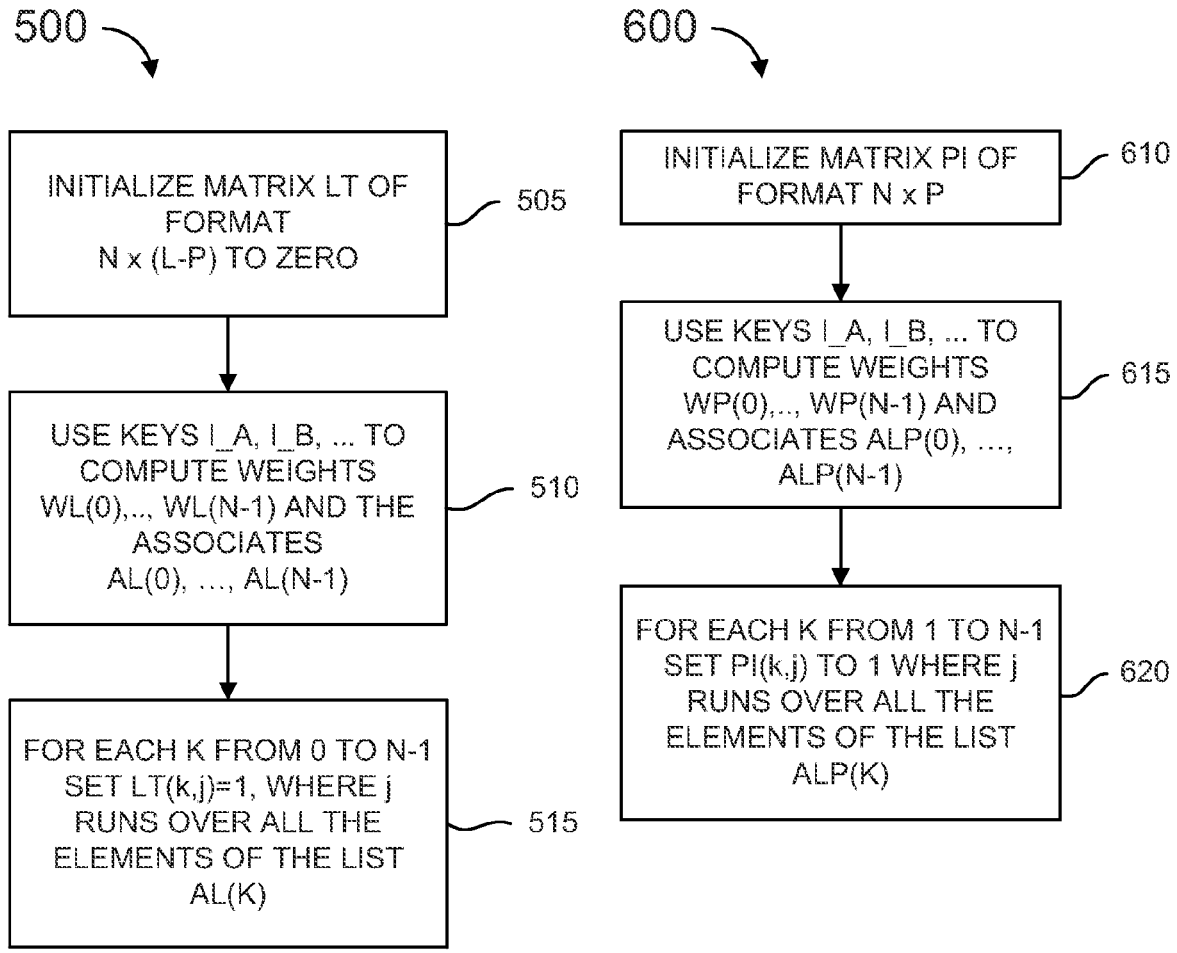

METHODS AND APPARATUS EMPLOYING FEC CODES WITH PERMANENT INACTIVATION OF SYMBOLS FOR ENCODING AND DECODING PROCESSES

CROSS REFERENCES

This application is a continuation-in-part of U.S. patent application Ser. No. 12/604,773, filed Oct. 23, 2009, naming M. Amin Shokrollahi, et al. and entitled "Method and Apparatus Employing FEC Codes with Permanent Inactivation of Symbols for Encoding and Decoding Processes" and further claims priority from the following provisional applications, each naming M. Amin Shokrollahi, et al. and each entitled "Method and Apparatus Employing FEC Codes with Permanent Inactivation of Symbols for Encoding and Decoding Processes": U.S. Provisional Patent Application No. 61/353,910, filed Jun. 11, 2010, U.S. Provisional Patent Application No. 61/257,146, filed Nov. 2, 2009, and U.S. Provisional Patent Application No. 61/235,285, filed Aug. 19, 2009. Each provisional and nonprovisional application cited above is hereby incorporated by reference for all purposes.

The following references are herein incorporated by reference in their entirety for all purposes:

1) U.S. Pat. No. 6,307,487 issued to Michael G. Luby entitled "Information Additive Code Generator and Decoder for Communication Systems" (hereinafter "Luby I");

2) U.S. Pat. No. 6,320,520 issued to Michael G. Luby entitled "Information Additive Group Code Generator and Decoder for Communication Systems" (hereinafter "Luby II");

3) U.S. Pat. No. 7,068,729 issued to M. Amin Shokrollahi entitled "Multi-Stage Code Generator and Decoder for Communication Systems" (hereinafter "Shokrollahi I");

4) U.S. Pat. No. 6,856,263 issued to M. Amin Shokrollahi entitled "Systems and Processes for Decoding a Chain Reaction Code Through Inactivation" (hereinafter "Shokrollahi II");

5) U.S. Pat. No. 6,909,383, issued to M. Amin Shokrollahi entitled "Systematic Encoding and Decoding of Chain Reaction Codes" (hereafter "Shokrollahi III");

6) U. S. Patent Publication No. 2006/0280254 naming Michael G. Luby and M. Amin Shokrollahi and entitled "In-Place Transformations with Applications to Encoding and Decoding Various Classes of Codes" (hereafter "Luby III");

7) U.S. Patent Publication No. 2007/0195894 naming M. Amin Shokrollahi and entitled "Multiple-Field Based Code Generator and Decoder for Communications Systems" (hereafter "Shokrollahi IV").

FIELD OF THE INVENTION

The present invention relates to encoding and decoding data in communications systems and more specifically to communication systems that encode and decode data to account for errors and gaps in communicated data in an efficient manner.

BACKGROUND OF THE INVENTION

Techniques for transmission of files between a sender and a recipient over a communications channel are the subject of much literature. Preferably, a recipient desires to receive an exact copy of data transmitted over a channel by a sender with some level of certainty. Where the channel does not have perfect fidelity (which covers most all physically realizable systems), one concern is how to deal with data lost or garbled in transmission. Lost data (erasures) are often easier to deal with than corrupted data (errors) because the recipient cannot always tell when corrupted data is data received in error. Many error-correcting codes have been developed to correct for erasures and/or for errors. Typically, the particular code used is chosen based on some information about the infidelities of the channel through which the data is being transmitted and the nature of the data being transmitted. For example, where the channel is known to have long periods of infidelity, a burst error code might be best suited for that application. Where only short, infrequent errors are expected a simple parity code might be best.

As used herein, "source data" refers to data that is available at one or more senders and that a receiver is used to obtain, by recovery from a transmitted sequence with or without errors and/or erasures, etc. As used herein, "encoded data" refers to data that is conveyed and can be used to recover or obtain the source data. In a simple case, the encoded data is a copy of the source data, but if the received encoded data differs (due to errors and/or erasures) from the transmitted encoded data, in this simple case the source data might not be entirely recoverable absent additional data about the source data. Transmission can be through space or time. In a more complex case, the encoded data is generated based on source data in a transformation and is transmitted from one or more senders to receivers. The encoding is said to be "systematic" if the source data is found to be part of the encoded data. In a simple example of systematic encoding, redundant information about the source data is appended to the end of the source data to form the encoded data.

Also as used herein, "input data" refers to data that is present at an input of an FEC (forward-error correcting) encoder apparatus or an FEC encoder module, component, step, etc., ("FEC encoder") and "output data" refers to data that is present at an output of an FEC encoder. Correspondingly, output data would be expected to be present at an input of an FEC decoder and the FEC decoder would be expected to output the input data, or a correspondence thereof, based on the output data it processed. In some cases, the input data is, or includes, the source data, and in some cases, the output data is, or includes, the encoded data. In other cases, a sender device or sender program code may comprise more than one FEC encoder, i.e., source data is transformed into encoded data in a series of a plurality of FEC encoders. Similarly at the receiver, there may be more than one FEC decoder applied to generate source data from received encoded data.

Data can be thought of as partitioned into symbols. An encoder is a computer system, device, electronic circuit, or the like, that generates encoded symbols or output symbols from a sequence of source symbols or input symbols and a decoder is the counterpart that recovers a sequence of source symbols or input symbols from received or recovered encoded symbols or output symbols. The encoder and decoder are separated in time and/or space by the channel and any received encoded symbols might not be exactly the same as corresponding transmitted encoded symbols and they might not be received in exactly the same sequence as they were transmitted. The "size" of a symbol can be measured in bits, whether or not the symbol is actually broken into a bit stream, where a symbol has a size of M bits when the symbol is selected from an alphabet of $2^M$ symbols. In many of the examples herein, symbols are measured in bytes and codes might be over a field of 256 possibilities (there are 256 possible 8-bit patterns), but it should be understood that different units of data measurement can be used and it is well-known to measure data in various ways.

Luby I describes the use of codes, such as chain reaction codes, to address error correction in a compute-efficient, memory-efficient and bandwidth-efficient manner. One property of the encoded symbols produced by a chain reaction encoder is that a receiver is able to recover the original file as soon as enough encoded symbols have been received. Specifically, to recover the original K source symbols with a high probability, the receiver needs approximately K+A encoded symbols.

The "absolute reception overhead" for a given situation is represented by the value A, while a "relative reception overhead" can be calculated as the ratio A/K. The absolute reception overhead is a measure of how much extra data needs to be received beyond the information theoretic minimal amount of data, and it may depend on the reliability of the decoder and may vary as a function of the number, K, of source symbols. Similarly, the relative reception overhead, A/K, is a measure of how much extra data needs to be received beyond the information theoretic minimal amount of data relative to the size of the source data being recovered, and also may depend on the reliability of the decoder and may vary as a function of the number K of source symbols.

Chain reaction codes are extremely useful for communication over a packet based network. However, they can be fairly computationally intensive at times. A decoder might be able to decode more often, or more easily, if the source symbols are encoded using a static encoder prior to a dynamic encoder that encodes using a chain reaction or another rateless code. Such decoders are shown in Shokrollahi I, for example. In examples shown there, source symbols are input symbols to a static encoder that produces output symbols that are input symbols to a dynamic encoder that produces output symbols that are the encoded symbols, wherein the dynamic encoder is a rateless encoder that that can generate a number of output symbols in a quantity that is not a fixed rate relative to the number of input symbols. The static encoder might include more than one fixed rate encoder. For example a static encoder might include a Hamming encoder, a low-density parity-check ("LDPC") encoder, a high-density parity-check ("HDPC") encoder, and/or the like.

Chain reaction codes have a property that as some symbols are recovered at the decoder from the received symbols, those symbols might be able to be used to recover additional symbols, which in turn might be used to recover yet more symbols. Preferably, the chain reaction of symbol solving at the decoder can continue such that all of the desired symbols are recovered before the pool of received symbols is used up. Preferably, the computational complexity of performing chain reaction encoding and decoding processes is low.

A recovery process at the decoder might involve determining which symbols were received, creating a matrix that would map the original input symbols to those encoded symbols that were received, then inverting the matrix and performing a matrix multiplication of the inverted matrix and a vector of the received encoded symbols. In a typical system, a brute force implementation of this can consume excessive computing effort and memory requirements. Of course, for a particular set of received encoded symbols, it might be impossible to recover all of the original input symbols, but even where it is possible, it might be very computationally expensive to compute the result.

Shokrollahi II describes an approach called "inactivation", wherein decoding occurs in two steps. In the first step, the decoder takes stock of what received encoded symbols it has available, what the matrix might look like and determines, at least approximately, a sequence of decoding steps that would allow for the chain reaction process to complete given the received encoded symbols. In the second step, the decoder runs the chain reaction decoding according to the determined sequence of decoding steps. This can be done in a memory-efficient manner (i.e., a manner that requires less memory storage for the operation than a more memory-inefficient process).

In an inactivation approach, the first decoding step involves manipulating the matrix, or its equivalent, to determine some number of input symbols that can be solved for and when the determination stalls, designating one of the input symbols as an "inactivated symbol" and continue the determination process assuming that the inactivated symbol is indeed solved, then at the end, solving for the inactivated symbols using Gaussian elimination or some other method to invert a matrix that is much smaller than the original decoding matrix. Using that determination, the chain reaction sequence can be performed on the received encoded symbols to arrive at the recovered input symbols, which can either be all of the original input symbols or a suitable set of the original input symbols.

For some applications that impose tight constraints on the decoder, such as where the decoder is in a low-power device with limited memory and computing power, or such as when there are tight constraints on the allowable absolute or relative reception overhead, improved methods might be indicated relative to the inactivation approach described above.

Also, methods for partitioning a file or large block of data into as few source blocks as possible subject to a constraint on the smallest sub-symbol size, and then subject to this split into as few sub-blocks as possible subject to a constraint on the maximum sub-block size, might be useful.

BRIEF SUMMARY OF THE INVENTION

According to one embodiment of an encoder according to aspects of the present invention, an encoder, at, in or for a sender that transmits an ordered set of source symbols from one or more senders to one or more receivers over a communications channel, wherein the encoder generates data to be sent that includes a plurality of encoded symbols generated from the source symbols. In a first step, intermediate symbols are generated from the source symbols using a method that is invertible, i.e., there is also an inverse method for generating the source symbols from the intermediate symbols. In another step, the intermediate symbols are partitioned into a first set of intermediate symbols and a second set of intermediate symbols, wherein there is at least one intermediate symbol in the first set of intermediate symbols and there is at least one intermediate symbol in the second set of intermediate symbols and at least one encoded symbol is generated from at least one intermediate symbol from each of the two sets. In some variations, there are more than two sets.

In some embodiments, values for a first set and a second set of temporary symbols are generated, wherein the values of the first set of temporary symbols depend on the values of the first set of intermediate symbols and the values for the second set of temporary symbols depend on the values of the second set of intermediate symbols. The values for encoded symbols are generated from the first set and the second set of temporary symbols.

In some variations, the number of encoded symbols that can be generated is independent of the number of source symbols.

Decoder embodiments are also provided. According to one embodiment of a decoder according to aspects of the present invention, a decoder, at, in or for a receiver, receives encoded symbols generated from intermediate symbols, wherein the intermediate symbols are generated from source symbols using a method that is invertible, i.e., there is also an inverse method for generating the source symbols from the intermediate symbols, and wherein at least one of the intermediate symbols is designated a permanently inactivated symbol and wherein there is at least another one of the intermediate symbols that is not among the permanently inactivated symbols. The decoder decodes, from the received encoded symbols, a set of intermediate symbols and the decoder takes into account at least one permanently inactivated symbol, and generates source symbols from the decoded set of intermediate symbols using the inverse method.

In decoding, decoding steps are scheduled, setting aside the scheduling of permanently inactivated symbols. The permanently inactivated symbols can be solved using novel or conventional methods and then used in solving for the other intermediate symbols. One approach to solving for the permanent inactivated symbols (and other on-the-fly inactivations, if used) might be by applying Gaussian elimination to solve for the inactivated symbols. Some of the remaining intermediate symbols are recovered based on the values of the recovered permanently inactivated symbols and received encoded symbols.

In some variations of the decoding method, the permanently inactivated symbols comprise the second set of intermediate symbols from the encoding embodiments. In some variations of the decoding method, the permanently inactivated symbols comprise a subset of the intermediate symbols wherein the corresponding encoding method is not a multi-stage chain reaction code. Such encoding methods might include one or more of a Tornado code, a Reed-Solomon code, a chain reaction code (examples described in Luby I), or the like for the subset of the intermediate symbols.

Intermediate symbols are used for encoding and decoding, wherein the method for generating intermediate symbols from source symbols and the corresponding inverse method, are indicated for a desired set of performance characteristics, such as decodability. In some embodiments, the intermediate symbols comprise the source symbols. In some embodiments, the intermediate symbols comprise the source symbols, along with redundant symbols that are generated from the source symbols, where the redundant symbols might be chain reaction symbols, LDPC symbols, HDPC symbols or other types of redundant symbols. Alternatively, intermediate symbols could be based on prescribed relationships between symbols, for example relationships between the intermediate symbols and the source symbols, and additional LDPC and HDPC relationships among the intermediate symbols, wherein a decoding method is used to generate the intermediate symbols from the source symbols based on the prescribed relationships.

The methods and systems can be implemented by electronic circuits or by a processing device that executes programming instructions and has the appropriate instruction program code to implement encoding and/or decoding.

Numerous benefits are achieved by way of the present invention. For example, in a specific embodiment, the computational expense of encoding data for transmission over a channel is reduced. In another specific embodiment, the computational expense of decoding such data is reduced. In another specific embodiment, the absolute and relative reception overhead is substantially reduced. Depending upon the embodiment, one or more of these benefits may be achieved. These and other benefits are provided in more detail throughout the present specification and more particularly below.

A further understanding of the nature and the advantages of the inventions disclosed herein may be realized by reference to the remaining portions of the specification and the attached drawings.

BRIEF DESCRIPTION OF THE DRAWINGS

FIG. 2 is a table of variables, arrays and the like, that are used in various other figures herein.

FIG. 8 illustrates a table that might be stored in memory, usable to determine a degree of a symbol based on a lookup value.

FIG. 16 is a flowchart illustrating a process for generating an LT submatrix as might be used in the matrix of FIG. 12 or the matrix of FIG. 15.

FIG. 17 is a flowchart illustrating a process for generating a PI submatrix as might be used in the matrix of FIG. 15.

Figure 1:
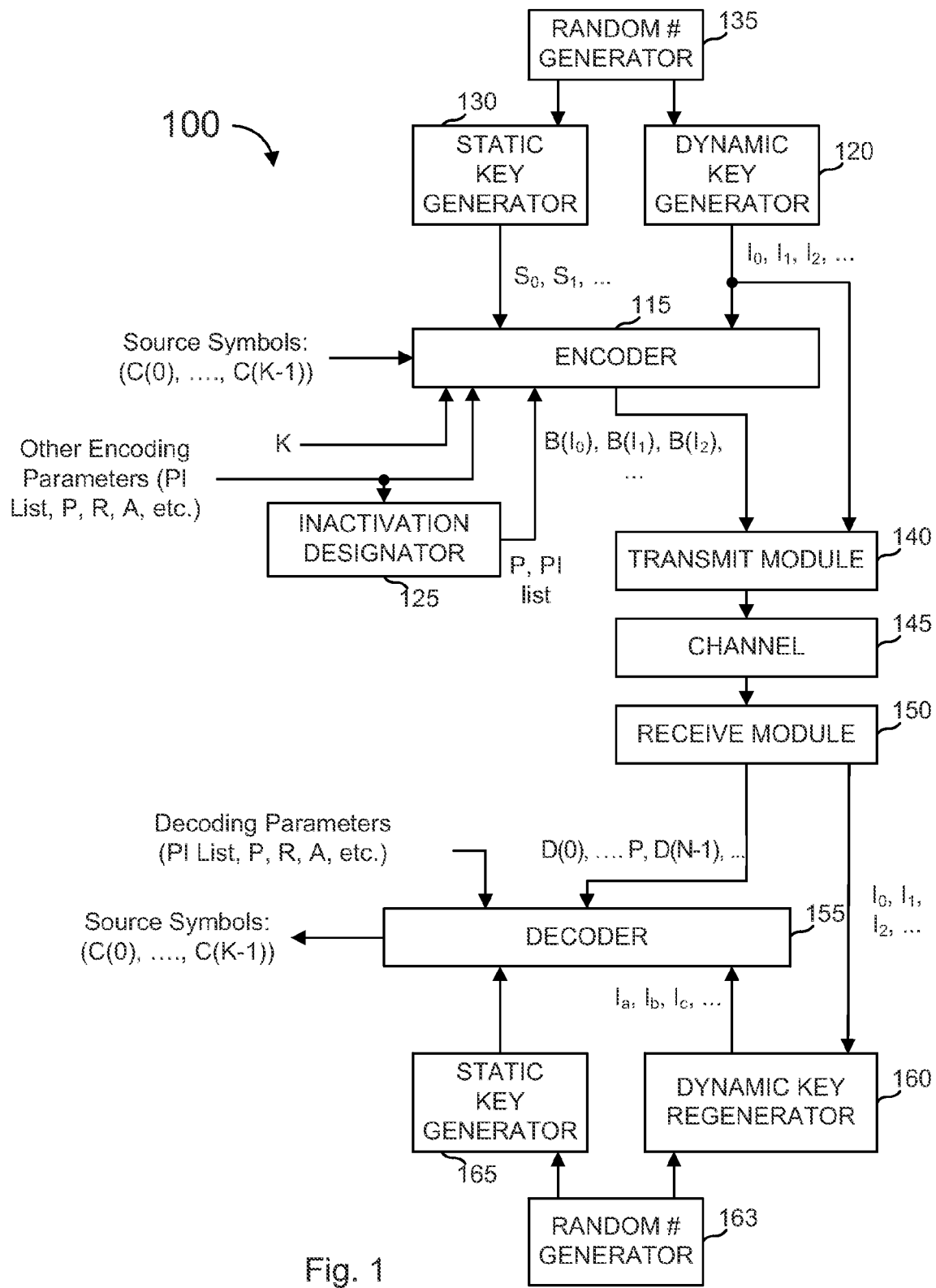
FIG. 1 is a block diagram of a communications system that uses multi-stage coding that includes permanent inactivation, along with other features and elements.

Attached as Appendix A is a code specification for a specific embodiment of an encoder/decoder system, an error correction scheme, and applications to reliable delivery of data objects, sometimes with details of the present invention used, which also includes a specification of how a systematic encoder/decoder might be used in object delivery transport. It should be understood that the specific embodiments described in Appendix A are not limiting examples of the invention and that some aspects of the invention might use the teachings of Appendix A while others might not. It should also be understood that limiting statements in Appendix A may be limiting as to requirements of specific embodiments and such limiting statements might or might not pertain the claimed inventions and, therefore, the claim language need not be limited by such limiting statements.

DETAILED DESCRIPTION OF SPECIFIC EMBODIMENTS

Details for implementing portions of encoders and decoders that are referenced herein are provided by Luby I, Luby II, Shokrollahi I, Shokrollahi II, Shokrollahi III, Luby III, and Shokrollahi IV and are not entirely repeated here for the sake of brevity. The entire disclosures of those are herein incorporated by reference for all purposes and it is to be understood that the implementations therein are not required of the present invention, and many other variations, modifications, or alternatives can also be used, unless otherwise indicated.

Multi-stage encoding, as described herein, encodes the source data in a plurality of stages. Typically, but not always, a first stage adds a predetermined amount of redundancy to the source data. A second stage then uses a chain reaction code, or the like, to produce encoded symbols from the original source data and the redundant symbols computed by the first stage of the encoding. In one specific embodiment, the received data is first decoded using a chain reaction decoding process. If that process is not successful in recovering the original data completely, a second decoding step can be applied.

Some of the embodiments taught herein can be applied to many other types of codes, for example to the codes as described in the Internet Engineering Task Force (IETF) Request for Comments (RFC) 5170 (hereinafter "IETF LDPC codes"), and to the codes described in U.S. Pat. Nos. 6,073,250, 6,081,909 and 6,163,870 (hereinafter "Tornado codes"), resulting in improvements in reliability and/or CPU and/or memory performance for those types of codes.

One advantage of some embodiments taught herein, is that fewer arithmetic operations are necessary to produce encoded symbols, as compared to chain reaction coding alone. Another advantage of some specific embodiments that include a first stage of encoding and a second stage of encoding is that the first stage of encoding and the second stage of encoding can be done at separate times and/or by separate devices, thus partitioning the computational load and minimizing the overall computational load and also the memory size and access pattern requirements. In embodiments of multi-stage encoding, redundant symbols are generated from the input file during the first stage of encoding. In these embodiments, in the second stage of encoding, encoded symbols are generated from the combination of the input file and the redundant symbols. In some of these embodiments, the encoded symbols can be generated as needed. In embodiments in which the second stage comprises chain reaction encoding, each encoded symbol can be generated without regard to how other encoded symbols are generated. Once generated, these encoded symbols can then be placed into packets and transmitted to their destination, with each packet containing one or more encoded symbols. Non-packetized transmission techniques can be used instead or as well.

As used herein, the term "file" refers to any data that is stored at one or more sources and is to be delivered as a unit to one or more destinations. Thus, a document, an image, and a file from a file server or computer storage device, are all examples of "files" that can be delivered. Files can be of known size (such as a one megabyte image stored on a hard disk) or can be of unknown size (such as a file taken from the output of a streaming source). Either way, the file is a sequence of source symbols, where each source symbol has a position in the file and a value. A "file" may also be used to refer to a short portion of a streaming source, i.e., the stream of data may be partitioned into one second intervals, and the block of source data within each such one second interval may be considered to be a "file". As another example, the blocks of data from a video streaming source may be further partitioned into multiple parts based on priorities of that data defined for example by a video system that can playout the video stream, and each part of each block may be considered to be a "file". Thus, the term "file" is used generally and is not intended to be extensively limiting.

As used herein, source symbols represent the data that is to be transmitted or conveyed, and encoded symbols represent the data generated based on source symbols that is conveyed over a communications network, or stored, to enable the reliable reception and/or regeneration of the source symbols. Intermediate symbols represent symbols that are used or generated during an intermediate step of the encoding or decoding processes, wherein typically there is a method for generating intermediate symbols from source symbols and a corresponding inverse method for generating the source symbols from the intermediate symbols. Input symbols represent data that is input to one or more steps during the process of encoding or decoding, and output symbols represent data that is output from one or more steps during the process of encoding or decoding.

In many embodiments, these different types or labels of symbols can be the same or comprised at least partially of other types of symbols, and in some examples the terms are used interchangeably. In an example, suppose that a file to be transmitted is a text file of 1,000 characters, each of which is deemed a source symbol. If those 1,000 source symbols are provided as is to an encoder, that in turn outputs encoded symbols that are transmitted, the source symbols are also input symbols. However, in embodiments where the 1,000 source symbols are in a first step converted to 1,000 (or more or fewer) intermediate symbols and the intermediate symbols are provided to the encoder to generate encoded symbols in a second step, the source symbols are the input symbols and the intermediate symbols are the output symbols in the first step, and the intermediate symbols are the input symbols and the encoded symbols are the output symbols in the second step, whereas the source symbols are the overall input symbols to this two-step encoder and the encoded symbols are the overall output symbols of this two-step encoder. If, in this example, the encoder is a systematic encoder, then the encoded symbols may comprise the source symbols together with repair symbols generated from the intermediate symbols, whereas the intermediate symbols are distinct from both the source symbols and the encoded symbols. If instead, in this example, the encoder is a non-systematic encoder, then the intermediate symbols may comprise the source symbols together with redundant symbols generated from the source symbols, using for example an LDPC and/or HDPC encoder in the first step, whereas the encoded symbols are distinct from both the source symbols and the intermediate symbols.

In other examples, there are more symbols and each symbol represents more than one character. In either case, where there is a source-to-intermediate symbol conversion in a transmitter, the receiver might have a corresponding intermediate-to-source symbol conversion as the inverse.

Transmission is the process of transmitting data from one or more senders to one or more recipients through a channel in order to deliver a file. A sender is also sometimes referred to as the encoder. If one sender is connected to any number of recipients by a perfect channel, the received data can be an exact copy of the source file, as all the data will be received correctly. Here, we assume that the channel is not perfect, which is the case for most real-world channels. Of the many channel imperfections, two imperfections of interest are data erasure and data incompleteness (which can be treated as a special case of data erasure). Data erasure occurs when the channel loses or drops data. Data incompleteness occurs when a recipient does not start receiving data until some of the data has already passed it by, the recipient stops receiving data before transmission ends, the recipient chooses to only receive a portion of the transmitted data, and/or the recipient intermittently stops and starts again receiving data. As an example of data incompleteness, a moving satellite sender might be transmitting data representing a source file and start the transmission before a recipient is in range. Once the recipient is in range, data can be received until the satellite moves out of range, at which point the recipient can redirect its satellite dish (during which time it is not receiving data) to start receiving the data about the same input file being transmitted by another satellite that has moved into range. As should be apparent from reading this description, data incompleteness is a special case of data erasure, since the recipient can treat the data incompleteness (and the recipient has the same problems) as if the recipient was in range the entire time, but the channel lost all the data up to the point where the recipient started receiving data. Also, as is well known in communication systems design, detectable errors can be considered equivalent to erasures by simply dropping all data blocks or symbols that have detectable errors.

In some communication systems, a recipient receives data generated by multiple senders, or by one sender using multiple connections. For example, to speed up a download, a recipient might simultaneously connect to more than one sender to transmit data concerning the same file. As another example, in a multicast transmission, multiple multicast data streams might be transmitted to allow recipients to connect to one or more of these streams to match the aggregate transmission rate with the bandwidth of the channel connecting them to the sender. In all such cases, a concern is to ensure that all transmitted data is of independent use to a recipient, i.e., that the multiple source data is not redundant among the streams, even when the transmission rates are vastly different for the different streams, and when there are arbitrary patterns of loss.

In general, a communication channel is that which connects the sender and the recipient for data transmission. The communication channel could be a real-time channel, where the channel moves data from the sender to the recipient as the channel gets the data, or the communication channel might be a storage channel that stores some or all of the data in its transit from the sender to the recipient. An example of the latter is disk storage or other storage device. In that example, a program or device that generates data can be thought of as the sender, transmitting the data to a storage device. The recipient is the program or device that reads the data from the storage device. The mechanisms that the sender uses to get the data onto the storage device, the storage device itself and the mechanisms that the recipient uses to get the data from the storage device collectively form the channel. If there is a chance that those mechanisms or the storage device can lose data, then that would be treated as data erasure in the communication channel.

When the sender and recipient are separated by a communication channel in which symbols can be erased, it is preferable not to transmit an exact copy of an input file, but instead to transmit data generated from the input file that assists with recovery of erasures. An encoder is a circuit, device, module or code segment that handles that task. One way of viewing the operation of the encoder is that the encoder generates encoded symbols from source symbols, where a sequence of source symbol values represent the input file. Each source symbol would thus have a position, in the input file, and a value. A decoder is a circuit, device, module or code segment that reconstructs the source symbols from the encoded symbols received by the recipient. In multi-stage coding, the encoder and the decoder are sometimes further divided into sub-modules each performing a different task.

In embodiments of multi-stage coding systems, the encoder and the decoder can be further divided into sub-modules, each performing a different task. For instance, in some embodiments, the encoder comprises what is referred to herein as a static encoder and a dynamic encoder. As used herein, a "static encoder" is an encoder that generates a number of redundant symbols from a set of source symbols, wherein the number of redundant symbols is determined prior to encoding. When static encoding is used in a multi-stage coding system, the combination of the source symbols and the redundant symbols generated from the source symbols using a static encoder are often referred to as the intermediate symbols. Examples of potential static encoding codes include Reed-Solomon codes, Tornado codes, Hamming codes, LDPC codes such as the IETF LDPC codes, etc. The term "static decoder" is used herein to refer to a decoder that can decode data that was encoded by a static encoder.

As used herein, a "dynamic encoder" is an encoder that generates encoded symbols from a set of input symbols, where the number of possible encoded symbols is independent of the number of input symbols, and where the number of encoded symbols to be generated need not be fixed. Often in a multi-stage code, the input symbols are the intermediate symbols generated using a static code and the encoded symbols are generated from intermediate symbols using a dynamic encoder. One example of a dynamic encoder is a chain reaction encoder, such as the encoders taught in Luby I and Luby II. The term "dynamic decoder" is used herein to refer to a decoder that can decode data that was encoded by a dynamic encoder.

In some embodiments, encoding that is multi-stage code and systematic uses a decoding process applied to the source symbols to obtain the intermediate symbol values based on the relationships defined by the static encoder among the intermediate symbols and defined by the dynamic encoder between the intermediate symbols and the source symbols, and then a dynamic encoder is used to generate additional encoded symbols, or repair symbols, from the intermediate symbols. Similarly, a corresponding decoder has a decoding process to receive encoded symbols and decode from them the intermediate symbol values based on the relations defined by the static encoder among the intermediate symbols and defined by the dynamic encoder between the intermediate symbols and the received encoded symbols, and then a dynamic encoder is used to generate any missing source symbols from the intermediate symbols.

Embodiments of multi-stage coding need not be limited to any particular type of symbol. Typically, the values for the symbols are selected from an alphabet of $2^M$ symbols for some positive integer M. In such cases, a source symbol can be represented by a sequence of M bits of data from the input file. The value of M is often determined based on, for example, the uses of the application, the communication channel, and/or the size of the encoded symbols. Additionally, the size of an encoded symbol is often determined based on the application, the channel, and/or the size of the source symbols. In some cases, the coding process might be simplified if the encoded symbol values and the source symbol values were the same size (i.e., representable by the same number of bits or selected from the same alphabet). If that is the case, then the source symbol value size is limited when the encoded symbol value size is limited. For example, it may be desired to put encoded symbols in packets of limited size. If some data about a key associated with the encoded symbols were to be transmitted in order to recover the key at the receiver, the encoded symbol would preferably be small enough to accommodate, in one packet, the encoded symbol value and the data about the key.

As an example, if an input file is a multiple megabyte file, the input file might be broken into thousands, tens of thousands, or hundreds of thousands of source symbols with each source symbol encoding thousands, hundreds, or only few bytes. As another example, for a packet-based Internet channel, a packet with a payload of size of 1024 bytes might be appropriate (a byte is 8 bits). In this example, assuming each packet contains one encoded symbol and 8 bytes of auxiliary information, an encoded symbol size of 8128 bits ((1024−8)*8) would be appropriate. Thus, the source symbol size could be chosen as M=(1024−8)*8, or 8128 bits. As another example, some satellite systems use the MPEG packet standard, where the payload of each packet comprises 188 bytes. In that example, assuming each packet contains one encoded symbol and 4 bytes of auxiliary information, an encoded symbol size of 1472 bits ((188−4)*8), would be appropriate. Thus, the source symbol size could be chosen as M=(188−4)*8, or 1472 bits. In a general-purpose communication system using multi-stage coding, the application-specific parameters, such as the source symbol size (i.e., M, the number of bits encoded by a source symbol), might be variables set by the application.

Each encoded symbol has a value. In one preferred embodiment, which we consider below, each encoded symbol also has associated therewith an identifier called its "key." Preferably, the key of each encoded symbol can be easily determined by the recipient to allow the recipient to distinguish one encoded symbol from other encoded symbols. Preferably, the key of an encoded symbol is distinct from the keys of all other encoded symbols. There are various forms of keying discussed in previous art. For example, Luby I describes various forms of keying that can be employed in embodiments of the present invention. In other preferred embodiments, such as the one described in Appendix A, the key for an encoded symbol is referred to as an "Encoded Symbol Identifier", or "Encoding Symbol Identifier", or more simply the "ESI".

Multi-stage coding is particularly useful where there is an expectation of data erasure or where the recipient does not begin and end reception exactly when a transmission begins and ends. The latter condition is referred to herein as "data incompleteness." Regarding erasure events, multi-stage coding shares many of the benefits of chain reaction coding taught in Luby I. In particular, multi-stage encoded symbols are information additive, so any suitable number of packets can be used to recover an input file to a desired degree of accuracy. These conditions do not adversely affect the communication process when multi-stage coding is used, because the encoded symbols generated with multi-stage coding are information additive. For example, if a hundred packets are lost due to a burst of noise causing data erasure, an extra hundred packets can be picked up after the burst to replace the loss of the erased packets. If thousands of packets are lost because a receiver did not tune into a transmitter when it began transmitting, the receiver could just pickup those thousands of packets from any other period of transmission, or even from another transmitter. With multi-stage coding, a receiver is not constrained to pickup any particular set of packets, so it can receive some packets from one transmitter, switch to another transmitter, lose some packets, miss the beginning or end of a given transmission and still recover an input file. The ability to join and leave a transmission without receiver-transmitter coordination helps to simplify the communication process.

In some embodiments, transmitting a file using multi-stage coding can include generating, forming or extracting source symbols from an input file, computing redundant symbols, encoding source and redundant symbols into one or more encoded symbols, where each encoded symbol is generated based on its key independently of all other encoded symbols, and transmitting the encoded symbols to one or more recipients over a channel. Additionally, in some embodiments, receiving (and reconstructing) a copy of the input file using multi-stage coding can include receiving some set or subset of encoded symbols from one of more data streams, and decoding the source symbols from the values and keys of the received encoded symbols.

Systematic Codes and Nonsystematic Codes

A systematic code is a code where the source symbols are among the encoded symbols that can be transmitted. In this case, the encoded symbols are comprised of source symbols and redundant symbols, also called repair symbols, generated from the source symbols. A systematic code is preferable over a non-systematic code for many applications, for a variety of reasons. For example, in a file delivery application, it is useful to be able to start transmitting data in sequential order while the data is being used to generate repair data, where the process of generating repair data can take some amount of time. As another example, many applications prefer to send the original source data in sequential order in its unmodified form to one channel, and to send repair data to another channel. One typical reason for this is to support both legacy receivers that don't incorporate FEC decoding while at the same time providing a better experience to enhanced receivers that do incorporate FEC decoding, wherein legacy receivers join only the source data channel and enhanced receivers join both the source data channel and the repair data channel.

In these and related types of applications it can sometimes be the case that the loss patterns and the fraction of loss among received source symbols by a receiver is quite different than that experienced among received repair symbols. For example, when source symbols are sent prior repair symbols, due to the bursty loss conditions of the channel, the fraction and pattern of loss among source symbols can be quite different than the corresponding fraction and pattern of loss among repair symbols, and the pattern of loss among source symbols may be far from what might be typical than if the loss were uniformly random. As another example, when the source data is sent on one channel and the repair data on another channel, there might be quite different loss conditions on the two channels. Thus, it is desirable to have a systematic FEC code that works well under different types of loss conditions.

Although examples herein refer to systematic codes (where the output or encoded symbols include the source or input symbols) or nonsystematic codes, the teachings herein should be assumed to be applicable to both, unless otherwise indicated. Shokrollahi III teaches methods to convert a non-systematic chain reaction code to a systematic code in such a way that the robustness properties of the non-systematic code are maintained by the systematic code so constructed.

In particular, using the methods taught in Shokrollahi III, the constructed systematic code has the property that there is little differentiation in terms of recoverability by the decoder between lost source symbols and lost repair symbols, i.e., the decoding recovery probability is essentially the same for a given amount of total loss almost independent of the proportion of the loss among the source symbols compared to the proportion of the loss among the repair symbols. Furthermore, the pattern of loss among the encoded symbols does not significantly affect the decoding recovery probability. In comparison, for the constructions of other systematic codes, such as those described for Tornado codes or for IETF LDPC codes, there is in many cases a strong differentiation in terms of recoverability by the decoder between lost source symbols and lost repair symbols, i.e., the decoding recovery probability can vary widely for the same for a given amount of total loss depending on the proportion of the loss among the source symbols compared to the proportion of the loss among the repair symbols. Furthermore, the pattern of loss among the encoded symbols can have a strong effect on the decoding recovery probability. The Tornado codes and IETF LDPC codes have reasonably good recovery properties if the losses of encoded symbols are uniformly random among all of the encoded symbols, but the recovery properties deteriorate as the loss model deviates from uniform random loss. Thus, in this sense, the embodiments taught in Shokrollahi III have advantages over other constructions of systematic codes.

For an FEC code with the property that there is a strong effect in terms of recoverability by the decoder depending on the proportion of lost source symbols and lost repair symbols, and depending on loss patterns, one approach to overcome this property when it is applicable is to send the encoded symbols in a uniformly random order, i.e., the combination of source and repair symbols are sent in uniformly random order, and thus the source symbols are randomly interspersed among the repair symbols. Sending the encoded symbols in random order has an advantage that whatever the channel loss model, whether the losses are bursty or uniformly random or some other type of losses, the losses to the encoded symbols are still random. However, as noted above, this approach is not desirable for some applications, e.g., for applications where it is desirable to send the source symbols in sequence before the repair symbols, or where the source symbols are sent on a different channel than the repair symbols.

In such cases, constructions of systematic codes where the pattern of loss among the encoded symbols does not greatly affect the recovery properties of the decoder are desired and some examples are provided herein.

As used herein, "random" and "pseudorandom" are often equivalent and/or interchangeable and may depend on context. For example, random losses may refer to which symbols are lost by a channel, which may truly be a random event, whereas a random selection of symbol neighbors might actually be a repeatable pseudorandom selection according to a nonrandom process, but that has the same or similar properties or behaviors as would be the case with a truly random selection. Unless otherwise indicated explicitly or by context, characterizing something as random is not meant to exclude pseudorandomness.

In one approach to such a systematic FEC encoder, source symbols are obtained by an encoder that includes multiple encoder sub-blocks or subprocesses, one of which operates as a decoder to generate intermediate symbols that are input symbols for another sub-block or subprocess. The intermediate symbols are then applied to another sub-block or subprocess that encodes the intermediate symbols into the encoded symbols so that the encoded symbols include the source symbols (along with additional, redundant symbols) generated from one consistent process, thereby providing robustness benefits and other benefits over an encoder that is a systematic encoder that uses one process (e.g., copying) to get the source symbols for the encoded symbol set and another process to get the redundant symbols for the encoded symbol set.

The output encoding can be a chain reaction encoder, a static encoder or other variations. Appendix A describes a systematic code embodiment. After reading the present disclosure, one of ordinary skill in the art should be able to easily extend the teachings of Shokrollahi III to apply to systematic codes such as the Tornado codes and IETF LDPC codes, to yield new versions of these codes that are also systematic codes but have better recovery properties. In particular, the new versions of these codes, obtained by applying the general method described below, are enhanced to have the property that the proportion of loss among the source symbols compared to the proportion of loss among the repair symbols does not significantly affect the decoding recovery probability, and furthermore that the pattern of loss does not significantly affect the decoding recovery probability. Thus, these codes can be effectively used in the applications described above that require usage of systematic FEC codes with recovery properties that are not strongly affected by different fractional loss amounts among source and repair symbols or by different loss patterns.

The new encoding method can be applied generally to encoding for systematic FEC codes, non-systematic FEC codes, fixed rate FEC codes and chain reaction FEC codes to yield an overall encoding method for new enhanced systematic FEC codes. There is also a corresponding new decoding method that can be applied.

Decoder-in-the-Encoder Example

An example of a decoder in an encoder will now be provided.

Let encoding method E be an encoding method used by an encoder (in a transmitter or elsewhere) for a fixed-rate (non-systematic or systematic) FEC code E that generates N encoded symbols from K source symbols, where N is at least K. Similarly, let decoding method E be the corresponding decoding method for FEC code E, used by a decoder in a receiver or elsewhere.

Suppose FEC code E has the property that a random set of K out of the N encoded symbols are sufficient to recover the original K source symbols with reasonable probability using decoding method E, where reasonable probability might, for example, be probability ½. The reasonable probability can be some requirement set by the use or the application and might be a value other than ½. It should be understood that the construction of a particular code need not be specific to a particular recovery probability, but that applications and systems can be designed to their particular level of robustness. In some instances, the recovery probability can be increased by considering more than K symbols, and then determining using a decoding process a set of K symbols out of these considered symbols that allows successful decoding.

Suppose that for FEC code E, an ESI (Encoded Symbol Identifier) is associated with each encoded symbol and that ESI identifies that encoded symbol. Without loss of generality, the ESIs are labeled herein with 0, 1, 2, ..., N−1.

In one embodiment of a systematic encoding method F for a systematic FEC code F generated using the methods for FEC code E, K and N are input parameters. The source symbols for FEC code F will have ESIs 0, ..., K−1 and the repair symbols for FEC code F will have ESIs K, ..., N−1. The systematic encoding method F for FEC code F generates N encoded symbols from K source symbols C(0), ..., C(K−1) using encoding method E and decoding method E for FEC code E, performed by hardware and/or software as follows:

(1) randomly permute the N ESIs associated with FEC code E to arrive at the FEC code E permuted ESI set X(0), ..., X(N−1), wherein this permuted ESI set is organized in such a way that the K source symbols of FEC code E can be decoded from the first K encoded symbols of FEC code E with respect to the permutation order of ESIs X(0), ..., X(K−1), (2) for each i=0, ..., N−1, associate ESI i of FEC code F with ESI X(i) of FEC code E, (3) for each i=0, ..., K−1, set the value of the FEC code E encoded symbol with ESI X(i) to the value of source symbol C(i), (4) apply the decoding method E to the source symbols C(0), ..., C(K−1) with corresponding FEC code E ESIs X(0), ..., X(K−1) to generate the decoded symbols E(0), ..., E(K−1), and (5) apply the encoding method E to the decoded symbols E(0), ..., E(K−1) to generate FEC code E encoded symbols D(0), ..., D(N−1) with associated FEC code ESIs 0, ..., N−1, (6) the encoded symbols for encoding method F with ESIs 0, 1, ..., N−1 are D(X(0)), D(X(1)), ..., D(X(N−1)).

Note that the output of encoding method F is N encoded symbols, of which the first K are the source symbols C(0), ..., C(K−1) with associated ESIs 0, 1, ..., K−1. Thus, encoding method F produces a systematic encoding of the source data.

One embodiment of a decoding method F that corresponds to the encoding method F just described is the following, where K and N are input parameters to this method that are used throughout. This decoding method F recovers K source symbols C(0), ..., C(K−1) from K received encoded symbols D(0), ..., D(K−1) with associated FEC code F ESIs Y(0), ..., Y(K−1). The received symbols need not be exactly the sent symbols. The method, performed by hardware and/or software, is as follows:

(1) randomly permute the N ESIs associated with FEC code E to arrive at the FEC code E permuted ESI set X(0), ..., X(N−1), wherein this permuted ESI set is organized in such a way that the K source symbols of FEC code E can be decoded from the first K encoded symbols of FEC code E with respect to the permutation order of ESIs X(0), ..., X(K−1), (2) apply decoding method E to the encoded symbols D(0), ..., D(K−1) with associated FEC code E ESIs X(Y(0)), ..., X(Y(K−1)) to generate decoded symbols E(0), ..., E(K−1), (3) using encoding method E, generate the encoded symbols C(0), ..., C(K−1) with FEC code E ESIs X(0), ..., X(K−1) from E(0), ..., E(K−1), (4) the decoded source symbols of FEC code F with ESIs 0, ..., K−1 are C(0), ..., C(K−1).

Methods and apparatus that operate as just described have some desirable properties. For example, consider an FEC code E that is a systematic code and has the property that a random set of K received encoded symbols can be decoded with high probability, but also has the property that when K encoded symbols are received and the proportion of source symbols among the received encoded symbols is not close to K/N, then it cannot be decoded with high probability. In this case, the embodiment describes a new FEC code F that uses the encoding and decoding methods of FEC code E, and the new FEC code F has the desirable property that it will decode with high probability from a set of K received encoded symbols, independent of the proportion of the received encoded symbols that are source symbols.

There are many variants of the above embodiment. For example, in step (1) of the encoding method F, the random permutation of the ESIs could be pseudorandom or based on some other method that produces a good selection of the ESIs but is neither random nor pseudorandom. In the case that FEC code E is a systematic code, it is preferable that the fraction of the first K ESIs in the permutation selected in step (1) from among the systematic ESIs is proportional to the rate of FEC code E, i.e., proportional to K/N. It is preferable that the random choices of the ESIs made by new encoding method F in step (1) can be represented by a succinct amount of data, for example by a seed to a well-known or agreed upon pseudo-random generator together with a agreed upon method to choose the ESIs based on the seed and how the pseudorandom generator works, so that the new decoding method F can make exactly the same ESI permutation choice in step (1) based on the same seed and pseudorandom generator and methods for generating ESIs. In general, it is preferable if the process used in new encoding method F in step (1) to generate the sequence of ESIs and the process used in new decoding method F in step (1) to generate the sequence of ESIs both generate the same sequence of ESIs, to ensure that new decoding method F is the inverse of new encoding method F.

There are other variants as well, where for example explicit ESIs are not used, but instead the unique identifier of an encoded symbol is by its position with respect to other encoded symbols, or by other means.

In the description above, the original ESIs of the FEC code E are remapped by the FEC code F so that the ordered set of source symbols are assigned the ESIs 0, ..., K−1 in consecutive order, and the repair symbols are assigned the ESIs K, ..., N−1. Other variants are possible, for example the remapping of ESIs can occur at a sender just after encoding method F has generated the encoded symbols but before the encoded symbols are transmitted, and the inverse remapping of ESIs can occur at a receiver as the encoded symbols are received but before the encoded symbols are processed for recovery of the original source symbols by decoding method F.

As another variant, in step (1) of new encoding method F the permutation might be selected by first selecting K+A FEC code E ESIs, where A is a value that is chosen to ensure decodability with high probability, and then during a simulation of the decoding process it is determined which of the K out of K+A ESIs are actually used during decoding, and the permutation selected might select the K ESIs actually used during decoding out of the initial set of K+A ESIs to be the first K ESIs of the permutation. Similar variants apply to new decoding method F.

As another variant of encoding method F, a seed that is used to generate the random permutation is pre-computed for a value of K to ensure that the first K encoded symbols of FEC code E associated with the permutation of ESIs produced in step (1) is decodable, and then this seed is always used for K in step (1) of encoding method F and corresponding decoding method F to generate the permutation in step (1). Methods for choosing such a seed include randomly choosing seeds until one is found that ensures decodability in step (1) and then selecting this seed. Alternatively, the seed could be dynamically generated with these properties by encoding method F and then this seed could be communicated to decoding method F.

As another variant of encoding method F, a partial permutation might be selected in step (1), i.e., not all of the ESIs need be generated in step (1) of new encoding method F, and not all of the encoded symbols need be generated if they are not needed in steps (5) and (6), e.g., because they correspond to source symbols that are part of the encoded symbols, or because less than N encoded symbols need to be generated. In other variants, not all of the encoded symbols in steps (3) and (4) of new decoding method F need be recomputed, as some of the received encoded symbols may correspond to some of the source symbols that are being recovered. Similarly, in step (2) of new decoding method F, not all K symbols E(0), . . . , E(K−1) need be decoded, for example if some of the symbols decoded in step (2) are not needed in subsequent steps to generate encoded symbols.

The methods and embodiments described above have many applications. For example, encoding method F and decoding method F and their variants can be applied to Tornado codes and to IETF LDPC codes to provide improved reception overhead and decoding failure probability performance. In general, these new methods apply to any fixed rate FEC code. Variants of these new methods can also be applied to FEC codes that have no fixed rate, i.e., to FEC codes such as chain reaction codes where the number of encoded symbols that can be generated is independent of the number of source symbols.

Shokrollahi III contains similar teachings for creating systematic encoding and decoding methods for chain reaction codes. In some embodiments, the encoding and the decoding methods E used for these codes are those taught in Luby I, Luby II, Shokrollahi I, Shokrollahi II, Luby III, Shokrollahi IV. To describe systematic encoders, it is often sufficient to describe encoding method E and decoding method E and use the general principles described above and known from those references to transform these methods to systematic encoding methods F and systematic decoding methods F. It should thus be apparent to one of ordinary skill in the art, upon reading this disclosure and the cited references, how to take the teachings that describe the encoding methods E and the decoding methods E and to apply the same to systematic encoding methods F and systematic decoding methods F, or the like.

Inactivation

Inactivation decoding, as taught in Shokrollahi II, is a general method that can be applied in combination with belief propagation whenever solving for a set of unknown variables from a set of known linear equation values, and is particularly beneficial when implementing efficient encoding and decoding methods that are based on sets of linear equations. In order to distinguish between inactivation decoding as described in Shokrollahi II and permanent inactivation decoding as described herein below, "on the fly" inactivation (abbreviated to "OTF inactivation" in places) is used to refer to the methods and teachings of Shokrollahi II, whereas "permanent inactivation" is used to refer to the methods and teachings herein where inactivations are selected in advance.

One tenet of belief propagation decoding is that, whenever possible during the decoding process, the decoder should use a (possibly reduced) equation that depends on one remaining unknown variable to solve for that variable, and that equation is thus associated with that variable, and then reduce remaining unused equations by eliminating the dependence of those equations on the solved variable. Such a simple belief-propagation based decoding process has been used, for example, in some of the embodiments of Tornado codes, the chain reaction codes as described in Luby I, Luby II, Shokrollahi I, Shokrollahi II, Luby III, Shokrollahi IV, and the IETF LDPC codes.

OTF inactivation decoding goes in multiple phases. In a first phase of an OTF inactivation decoding method, whenever the belief propagation decoding process cannot continue because there is no remaining equation that depends on just one remaining unknown variable, the decoder will "OTF inactivate" one or more unknown variables and consider them "solved" with respect to the belief propagation process and "eliminated" from the remaining equations (even though they really are not), thus possibly allowing the belief propagation decoding process to continue. The variables that are OTF inactivated during the first phase are then solved for, for example using Gaussian elimination or more computationally efficient methods, in for example a second phase, and then in a third phase, the values of these OTF inactivated variables are used to fully solve for the variable associated with the equations during the first phase of decoding.

OTF inactivation decoding, as taught in greater detail in Shokrollahi II, can be applied to many other types of codes beyond chain reaction codes. For example, it can be applied to the general class of LDPC and LDGM codes, in particular to the IETF LDPC codes and to the Tornado codes, resulting in improvements in reliability (decreasing the probability of failing to decode) and/or CPU and/or memory performance (increasing the speed of encoding and/or decoding and/or decreasing the memory size required and/or access pattern requirements) for those types of codes.

Some of the variants of chain reaction code embodiments in combination with OTF inactivation decoding are described in Shokrollahi IV. Other variants are described in the present application.

System Overview

FIG. 1 is a block diagram of a communications system 100 that uses multi-stage coding. It is similar to that shown in Shokrollahi I, but in this case the encoder 115 takes into account a designation of which intermediate symbols are "permanently inactivated" and operates differently on those intermediate symbols than the intermediate symbols that are not permanently inactivated during the dynamic encoding process. Likewise, the decoder 155 also takes the permanently inactivated intermediate symbols into account when decoding.

As illustrated in FIG. 1, K source symbols (C(0), . . . , C(K−1)) are input to encoder 115 and, if decoding is successful with the symbols that become available to decoder 155, then decoder 115 can output a copy of those K source symbols. In some embodiments, a stream is parsed into K-symbol blocks and in some embodiments, a file of some number of source symbols larger than K is divided into K-sized symbol blocks and so transmitted. In some embodiments, where a block size of K'>K is preferred, K'−K padding symbols can be added to the K source symbols. These padding symbols can have values 0, or any other fixed value that is known to both encoder 115 and decoder 155 (or is otherwise able to be determined at decoder 155). It should be understood that encoder 115 might comprise multiple encoders, modules or the like, and that may also be the case for decoder 155.

As illustrated, encoder 115 also receives a sequence of dynamic keys from a dynamic key generator 120 and a sequence of static keys from as static key generator 130, each of which might be driven by a random number generator 135. The output of dynamic key generator 120 might be simply a cardinal number sequence, but that need not be the case. The operation of the key generators might be as shown in Shokrollahi I.

It should be understood that various functional blocks shown in the figures can be implemented as hardware with the specified inputs provided as input signals, or they can be implemented by a processor executing instructions that are stored in an instruction memory and executed in the appropriate order to perform the corresponding function. In some cases, specialized hardware is used to perform the functions and/or execute program code. Program code and processor are not always shown, but one of ordinary skill would know how to implement such details upon reading this disclosure.

Encoder 115 also receives inputs from an inactivation designator 125 and other parameters input to system 100 along the lines described elsewhere herein. Outputs of inactivation designator 125 might include a value, P, representing the number of intermediate symbols that are designated as "permanently inactivated" for decoding purposes (the "PI list" indicates which P of the intermediate symbols are on the list). As explained elsewhere, the intermediate symbols used for encoding processes are just the K source symbols in some embodiments, but in other embodiments, there is some type of processing, conversion, encoding, decoding, etc. that generates the intermediate symbols from the K source symbols beyond just copying them.

Input parameters might include random seeds used by the key generators and/or the encoder's encoding processes (described in more detail below), the number of encoded symbols to generate, the number of LDPC symbols to generate, the number of HDPC symbols to generate, the number of intermediate symbols to generate, the number of redundant symbols to generate, etc. and/or some of these values are calculated from other values available to encoder 115. For example, the number of LDPC symbols to be generated might be calculated entirely from a fixed formula and the value of K.

Encoder 115 generates, from its inputs, a sequence of encoded symbols ($B(I_0), B(I_1), B(I_2), \ldots$) and provides them to a transmit module 140 that also receives the dynamic key values ($I_0, I_1, I_2, \ldots$) from dynamic key generator 120, but this might not be necessary if there is another method of conveying that information. Transmit module 140 conveys what it is given to a channel 145, possibly in a conventional manner that does not need to be described here in more detail. A receive module 150 receives the encoded symbols and the dynamic key values (where needed). Channel 145 may be a channel through space (for transmitting from one place to be received at another place) or a channel through time (for recording to media, for example, for replay back at a later time). Channel 145 may cause the loss of some of the encoded symbols. Thus, the encoded symbols $B(I_a), B(I_b), \ldots$ that decoder 115 receives from receive module 150 might not equal the encoded symbols that transmit modules sent. This is indicated by the different subscripted indices.

Decoder 155 is preferably able to regenerate the keys used for the received symbols (which keys might differ), using dynamic key regenerator 160, random number generator 163 and static key generator 165, and to receive as inputs various decoding parameters. Some of these inputs might be hard-coded (i.e., input during construction of a device) and some might be changeable inputs.

FIG. 2 is a table of variables, arrays and the like, with a summary of the notation that is most often used in the other figures and throughout this disclosure. Unless stated otherwise, K denotes the number of source symbols for the encoder, R denotes the number of redundant symbols generated by a static encoder, and L is the number of "intermediate symbols," i.e., the combination of source and redundant symbols and so L=K+R.

As is explained below, in some embodiments of a static encoder, two types of redundant symbols are generated. In a specific embodiment, used in many examples here, the first set comprises LDPC symbols and the second set comprises HDPC symbols. Without loss of generality, many examples herein refer to S as the number of LDPC symbols and H as the number of HDPC symbols. There might be more than two types of redundant symbols, so it is not required that R=S+H. LDPC symbols and HDPC symbols have different degree distributions and a person of ordinary skill in the art, upon reading this disclosure, would see how to use redundant symbols that are not LDPC or HDPC symbols, but where the redundant symbols comprise two (or more) sets of symbols wherein each set has a degree distribution distinct from the degree distributions of the other sets. As is well known, the degree distribution of a set of redundant symbols refers to the distribution of degree, wherein the degree of a redundant symbol refers to the number of source symbols upon which the redundant symbol depends.

P denotes the number of permanently inactive symbols among the intermediate symbols. The permanently inactive symbols are those that are designated for a particular treatment, namely to be "set aside" or "inactivated" in a belief propagation network in order to continue the belief propagation (and then come back to solve after solving the inactivated symbols), wherein permanently inactivated symbols are distinguished from other inactivated symbols in that the permanently inactivated symbols are designated at the encoder for such treatment.

N denotes the number of received symbols on which a decoding attempt is made by decoder 155, and A is the number of "overhead" symbols, i.e., the number of received encoded symbols beyond K. Hence, A=N−K.

K, R, S, H, P, N and A are integers, typically all greater than or equal to one, but in specific embodiments, some of these can be one or zero (e.g., R=0 is the case where there are no redundant symbols and P=0 falls back to the case of Shokrollahi II, where there is only OTF inactivation.)

The vector of source symbols is denoted by (C(0), . . . , C(K−1)) and the vector of redundant symbols is denoted by (C(K), . . . , C(L−1)). Therefore, (C(0), . . . , C(L−1)) denotes the vector of intermediate symbols, in the systematic case. A number, P, of those intermediate symbols are designated "permanently inactive." A "PI list" indicates which ones of the intermediate symbols are the permanently inactive ones. In many embodiments, the PI list simply points to the last P intermediate symbols, i.e., C(L−P), . . . , C(L−1), but this is not a requirement. That case is assumed only to simplify the remaining portions of this description.

The intermediate symbols that are not on the PI list are referred to as "LT intermediate symbols" herein. In the example, the LT intermediate symbols would be C(0), . . . , C(L−P−1). D(0), . . . , D(N−1) denote the received encoded symbols.

It should be noted that where an array of values is described as "N(0), . . . , N(x)" or the like, it should not be assumed that this requires at least three values, as it is not intended to exclude the case where there is only one or two values.

Encoding Method Using Permanent Inactivation

Figure 3:
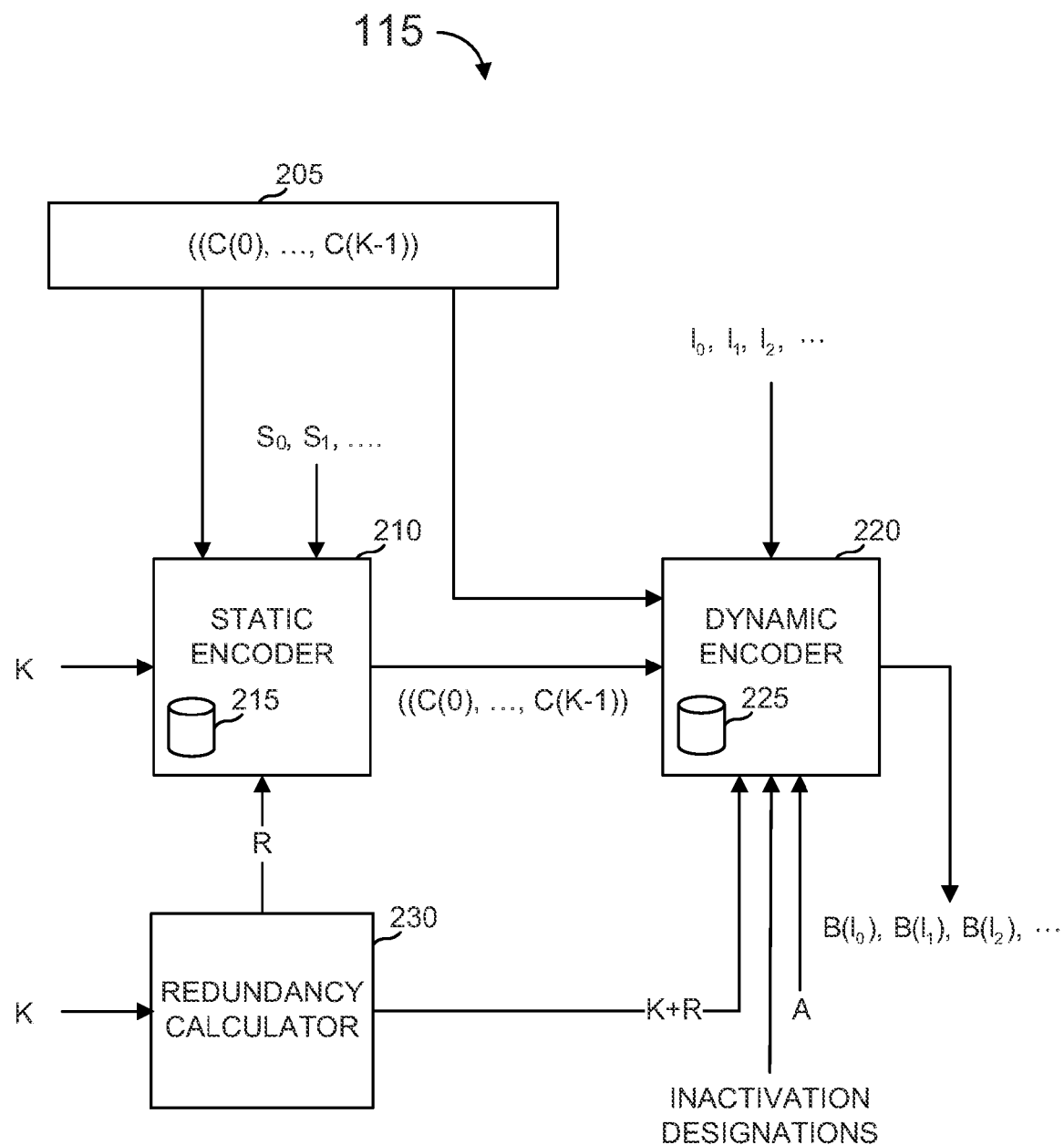
FIG. 3 is a block diagram of a specific embodiment of the encoder shown in FIG. 1.

FIG. 3 is a block diagram of one specific embodiment of encoder 115 shown in FIG. 1. As illustrated there, the source symbols are stored in an input buffer 205 and provided to a static encoder 210 and a dynamic encoder 220, which also receive key inputs and other inputs. Static encoder 210 might include internal storage 215 (memory, buffer, virtual memory, register storage, etc.) for storing internal values and program instructions. Likewise, dynamic encoder 220 might include internal storage 225 (memory, buffer, virtual memory, register storage, etc.) for storing internal values and program instructions.

In some embodiments, a redundancy calculator 230 determines the number R of redundant symbols to create. In some embodiments, static encoder 210 generates two distinct sets of redundant symbols and in a specific embodiment, the first set is the first S redundant symbols, i.e., symbols C(K), . . . , C(K+S−1) and they are LDPC symbols, while the second set is the next H redundant symbols, i.e., C(L−H), . . . , C(L−1) and they are HDPC symbols. If the PI list is the last P redundant symbols, then all of the H redundant symbols may be on the PI list (if P≥H) or all of the P redundant symbols may be HDPC symbols (if P<H).

The operations leading to the generation of these two sets of symbols may be quite different. For example, in some embodiments described below, the operations for generating the LDPC redundant symbols are binary operations and the operations for generating the HDPC symbols are non-binary.

Figure 4:
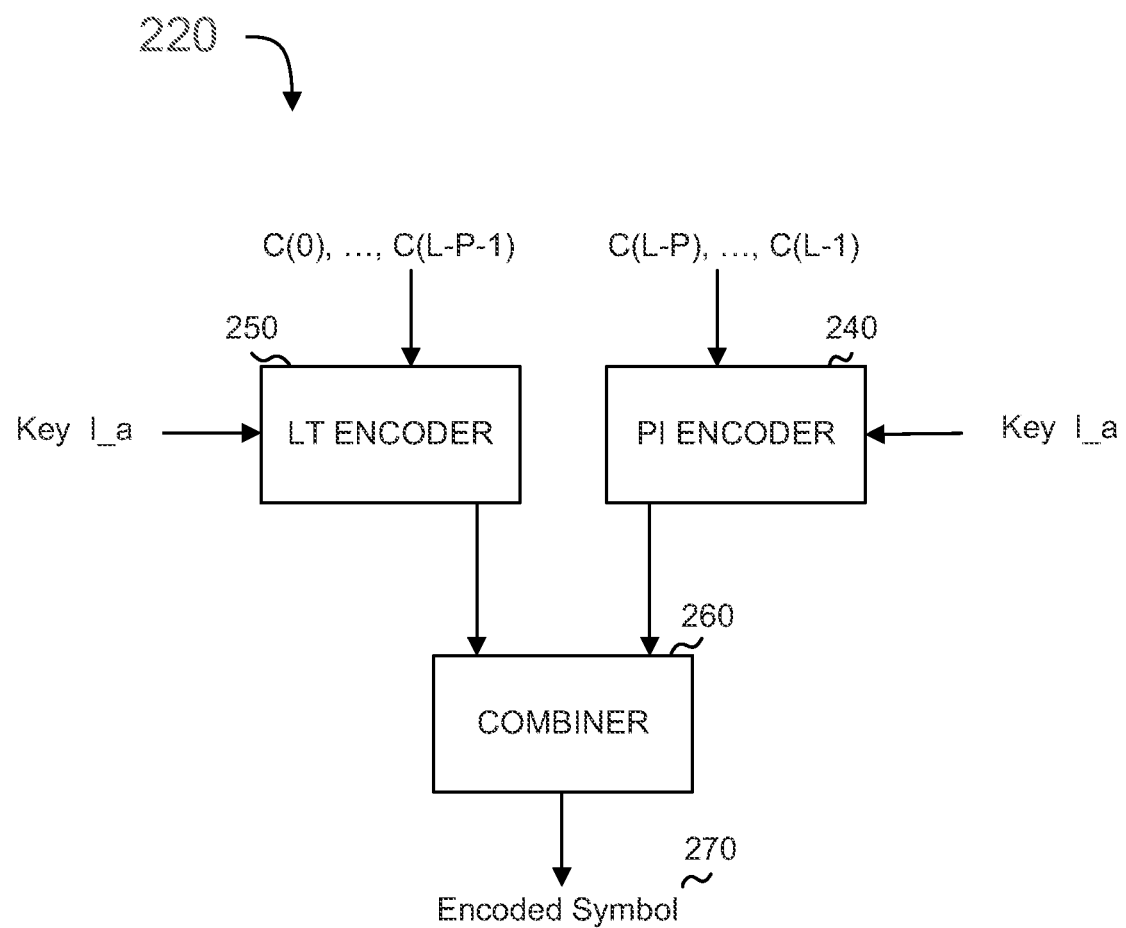
FIG. 4 is a block diagram showing the dynamic encoder of FIG. 3 in greater detail.

The operation of dynamic encoder 220 is explained in further detail in FIG. 4. According to one embodiment, dynamic encoder 220 comprises two encoders, a PI encoder 240 and an LT encoder 250. In some embodiments, LT encoder 250 is a chain reaction encoder and PI encoder 240 is a chain reaction encoder of a particular type. In other embodiments, these two encoders may be very similar, or PI encoder 240 is not a chain reaction encoder. No matter how these encoders are defined, they generate symbols, wherein LT encoder 250 generates its symbols from the LT intermediate symbols C(0), . . . , C(L−P−1) that are designated as not permanently inactive, and whereas PI encoder 240 generates its symbols from the permanently inactive intermediate symbols C(L−P), . . . , C(L−1). These two generated symbols enter combiner 260 that generates the final encoded symbol 270.

In some embodiments of the present invention some of the permanently inactivated symbols may participate in the LT-encoding process, and some of the symbols that are not permanently inactivated symbols may participate in the PI encoding process. In other words, the PI list and the set of symbols comprising the LT intermediate symbols need not be disjoint.

In preferred embodiments, the symbols provided to combiner 260 may have the same length, and the function performed by combiner 260 is an XOR operation on these symbols to generate the encoded symbol 270. This is, however, not necessary for the working of this invention. Other types of combiners can be envisioned that could lead to similar results.

In other embodiments, the intermediate symbols are subdivided into more than two sets, for example one set of LT symbols and several (more than one) sets of PI symbols, each with its associated encoder 240. Of course, each associated encoder might be implemented as a common computing element or hardware element that operates on different instructions according to an encoding process when acting as a different encoder for different sets.

Figure 5:
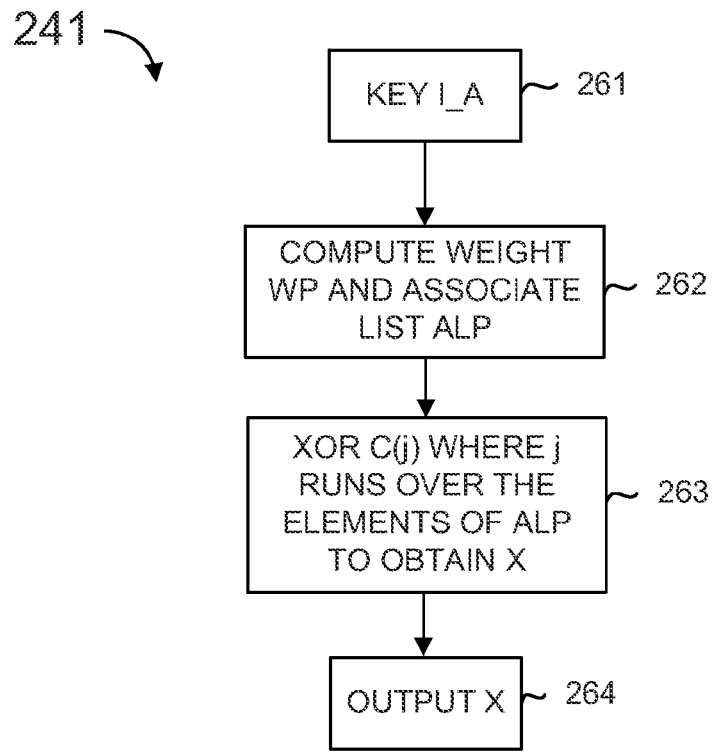
FIG. 5 is a flowchart illustrating a permanent inactivation (PI) encoding process.

An example operation of PI encoding process 241, as might be performed by PI encoder 240, is exemplified in FIG. 5. Using the key I_a corresponding to an encoded symbol to be generated, at step 261, the encoder determines a positive weight, WP, and a list, ALP, containing WP integers between L−P and L−1, inclusive. In step 263, if list ALP=(t(0), . . . , t(WP−1)), then the value of a symbol X is set to X= C(t(0))⊕C(t(1))⊕ . . . ⊕C(t(WP−1)), wherein ⊕ denotes the XOR operation.

In some embodiments, the weight WP is fixed to some number, such as 3, or 4 or some other fixed number. In other embodiments, the weight WP may belong to a small set of possible such numbers, such as being chosen to be equal to either 2 or 3. For example, as shown in the embodiment of Appendix A, the weight WP depends on the weight of the symbol generated by LT encoding process 251, as might be performed by LT encoder 250. If the weight generated by the LT encoder 250 is 2, then WP is chosen to be either 2 or 3, depending on the key I_a, wherein the proportion of times in which WP is 2 or 3 is roughly equal; if the weight generated by the LT encoder 250 is larger than 3, then WP is chosen to be 2.

Figure 6:
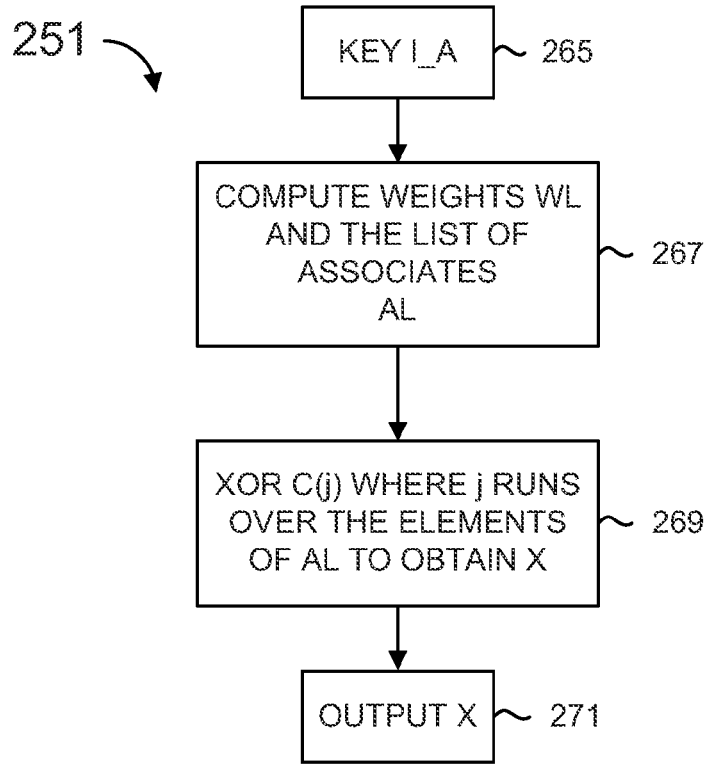
FIG. 6 is a flowchart illustrating a dynamic encoding process.

FIG. 6 is an example of an LT encoding process 251 according to one of the embodiments of the present invention and using the teachings of Luby I and Shokrollahi I. In step 267, the key I_a is used to generate a weight, WL, and a list, AL, respectively. In step 269, if list ALP=(j(0), . . . , j(WL−1)), then the value of a symbol X is set to X=C(j(0))⊕ C(j(1))⊕ . . . ⊕C(j(WL−1)).

Figure 7:
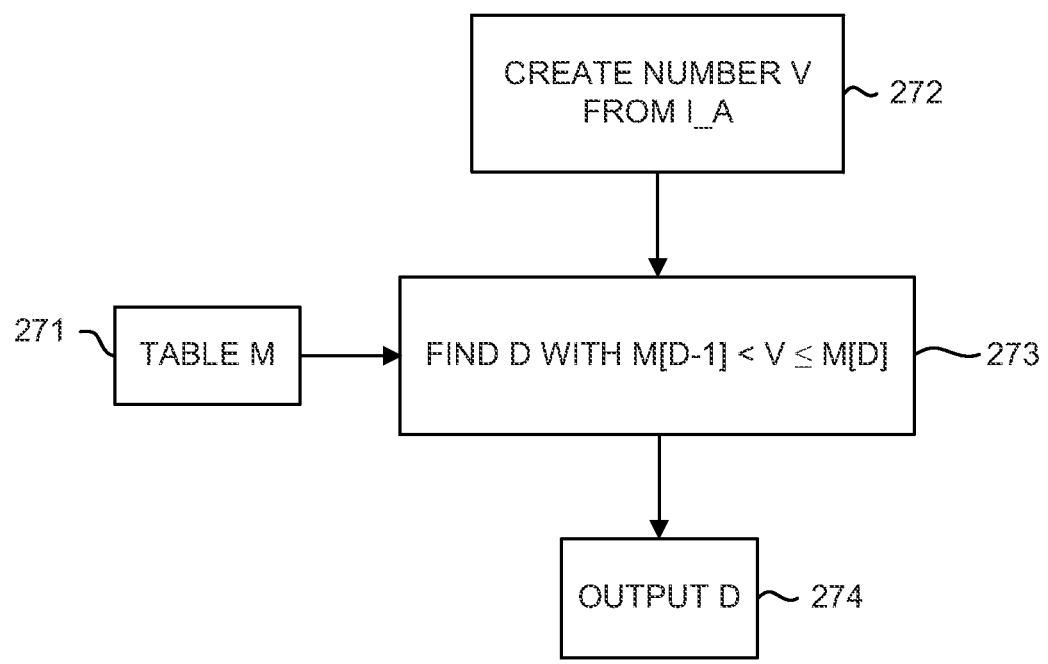
FIG. 7 is a flowchart of an operation of calculating a weight for a symbol calculation.

FIG. 7 illustrates an operation of calculating the weight WL. As shown there, in step 272, a number, v, is created that is associated with the encoded symbol to be generated and may be computed based on the key I_a for that encoded symbol. It can be the index, the representative label, etc. of the encoded symbol, or a distinct number, so long as encoders and decoders can be consistent. In this example, v is between 0 and $2^{20}$, but in other examples, other ranges are possible (such as 0 to $2^{32}$). The generation of v can be done in an explicit way using randomness generating tables, but the exact operation of how to generate these random numbers can vary.

The encoder is assumed to have access to a table M, an example of which is provided in FIG. 8. Table M, called a "degree distribution lookup" table, contains two columns and multiple rows. The left column is labeled with possible values of the weight WL, and the right column is labeled with integers between 0 and $2^{20}$, inclusive. For any value of v, there is exactly one cell in the M[d] column of the degree distribution lookup table wherein M[d−1]<v ≤M[d] is true. For that one cell, there is a corresponding value in the d column, and the encoder uses that as the weight WL for the encoded symbol. For example, where an encoded symbol has v=900,000, the weight for that encoded symbol would be WL=7.

Static encoder 210 has access to elements SE(k,j) where k=0, . . . , R−1 and j=0, . . . , L−1. These element can belong to any finite field for which there is an operation * between elements α of the field and symbols X such that α*X is a symbol, and α*(X⊕Y)=α*X⊕α*Y where ⊕ denotes the XOR operation. Such fields and operations have been detailed in Shokrollahi IV. The operation of static encoder 210 can be described as computing, for a given sequence of source symbols C(0), . . . , C(K−1), a sequence of redundant symbols C(K), . . . , C(L−1) satisfying the relation shown in Equation 1, wherein Z(0), . . . , Z(R−1) are values known to the encoder and the decoder (for example, 0).

(Equ. 1)
$$\begin{pmatrix} SE(0,0) & SE(0,1) & \ldots & SE(0,L-2) & SE(0,L-1) \\ \vdots & \vdots & \ddots & \vdots & \vdots \\ SE(R-1,0) & SE(R-1,1) & \ldots & SE(R-1,L-2) & SE(R-1,L-1) \end{pmatrix}$$
$$\begin{pmatrix} C(0) \\ \vdots \\ C(K-1) \\ C(K) \\ \vdots \\ C(L-1) \end{pmatrix} = \begin{pmatrix} Z(0) \\ \vdots \\ Z(R-1) \end{pmatrix},$$

In Equation 1, the entries SE(k,j) can all be binary, or some of them can belong to the field GF(2) while others belong to other fields. For example, the corresponding matrix of the embodiment of Appendix A is given in FIG. 9. It comprises two submatrices, one with S rows and one with H rows. The upper submatrix comprises two parts: the submatrix comprising the last P columns in which every row has two consecutive ones (where the positions are counted modulo P). The first W=L−P columns of this matrix comprise circulant matrices followed by an S×S identity matrix. The circulant matrices comprise B of the columns and each (except possibly the last) has S rows. The number of these circulant matrices is ceil(B/S). The columns in these circulant matrices have each exactly 3 ones. The first column of the k-th circulant matrix has ones at positions 0, (k+1) mod S, and (2k+1) mod S. The other columns are cyclic shifts of the first. The lower H rows in FIG. 9 comprise a matrix Q with entries in GF(256) followed by an H×H identity matrix.

Figures 9, 10:
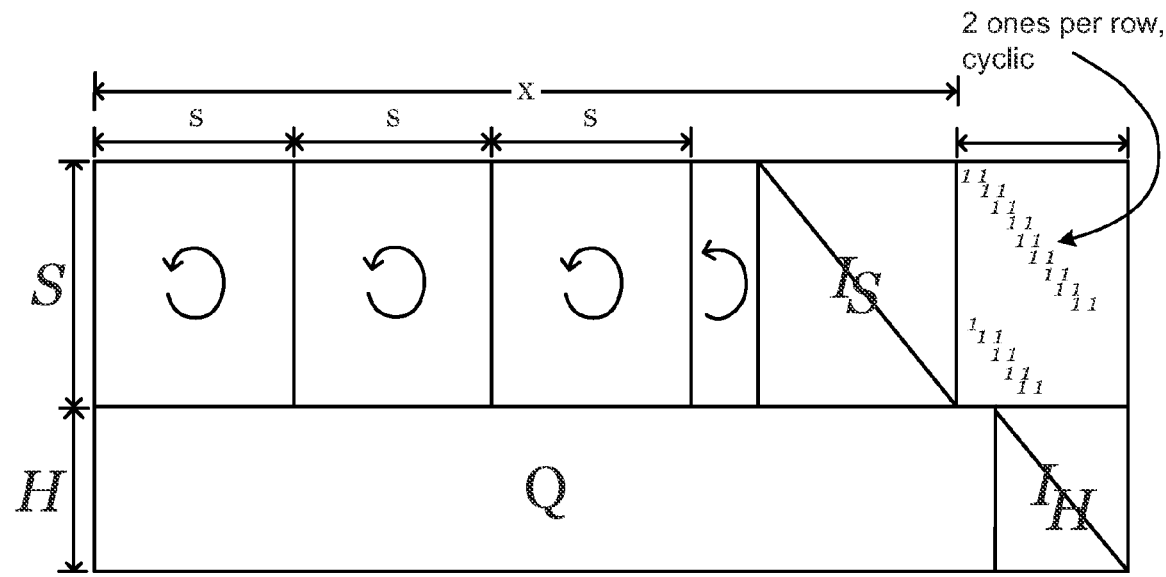
FIG. 9 shows a matrix used in an encoding or decoding process.
FIG. 10 shows an equation representing parts of the matrix shown in FIG. 9, for a specific minimal polynomial.
Figure 11:
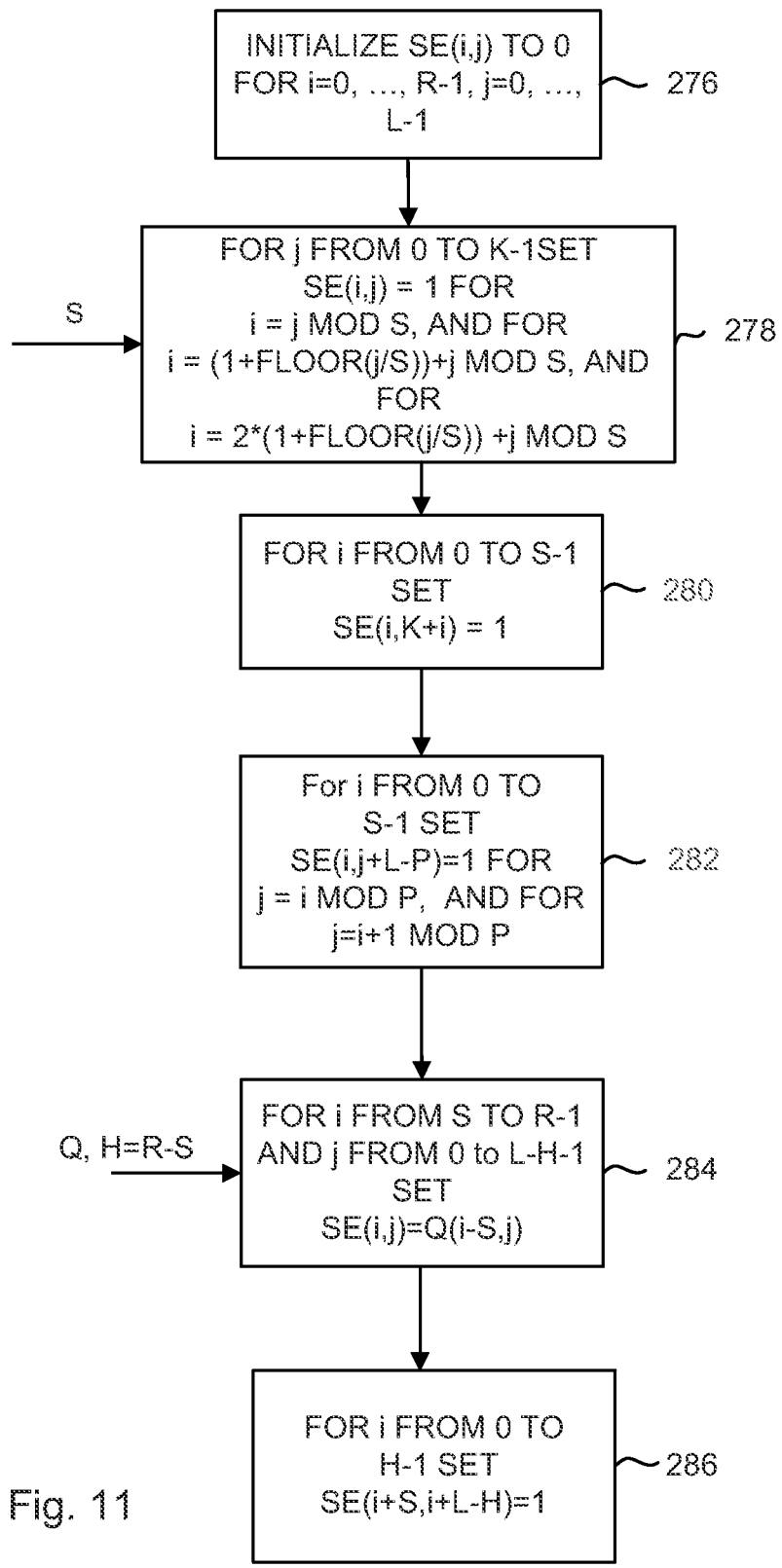
FIG. 11 is a flowchart illustrating a process for setting up an array for use in encoding or decoding.

If α denotes an element of GF(256) with minimal polynomial $x^8+x^4+x^3+x^2+1$, then the matrix Q is equal to the matrix given in FIG. 10. Here, $\Delta_1, \ldots, \Delta_{K+S-1}$ are columns of weight 2 for which the positions of the 2 nonzero entries are determined pseudorandomly according to the procedure outlined in Section 5.3.3.3. of Appendix A. For judicious choices of values S, P, and H (such as the ones provided in Appendix A), the matrix in FIG. 10 leads to excellent recovery properties of the corresponding code. The procedure described above is exemplified in FIG. 11. In step 276, the matrix SE is initialized to 0. In step 278, an input variable S, equal to the number of LDPC symbols, is provided to the process, and the values of SE(i,j) are set to 1 for pairs (i,j) such that i=j mod S, or i=(1+floor(j/S))+j mod S, or i=2*(1+floor(j/S))+j mod S. This step takes care of the circulant matrices in FIG. 9.

In step 280, the positions corresponding the identity matrix $I_S$ in FIG. 9 are set to one. In step 282, the positions corresponding to the PI part of the matrix in FIG. 9 are set to 1. These positions are of the form (i,l) and (i,t), where l=i mod P and t=(i+1) mod P. In step 284, the positions corresponding to the matrix Q in FIG. 9 are set. Accordingly, the matrix Q is provided as an additional input to this step. In step 286, the positions corresponding to the identity matrix $I_H$ in the matrix of FIG. 9 are set to one.

Other choices for matrix SE are possible and depend on the particular application and the requirements demanded of the overall code. No matter how the matrix in Equation 1 is chosen, the task of the static encoder 210 can be accomplished in a variety of ways. For example, Gaussian elimination can be used as a process to recover the unknown values C(K), . . . , C(L−1) as would be apparent to one of ordinary skill in the art upon reading this disclosure.

Decoding and Permanent Inactivation

The decoding problem can be stated as follows: decoder 155 has N encoded symbols $B(I_a), B(I_b), \ldots$ with corresponding keys $I_a, I_b, \ldots$. The entire set of these encoded symbols, or a subset thereof, may have been received by the decoder, whereas the other encoded symbols may have been given to the decoder by other means. The goal of the decoder is to recover the source symbols C(0), . . . , C(K−1). To simplify the presentation, we denote the received encoded symbols by D(0), . . . , D(N−1).

Many of the decoding operations can be succinctly described using the language of matrices and operations on such matrices, in particular solving systems of equations with such matrices. In the following description, equations can correspond to received encoded symbols and variables can correspond to the source symbols or a combined set of source and redundant symbols generated from the source symbols, often called intermediate symbols, that are to be solved for based on received encoded symbols. In the specification provided as Appendix A, the encoded symbols might be referred to as "encoding symbols" (and there are other variations), but it should be apparent after reading the entire specification and appendix how the references relate. It should also be understood that the matrices and operations and solutions to equations can be implemented as computer instructions corresponding to those mathematical operations, and indeed it is not practical to do such operations without a computer, processor, hardware or some electronic element.

Permanent inactivation is used to determine at the decoder a set of variables to inactivate, called the permanently inactivated symbols or variables, before the first phase of the decoding process is initiated. The permanent inactivation decoding methods described below can be applied either to existing codes, or codes can be specially designed to work even better in conjunction with permanent inactivation decoding. Permanent inactivation decoding methods can be applied to solving any system of linear equations, and in particular can be applied to chain reaction codes, IETF LDPC codes and Tornado codes.

Permanent inactivation decoding is a general method that can be applied in combination with belief propagation decoding and/or OTF inactivation decoding whenever solving for a set of unknown variables from a set of known linear equation values, and is particularly beneficial when implementing efficient encoding and decoding methods that are based on sets of linear equations. In a first phase, based on the structure of the known encoding method or based on the received equations, a set of unknown variables are declared to be permanently inactivated, and the permanently inactivated variables are removed from the linear equations and considered to be "solved" in the second phase of the decoding process (except that as the second phase linear equations are reduced, the same reductions are performed on the permanently inactivated variables).

In the second phase, either belief propagation decoding is applied to the unknown variables that are not permanently inactivated using belief propagation decoding described previously, or OTF inactivation decoding is applied to the unknown variables that are not permanently inactivated, similar to that described for first phase of the OTF inactivation decoding method, thereby producing a set of reduced encoded symbols or equations. The reduced encoded symbols or equations that result from the second phase have the property that their dependency on the variables or symbols that are not inactivated has been eliminated, and thus the reduced encoded symbols or equations depend only on the inactivated variables or symbols. Note that an original encoded symbols or equations may be kept as well, so that both the original encoded symbols and the reduced encoded symbols may be available in some implementations.

In a third phase, the permanently inactivated variables together with any additional OTF inactivated variables generated in the second phase using OTF inactivation decoding are solved for using the reduced encoded symbols or equations, for example using Gaussian elimination, or, if it exists, a special structure of the relationships between the permanently inactivated variables and the linear equations is used to solve more efficiently than by using Gaussian elimination.

In a fourth phase, the values of the solved for inactivated variables, either OTF inactivated variables or permanently inactivated variables, are used in conjunction with the original encoded symbols or equations (or rederived original encoded symbols or equations) to solve for the variables that were not inactivated.

One of the advantages of permanent inactivation decoding methods is that the number w of OTF inactivations other than the permanent inactivations can be generally small or zero and can be largely independent of which encoded symbols are received. This can make the decoding complexity consistently small independent of which encoded symbols are received, allow more reliable decoding, and allow more predictable and fewer memory accesses which can be more efficiently scheduled. Because there are only a small number of OTF inactivations in the second phase, and because OTF inactivations in the second phase are generally only determined during the decoding process which can make the pattern of symbol operations somewhat unpredictable, the memory access patterns are more predictable during decoding, overall allowing more predictable efficient decoding processes.

There are many variants of the above. For example, the phases may be executed in non-sequential interleaved order. As another example, the inactivated symbols may in turn be solved for in the third phase using either OTF inactivation decoding or permanent inactivation decoding in multiple additional phases. As another example, permanent inactivation decoding may be applied to a linear system of equations and variables that may be used for error-correcting codes, or erasure correcting codes, or for other applications that can be solved using linear systems of equations. As another example, these methods can be applied to both systematic codes and to non-systematic codes. As another example, these methods can also be applied during an encoding process, for example when encoding using the methods taught in Shokrollahi III for generating systematic codes from non-systematic codes.

In some cases, it is possible to design the encoding process so that permanent inactivation decoding methods will be especially effective. For example, belief propagation decoding is known to be computationally efficient whenever it can be applied, but it is also known that it cannot provide high reliability decoding when used alone. When belief propagation decoding is used within OTF inactivation decoding, the belief propagation steps can be processed very efficiently, but the OTF inactivation steps interspersed within the belief propagation steps can slow down decoding, and the more such OTF inactivation steps there are, the slower is the decoding process.

In typical embodiments of OTF inactivation decoding, when trying to solve for K+R unknown variables using N+R linear equation values, the number of OTF inactivation steps is typically largest when N=K, i.e., when trying to solve the variables using zero overhead. On the other hand, as N grows larger than K, it is typically the case that the complexity of OTF inactivation decoding decreases due to fewer OTF inactivation steps, until when N is large enough so there are in some cases no OTF inactivation steps and inactivation decoding is as, or nearly as, computationally efficient as belief propagation decoding. In other embodiments of OTF inactivation decoding, the number of OTF inactivations may remain large even when N is considerably larger than K.

In one preferred embodiment of permanent inactivation decoding, the number P of permanently inactivated variables and the structure of the linear equations is designed so that when solving for the L−P variables that are not permanently inactivated using OTF inactivation decoding from K+R values of linear equations, the number of OTF inactivation steps during OTF inactivation decoding is small and in some cases zero, and thus the OTF inactivation decoding step is nearly as computationally efficient as belief propagation.

In preferred embodiments, the structure of the linear equations is designed such that the OTF inactivation decoding phase is nearly as efficient as belief propagation decoding. In such preferred embodiments, the relationships of the permanently inactivated variables to the linear equations is such that the phase of solving for the inactivated variables, comprised of the permanently inactivate variables together with any OTF inactivated variables from the OTF inactivation decoding phase, can be performed efficiently. Furthermore, in preferred embodiments the structure of the permanently inactivated symbols is such that the phase of completing the solution of the variables that are not inactivated from the solved inactivated variables is computationally efficient.

Decoding of Chain Reaction Codes with Permanent Inactivation

Figure 12:
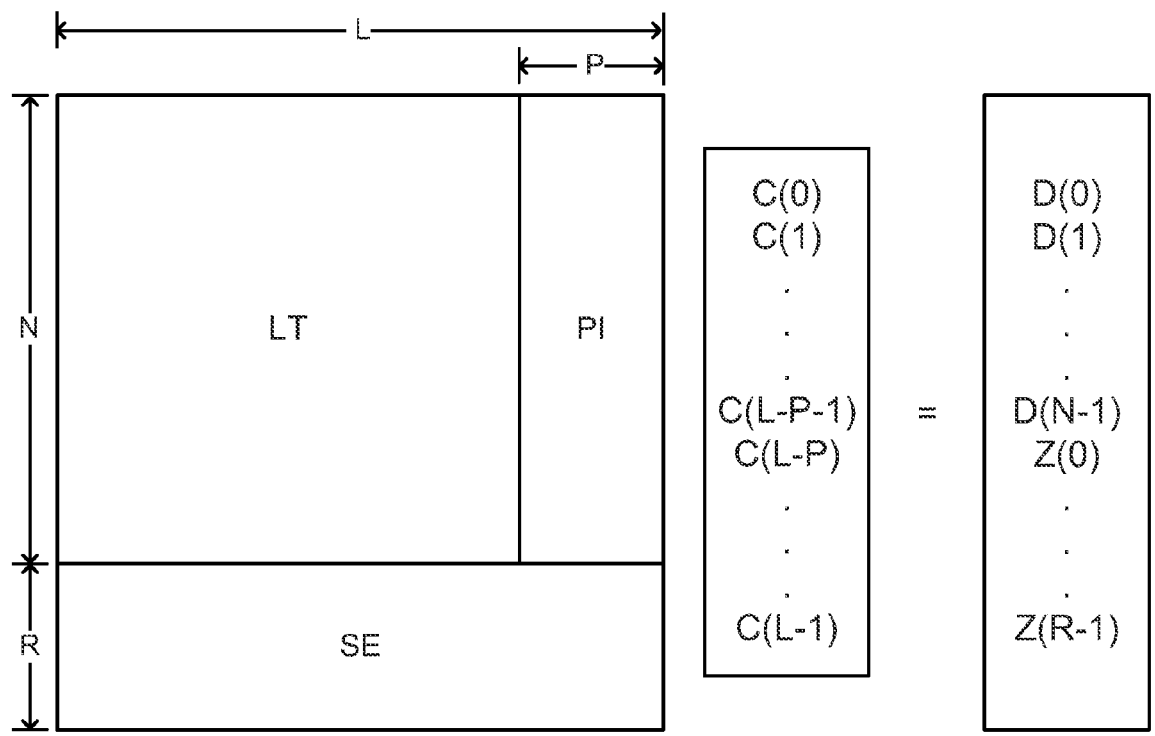
FIG. 12 illustrates a matrix representation of a set of equations to be solved by a decoder to recover an array, C( ) representing recovered source symbols from an array, D( ), representing received encoded symbols, using a submatrix SE representing R static symbols or equations known by the decoder.

FIG. 12 illustrates a matrix representation of a set of variables to be solved using N received encoded symbols or equations and R known static symbols or equations by the decoder. The task of the decoder is to solve the system of linear equations given in this figure. Typically, the symbols/equations are represented by values stored in memory or storage accessible by the decoder and the matrix operations described below are implemented by instructions executable by the decoder.

The matrix shown in FIG. 12 comprises L=K+R columns and N+R rows. The LT submatrix represents the relationships between the N encoded symbols and the L−P LT symbols of the L intermediate symbols determined by LT encoding process 251. The PI submatrix represents the relationships between the N encoded symbols and the P PI symbols of the L intermediate symbols determined by PI encoding process 241. The matrix SE of Equation 1 represents the relations among the intermediate symbols determined by the static encoder 210. The decoder can determine these relationships based on the keys for received encoded symbols and from the code construction.

Figure 13:
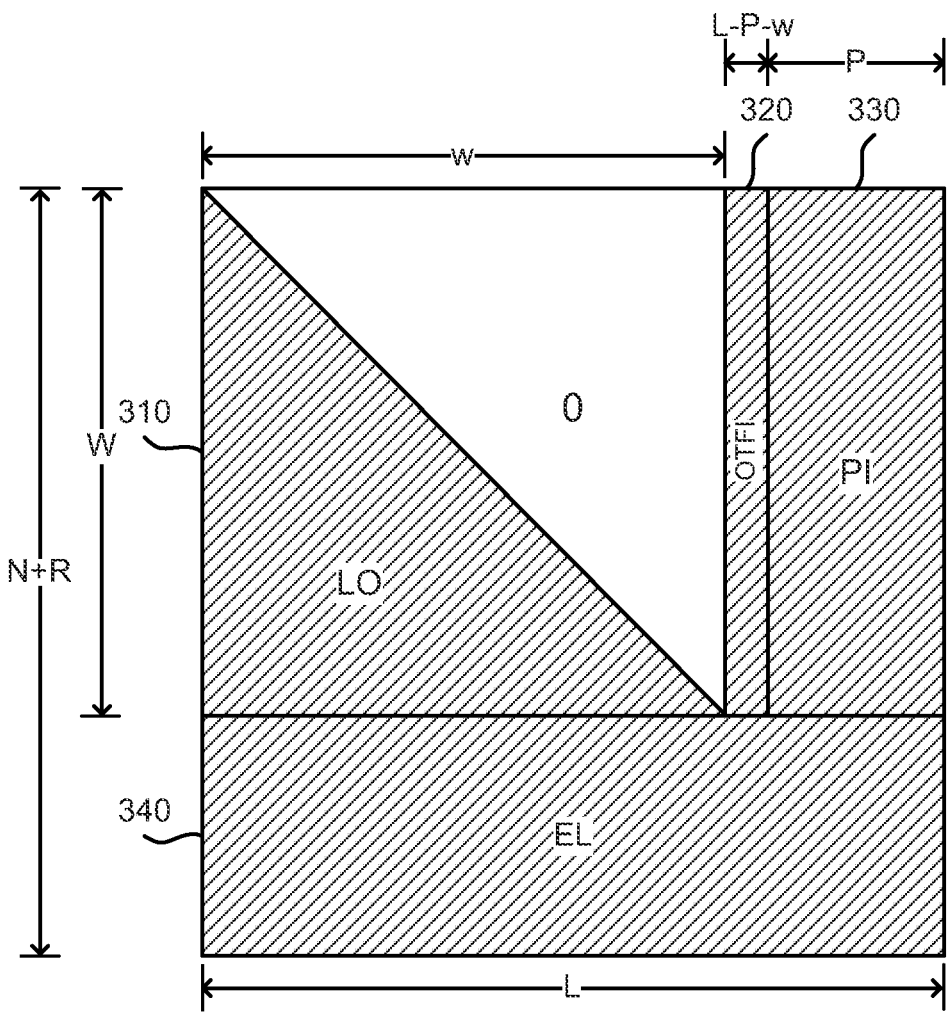
FIG. 13 illustrates a matrix resulting from row/column permutations of the matrix of FIG. 12, using OTF inactivation.

The system of linear equations of FIG. 12 is solved by row/column permutations of the above matrix using the OTF inactivation methods taught in Shokrollahi II to transform it into a form shown in FIG. 13. It comprises a lower triangular matrix LO 310, a number of columns comprising matrix 320 (called OTFI) corresponding to OTF inactivations, a matrix 330 PI corresponding to the set of permanently inactive intermediate symbols or a subset thereof, and a matrix 340 EL corresponding to encoded or static symbols not used in the triangularization process leading to matrix LO.

Figure 14:
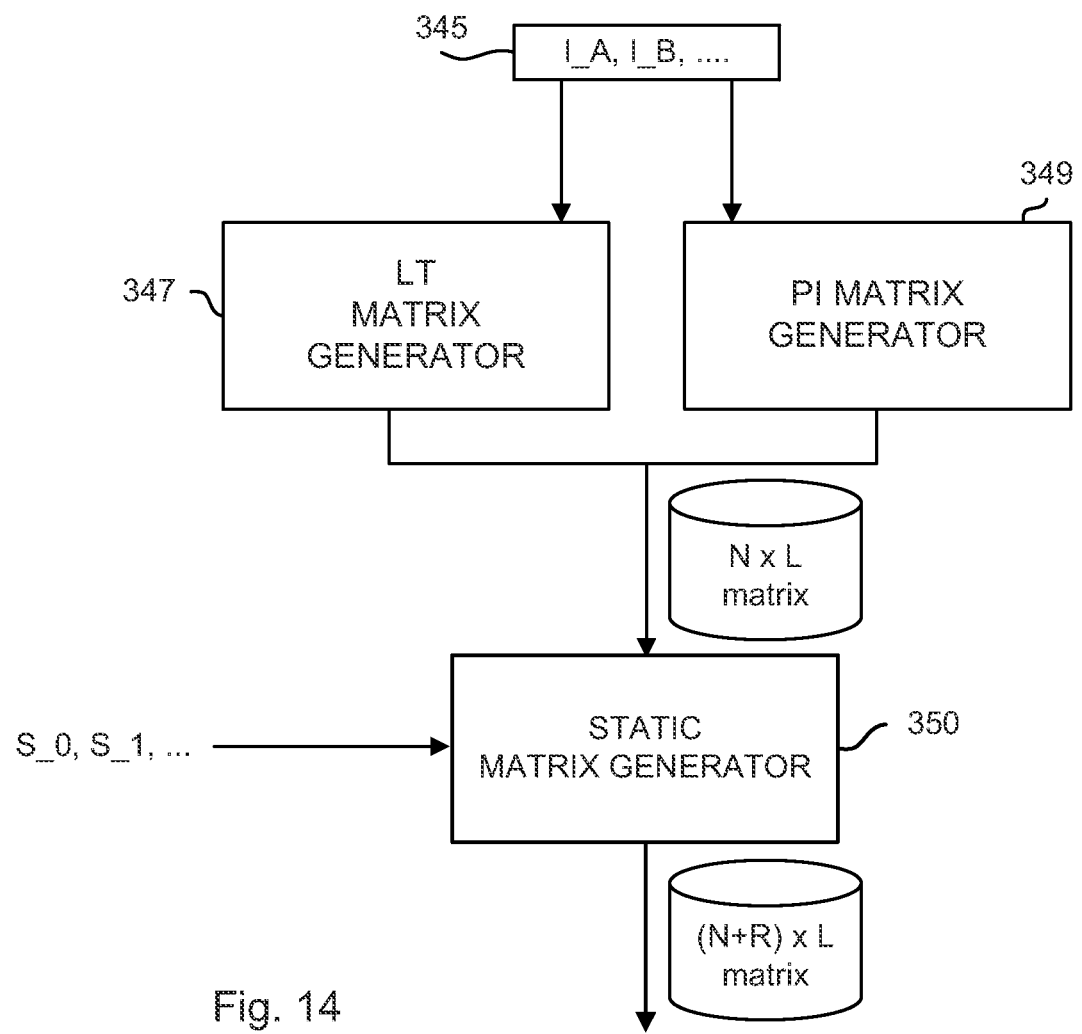
FIG. 14 is a block diagram describing a process for generating the matrix in FIG. 12.

FIG. 14 is a block diagram describing elements that might perform a process leading to the matrix in FIG. 12. It comprises an LT matrix generator 347, a PI matrix generator 349, and a static matrix generator 350. Upon receipt of keys $I_a$, $I_b$, . . . LT matrix generator creates the matrix LT in FIG. 12, whereas PI matrix generator 349 creates the matrix PI of FIG. 12. The concatenation of these two matrices is forwarded to static matrix generator 350, which may take as additional hints static keys S_0, S_1 , . . . . The task of static matrix generator is the creation of matrix SE, and its output is the full matrix given in FIG. 12.

Figure 15:
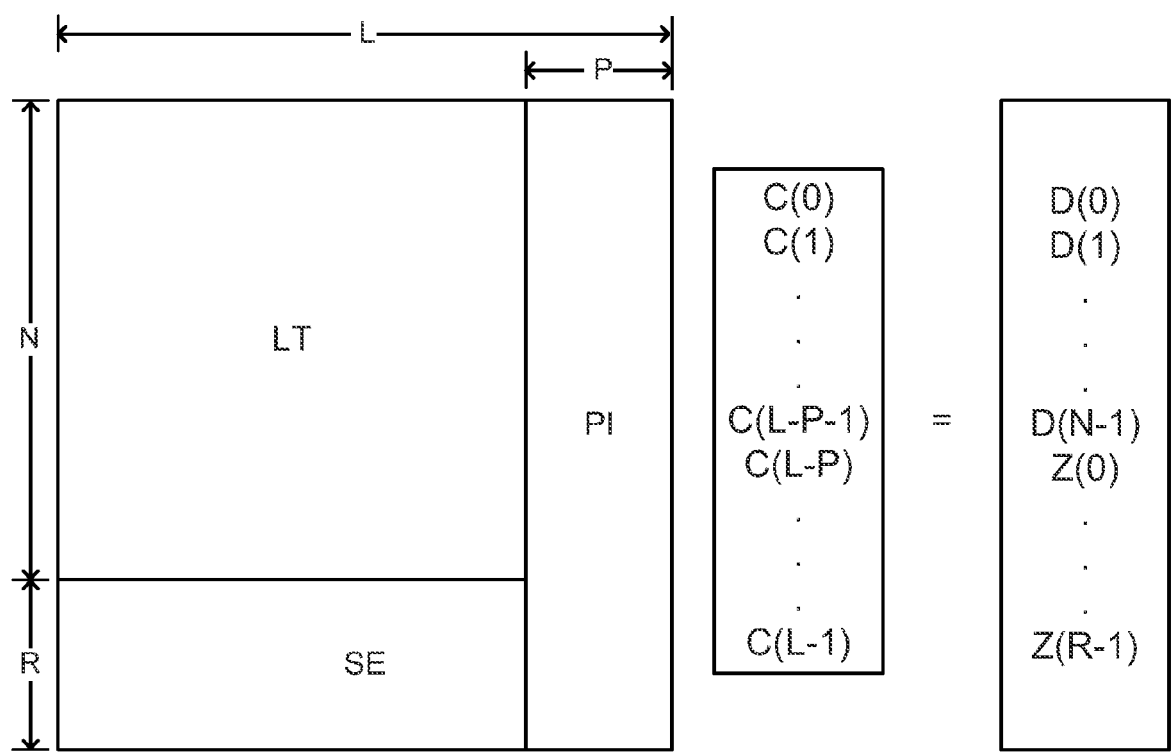
FIG. 15 illustrates a matrix representation of a set of equations to be solved by a decoder to recover an array, C( ) representing recovered source symbols from an array, D( ), representing received encoded symbols, using a submatrix SE and a submatrix corresponding to permanently inactivated symbols.

The operations of LT matrix generator 347 and PI matrix generator 349 are tightly coupled with the operations of LT encoder 250 and PI encoder 240 in FIG. 15, respectively. Operation of static matrix generator 350 is the re-creation of matrix SE of Equation 1 used for static encoding.

LT matrix generator 347, PI matrix generator 349, and static matrix generator will now be described in further detail with reference to operations they might perform.

FIG. 16 is a flowchart illustrating one embodiment 500 of a method employed by LT matrix generator 347. In step 505, LT matrix generator 347 initializes a matrix LT of format N×(L–P) to all zeros. Next, in step 510, the keys $I_a$, $I_b$, . . . are used to generate the weights WL(0), . . . , WL(N–1), and the lists AL(0), . . . , AL(N–1), respectively. Each of the lists AL(i) comprises WL(i) integers (j(0), . . . , j(WL(i)–1)) in the range 0, . . . , L–P–1. In step 515, these integers are used to set entries LT(i,j(0)), . . . , LT(i,j(WL(i)–1)) to 1. As explained above, matrix LT contributes to a system of equations for the unknowns (C(0), . . . , C(L–1)) in terms of the received symbols (D(0), . . . , D(N–1)).

As can be appreciated by those skilled in the art, the operation of LT matrix generator as described here is similar to the operation of LT encoding process 251 of FIG. 6.

FIG. 17 is a flowchart illustrating one embodiment 600 of a method employed by PI matrix generator 349. In step 610, PI matrix generator 349 initializes a matrix PI of format N×P to all zeros. Next, in step 615, the keys $I_a$, $I_b$, . . . are used to generate weights WP(0), . . . , WP(N–1), and the lists ALP(0), . . . , ALP(N–1), respectively. Each of the lists ALP(i) comprises WP(i) integers (j(0), . . . , j(WP(i)–1)) in the range 0, . . . , P–1. In step 620, these integers are used to set entries PI(i,j(0)), . . . , PI(i,j(WP(i)–1)) to 1. The operation of PI matrix generator is similar to the operation of PI encoding process 241 in FIG. 5.

As explained above, the matrices LT and PI contribute to a system of equations in the unknowns (C(0), . . . , C(L–1)) in terms of the received symbols (D(0), . . . , D(N–1)). The reason is the following: once the LT encoder chooses weight WL(i) and associate list AL(i)=(j(0), . . . , j(WL(i)–1)), and PI encoder chooses weight WP(i) and associate list ALP(i)=(t(0), . . . , t(WP(i)–1)), the corresponding encoded symbol D(i) is obtained as shown below. These equations, accumulated for all values of i between 0 and N–1, give rise to the desired system of equations represented in Equation 2.

$$D(i)=C(j(0))\oplus \ldots \oplus C(j(WL(i)-1))\oplus \\ C(t(0))\oplus \ldots \oplus C(t(WP(i)-1))$$ (Equ. 2)

The weights WL can be calculated using a procedure similar to the one given in FIG. 7. A person of ordinary skill in the art, upon reviewing this disclosure, would see how to extend this to the case where there are more than two encoders, each operating with a different degree distribution.

Figure 18:
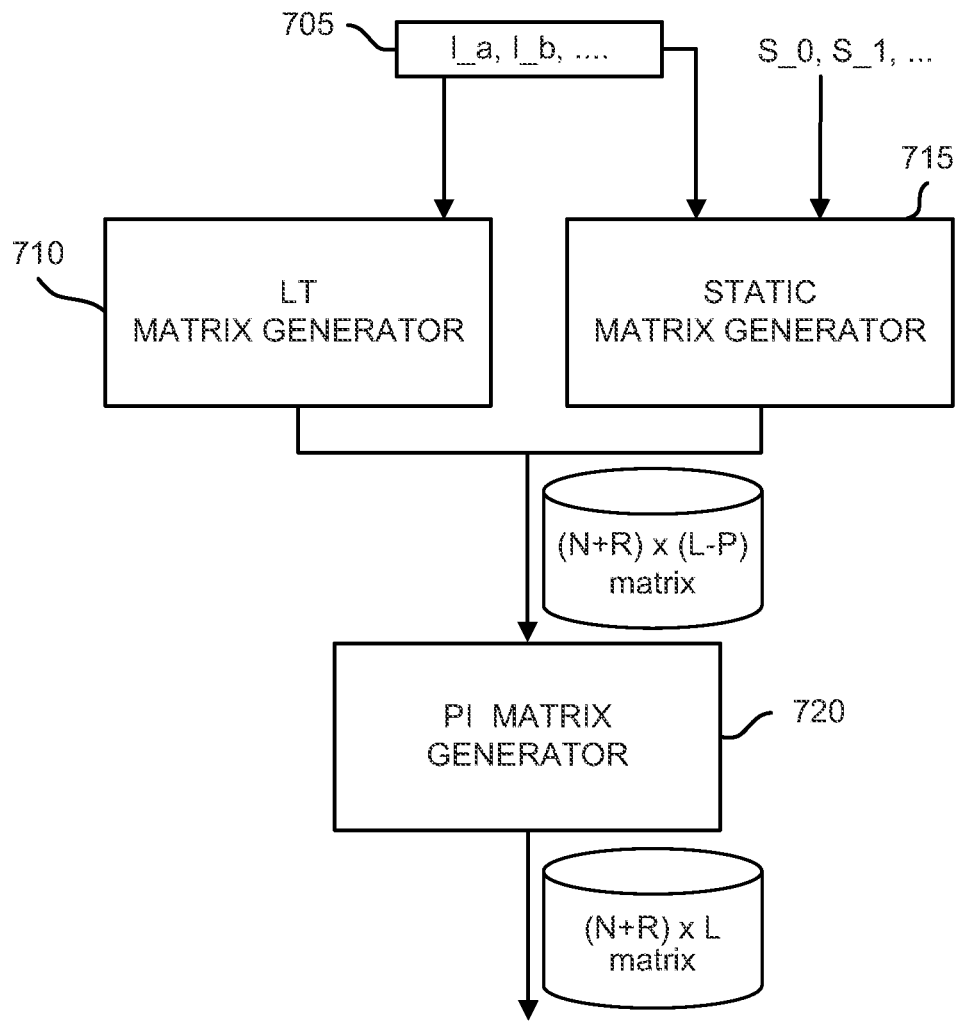
FIG. 18 is a block diagram of a matrix generator.
Figure 19:
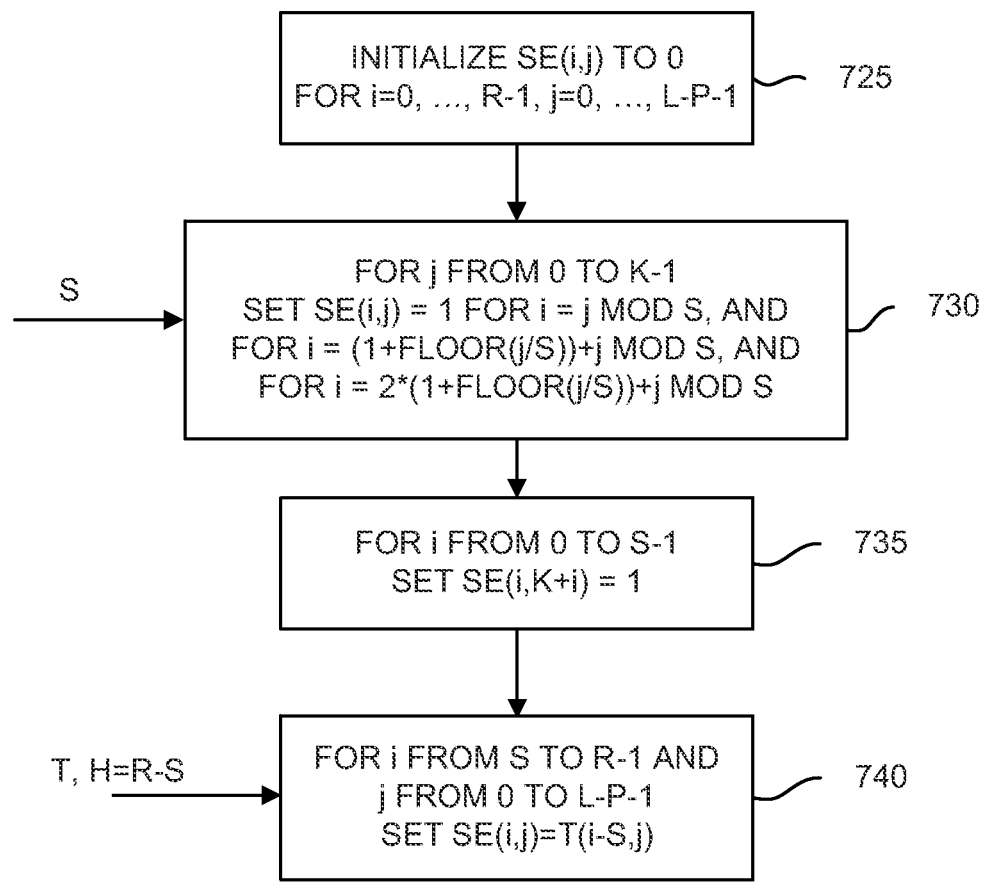
FIG. 19 is a flowchart illustrating a process for generating an SE submatrix.

A slightly different flow diagram of a matrix generator is provided in FIG. 18. It comprises an LT matrix generator 710, a static matrix generator 715, and a PI matrix generator 720. Upon receipt of keys $I_a$, $I_b$, . . . , LT matrix generator 710 creates the matrix LT illustrated in FIG. 15, whereas static matrix generator 715 creates the matrix SE illustrated in FIG. 15, and may take the additional static keys S_0, S_1, . . . as its further input. The concatenation of these two matrices is forwarded to PI matrix generator 720 that creates the matrix PI. Operation of LT matrix generator 710 may be exactly the same as the operation of LT matrix generator 347 detailed in FIG. 16. The operation of static matrix generator 715 may be different from the operation of the static matrix generator 350 in FIG. 14. Specifically, FIG. 19 details an exemplary embodiment of such an operation.

In step 725, the matrix SE is initialized to 0. In step 730, an input variable S, equal to the number of LDPC symbols, is provided to the process, and the values of SE(i,j) are set to 1 for pairs (i,j) when i=j mod S, i=(1+floor(j/S))+j mod S, or i=2*(1+floor(j/S))+j mod S. In step 735, the positions corresponding the identity matrix IS in FIG. 9 are set to one. In step 740, the positions corresponding to a matrix T are provided as an additional input to this step. This matrix may have entries in multiple finite fields, and can be different for different applications. It may be chosen based on requirements demanded of the code.

Figure 20:
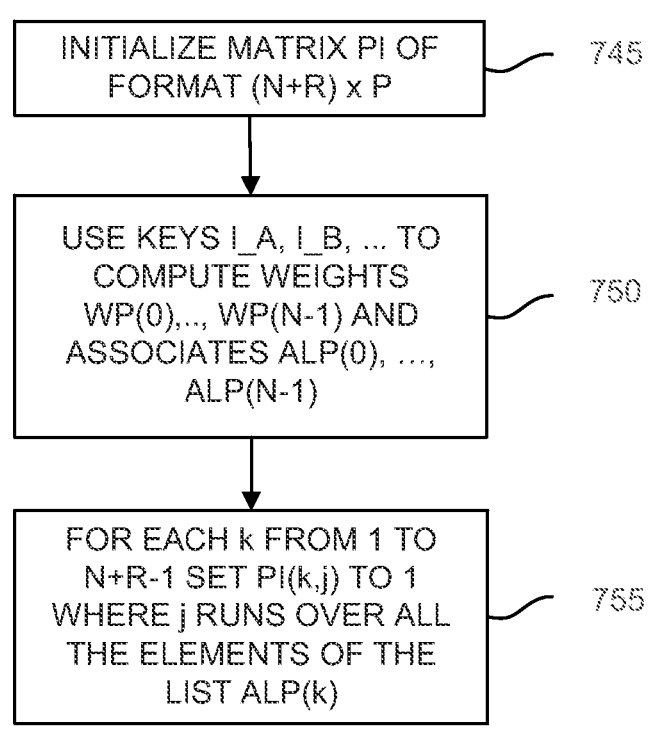
FIG. 20 is a flowchart illustrating a process for generating a PI submatrix.

FIG. 20 is a simplified flow diagram illustrating one embodiment of a method employed by PI matrix generator 720. In step 745, PI matrix generator 349 initializes a matrix PI of format (N+R)×P to all zeros. Next, in step 750, the keys I_a, I_b, . . . are used to generate weights WP(0), . . . , WP(N–1), and the lists ALP(0), . . . , ALP(N–1), respectively. Each of the lists ALP(i) comprises WP(i) integers (j(0), . . . , j(WP(i)–1)) in the range 0, . . . , P–1. In step 755, these integers are used to set entries PI(i,j(0)), . . . , PI(i,j(WP(i)–1)) to 1. The operation of PI matrix generator in FIG. 20 is similar to the operation of the PI matrix generator of FIG. 17 with the exception that this matrix generator creates a matrix with R more rows and is tightly coupled with the matrix in FIG. 15.

The system of equations in FIG. 12 or in FIG. 15 is typically sparse, i.e., the number of nonzero entries in the matrices involved is typically much smaller than half the possible entries. In such a case, the matrices might need not be stored directly, but an indication may be stored that helps in recreating every individual entry of these matrices. For example, for every one of the rows of the matrices LT or PI, a process may want to store the weight and the list of neighbors as computed in FIGS. 5-6. Other methods are also possible and many of them have been explained herein or in disclosures incorporated by reference herein.

Once the matrix generator has created a system of equations in the form given by FIG. 12 or FIG. 15, the task of the decoder is to solve this system for the unknown values of C(0), . . . , C(L–1). A number of different methods can be applied to achieve this goal, including but not limited to Gaussian elimination, or any of the methods described in Luby I, Luby II, Shokrollahi I, II, III, IV, or V.

Figure 21:
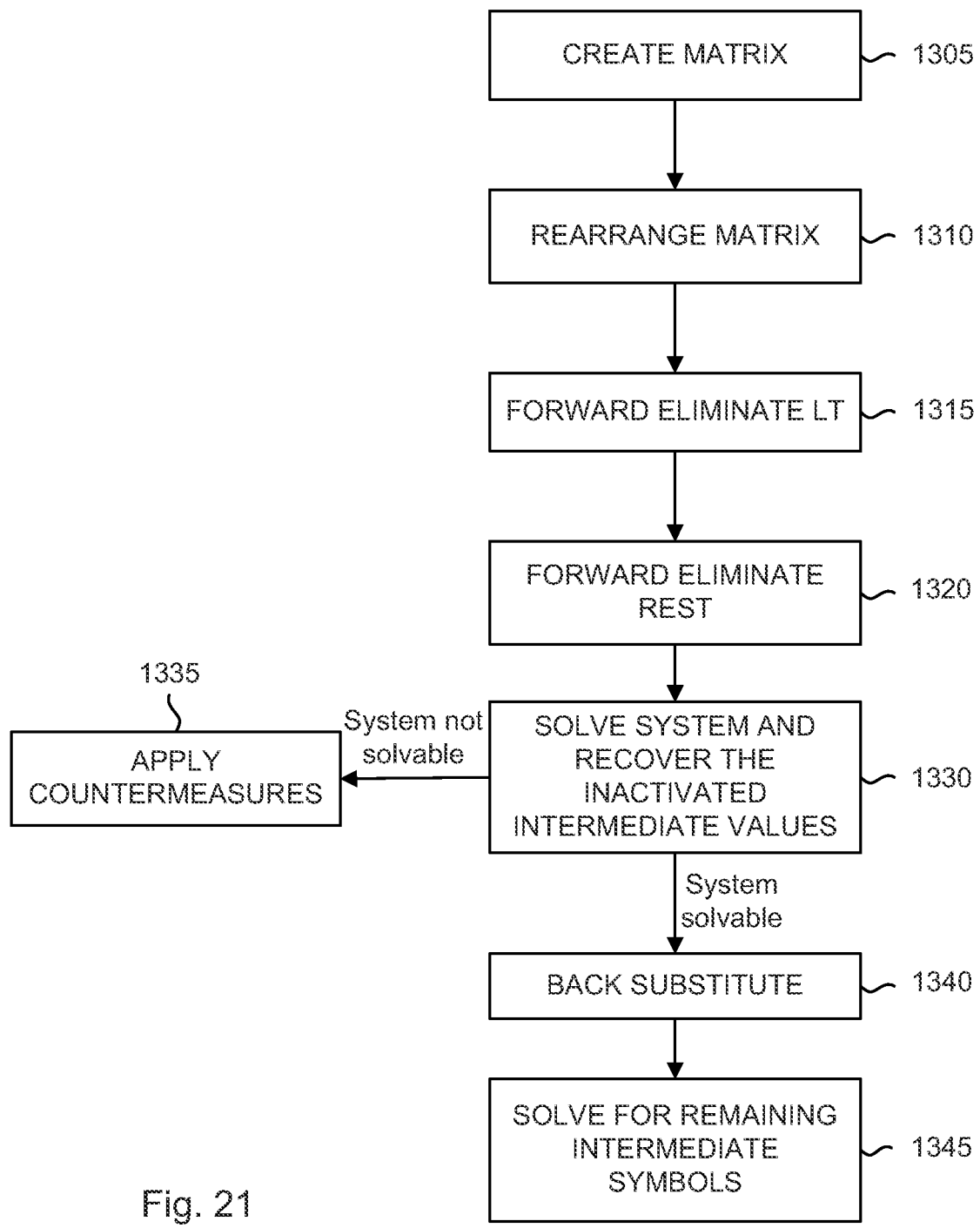
FIG. 21 is a flowchart illustrating a process for solving for recovered symbols in a decoder.
Figure 22:
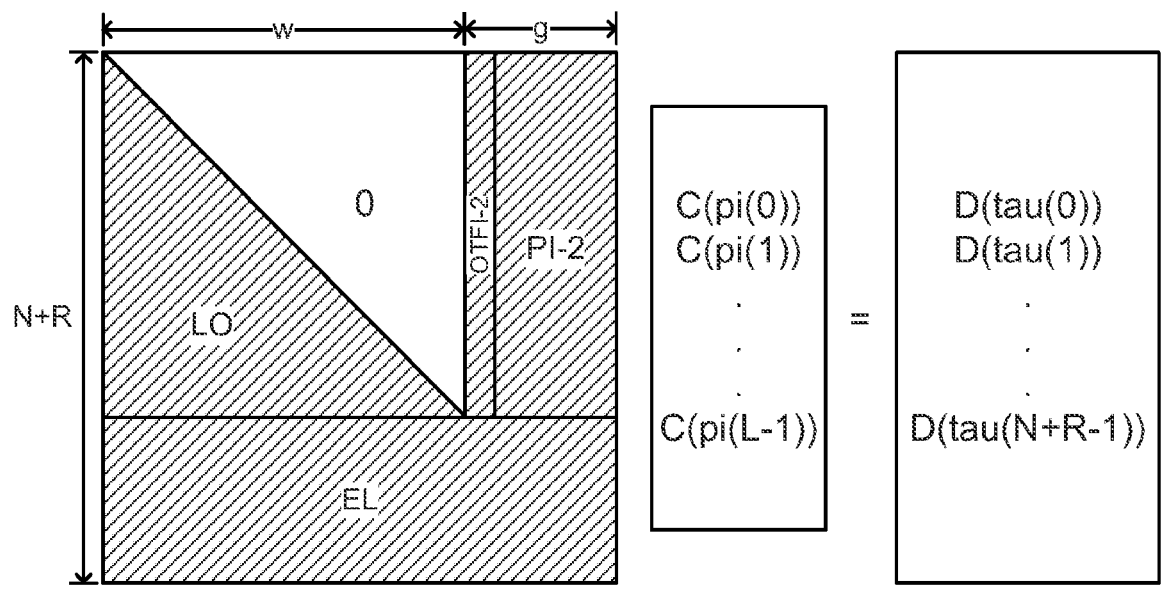
FIG. 22 illustrates a matrix representation of a set of equations to be solved by a decoder to recover an array, C( ) representing recovered source symbols from an array, D( ), representing received encoded symbols, after permutations.

A possible method for solving the system of equations in FIG. 12 or FIG. 15 is now outlined with reference to FIGS. 21-26. A flow chart of an operation of the decoder according to some of the embodiments of the present invention is given in FIG. 21. In step 1305, the decoding matrix is created using some of the methods described earlier. In step 1310, this matrix is rearranged using row and column permutations. As was mentioned above, such a matrix may be obtained from either of the matrices in FIG. 12 or FIG. 15 by applying row and column permutations. Chain reaction decoding in combination with on-the-fly inactivation decoding of Shokrollahi II can be used to achieve this. There are thus permutations pi operating on the set $\{0, 1, \ldots, L-1\}$ and tau operating on the set $\{0, 1, \ldots, N+R-1\}$ such that the equation in FIG. 22 is satisfied.

Herein, w denotes the number of rows and columns of matrix LO in FIG. 13, i.e., the number of intermediate symbols that are neither permanently, nor OTF inactivated. In step 1315, the matrix LO of FIG. 13 is used to zero out all entries of matrix LO below the diagonal. In doing so, the set of symbols on the right of the equation in FIG. 23 needs to respect the same operations, so that the new right hand side of the system of equations is obtained by XORs of some of the D(tau(i)).

Figure 24:
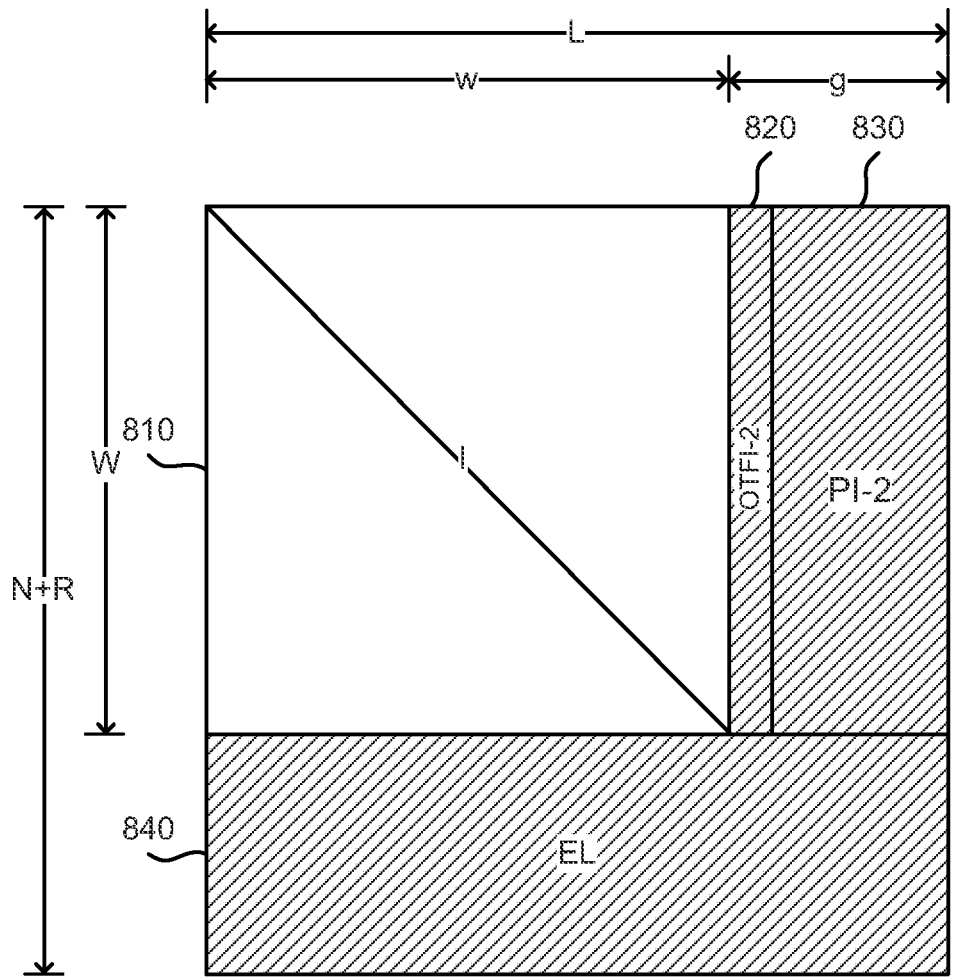
FIG. 24 illustrates a matrix representation usable as part of a decoding process.

As illustrated in FIG. 24, after this operation, matrix 810 becomes an identity matrix, matrix EL in 840 will be untouched, and matrices OTFI and PI will be changed to OTFI-2 in 820 and PI-2 in 830, because the decoding process needs to XOR rows of these matrices together according to the operations that were necessary to reduce matrix LO to the identity matrix.

Figure 25:
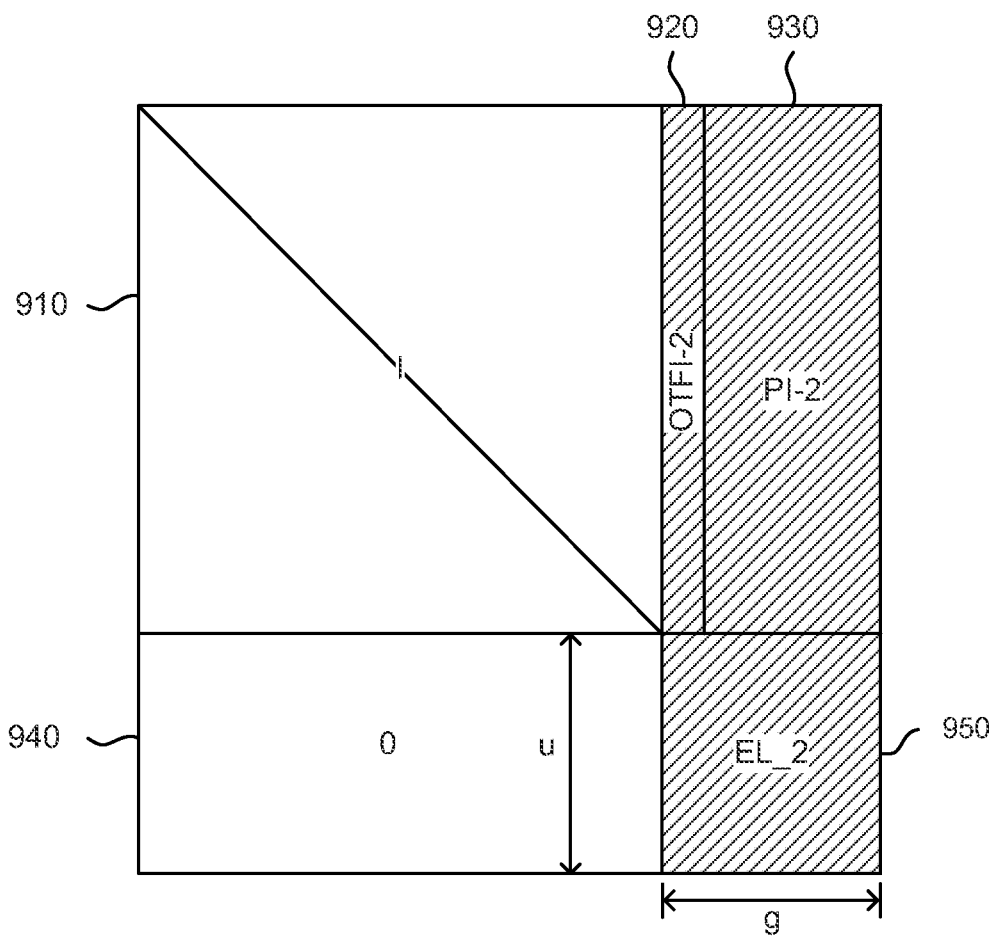
FIG. 25 illustrates a matrix representation usable as another part of a decoding process.

A next step of the decoding process may be step 1320, in which the rest of the remaining matrix below LO is eliminated to obtain a matrix of the form indicated in FIG. 25. Denoting the permuted and reduced values of the original symbols $D(0), \ldots, D(N\_R-1)$ after this step by $E(0), \ldots, E(N+R-1)$, by u the number of rows of the matrix EL_2, and by g the number of columns of EL_2, the structure of the matrix in FIG. 25 results in a smaller system of u linear equations for the values of $C(pi(L-g)), \ldots, C(pi(L-1))$ according to Equation 3.

$$(EL\_2) \cdot \begin{pmatrix} C(pi(L-g)) \\ \vdots \\ C(pi(L-1)) \end{pmatrix} = \begin{pmatrix} E(N+R-u) \\ \vdots \\ E(N+R-1) \end{pmatrix}. \quad \text{Equ. 3}$$

A decoding process such as the one described in FIG. 21 may solve this system of equations in step 1330 by a variety of means, for example by using a Gaussian elimination process, or a combination of chain reaction coding and Gaussian elimination, or by another application of inactivation decoding, or by other means. The Gaussian elimination can be modified so as to separate computations in GF(2) from those in larger fields, such as GF(256), if the matrix EL has elements belonging to multiple fields, as was taught in Shokrollahi IV, for example.

If the system of equations in Equation 3 is not solvable using the processes employed by the decoder, then the decoder may apply countermeasures in step 1335. Such countermeasures could include flagging an error and stopping the process, or it could include requesting more encoded symbols, or it could stop the process and give back to the application using the decoder a list of intermediate symbols or source symbols that it has been able to recover so far. If the system is solvable, then the decoder may recover the values of inactivated intermediate symbols $C(pi(L-g)), \ldots, C(pi(L-1))$. In some variants, it may be as well that some other intermediate symbols besides the inactivated intermediate symbols are recovered in step 1330.

Figure 26:
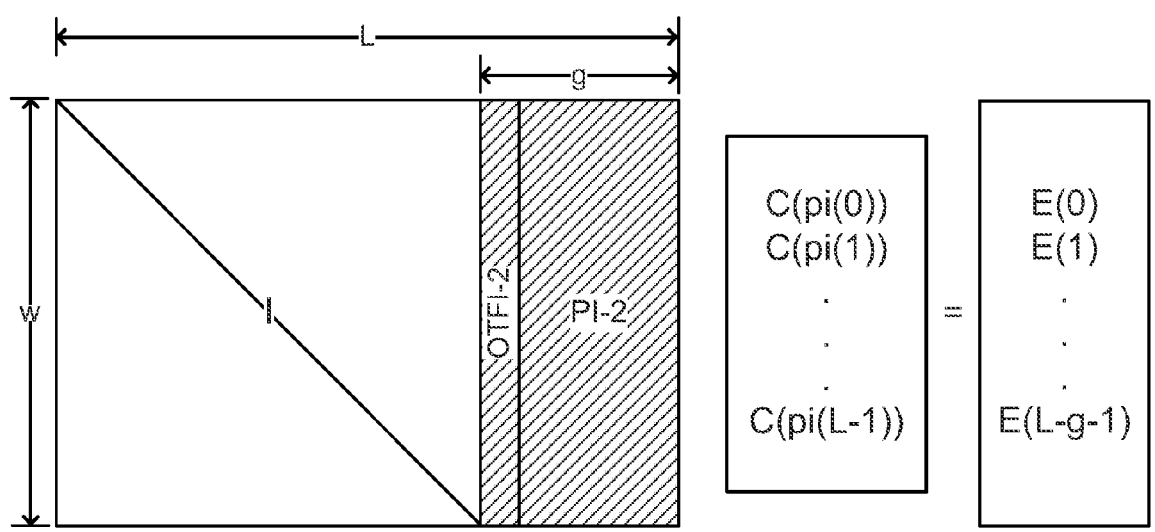
FIG. 26 illustrates a matrix representation of a set of equations to be solved by a decoder after partial solution.

Once the values of these symbols are recovered, the decoder proceeds to step 1340 that involves a back substitution. Recovering the values of $C(pi(L-g)), \ldots, C(pi(L-1))$ results in a system of equations of the type given in FIG. 26. This system is easier to solve than a general system. For example, a decoder may use the process indicated in FIG. 23 to do so. The process of obtaining the first vector on the right hand side of FIG. 23 may be referred to as back-substitution, as it is the process of substituting the values of the known symbols into the system of equations. As can be seen by a person of ordinary skill in the art after reading this disclosure, the systems given in FIGS. 23 and 26 are mathematically equivalent.

Figure 23:
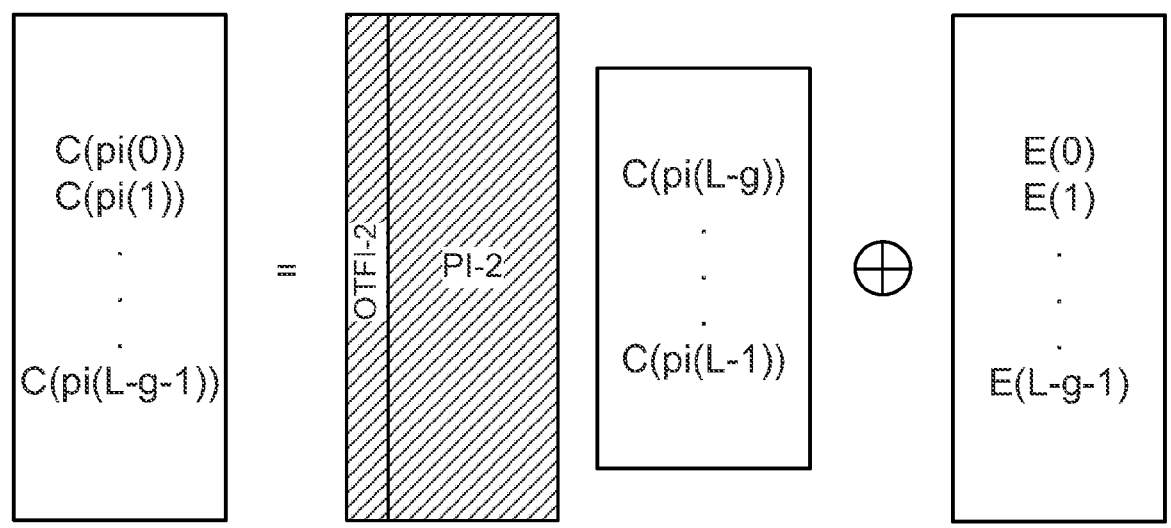
FIG. 23 illustrates a matrix representation of a set of equations to be solved by a decoder and corresponding to the matrix shown in FIG. 26.

In FIG. 23, the decoder obtains the unknown values $C(pi(0)), \ldots, C(pi(L-g-1))$ by implementing a process in which the entries of the matrix on the right hand side are multiplied with the entries of the already solved for vector $C(pi(L-g)), \ldots, C(pi(L-1))$ using the rules of matrix multiplication, and XORing the obtained entries with $E(0), \ldots, E(L-g-1)$. The process of XORing the obtained entries with $E(0), \ldots, E(L-g-1)$ and thus recovering the values of $C(pi(0)), \ldots, C(pi(L-g-1))$ comprises step 1345 of the decoder in FIG. 21.

Though useful in some applications, this method may lead to a large computational overhead in some preferred embodiments, since the matrix on the right hand side of FIG. 23 is typically not sparse and therefore, to obtain one of the elements C(pi(j)) a number of XORs has to be performed which is proportional to g. In some embodiments, this number may be large, for example because the number P of permanent inactivations was chosen to be large to begin with, and g may be at least as large as P. This can put severe limitations on the value of P, the number of permanently inactivated symbols, and if a smaller value of P is used, then this could lead to an increase in the number of OTF inactivated intermediate symbols.

Figure 27:
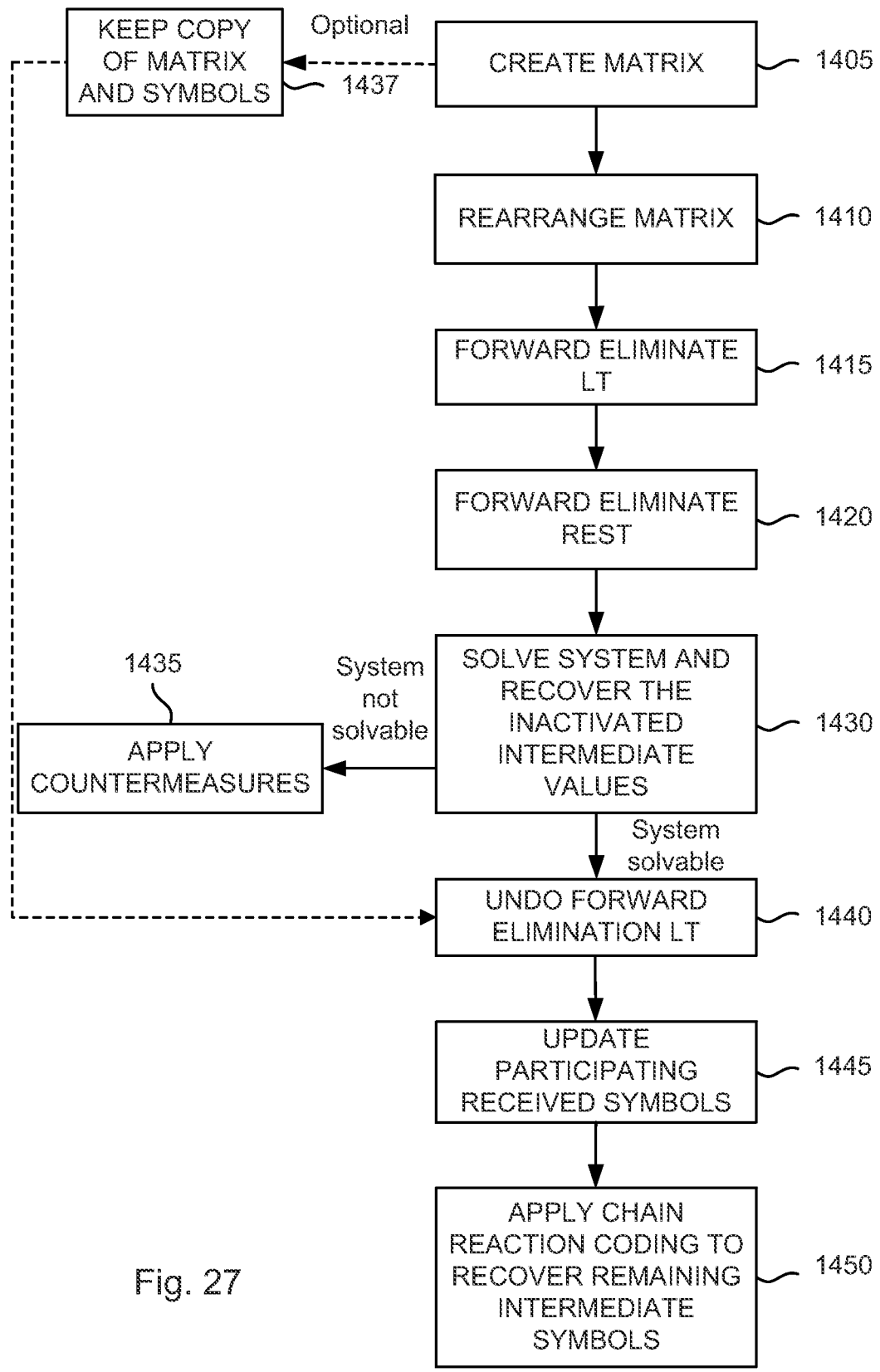
FIG. 27 is a flowchart illustrating another process for solving for recovered symbols in a decoder.
Figure 28:
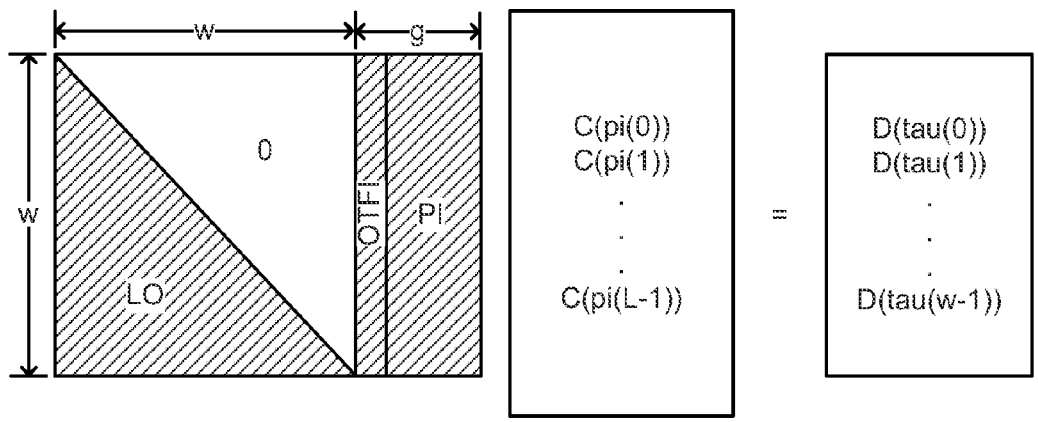
FIG. 28 illustrates a matrix representation of a set of equations to be solved by a decoder.

FIG. 27 describes a modified decoding process that may be computationally more efficient than the process described in FIG. 21. Steps 1405 through 1435 of this process may be the same as the corresponding steps of the process in FIG. 14. Optionally, this process may keep a copy of the original matrix in FIG. 12 or FIG. 15, or relevant parts of this matrix, as well as the original symbols $D(0), \ldots, D(N+R-1)$ in an additional memory location for future use. This is not necessary for the working of this process, but it may lead to further speed advantages if the application has enough memory resources to keep these copies. Alternatively, the process may only keep a copy of the original symbols $D(0), \ldots, D(N+R-1)$ and not the matrix, and re-create the matrix when it needs it. Step 1440 either uses the stored copy of the matrix or undoes the process in step 1415 to obtain back the original system of equations in FIG. 22, or only the top part of this system given in FIG. 28. At this point, the matrix 1510 given in FIG. 29 is sparse, and the values $C(pi(w)), \ldots, C(pi(L-1))$ are known, where w=L−g.

Figure 29:
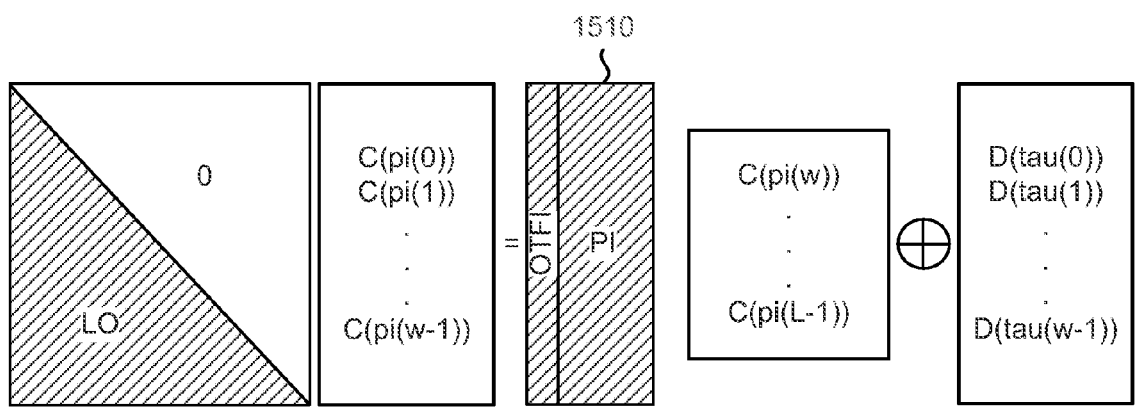
FIG. 29 illustrates a matrix representation of a set of equations to be solved by a decoder.

As is well known, the right hand side of the equation in FIG. 29 can be computed via a computationally efficient process involving a small number of XORs of symbols, i.e., equal to the number of non-zero entries in the matrix OTFI plus the number of non-zero entries in the matrix PI. This step of the process is denoted by 1445 in FIG. 27. After this step is complete, the right hand side of the equation in FIG. 29 has been computed, and a system of equations is to be solved in which the unknowns are the values of $C(pi(0)), \ldots, C(pi(w-1))$. This system can be solved in step 1450 using chain reaction decoding, since the lower triangular LO on the right hand side is sparse, i.e., the number of XORs of symbols to solve this system of equations is equal to the number of non-zero entries in the matrix LO and this number is typically much smaller than w*w, the maximum number of non-zero entries possible.

Choice of the Number of Permanent Inactivations

The choice of the number of permanent inactivations can affect overall performance, so it can be important. On the one hand, this number needs to be chosen to be as large as possible: if this number is large, then the number of OTF inactivations may be reduced to a very small number, sometimes even zero. This is because the combination of the LT and the SE matrix in FIG. 15 (or their corresponding variants in FIG. 23) is effectively the decoding matrix of a chain reaction code with a large overhead. This fact makes the number of OTF inactivations very small. OTF inactivations may be harder to manage in certain embodiments, hence reducing their number may lead to advantages in terms of speed and/or memory.

On the other hand, increasing the number of permanent inactivations may have an adverse effect on the running time: for example, step 1330 in the decoding process of FIG. 21, and the corresponding step 1430 in the process of FIG. 27 require solving a system of equations that has at least P rows and columns. One way to do this would be to identify an invertible submatrix of the matrix EL−2 in FIG. 25, invert that matrix, and use the inverted matrix to obtain the values of the intermediate symbols $C(pi(L-g-1)), \ldots, C(pi(L-1))$. Since the matrix EL−2 may not be sparse in many of the embodiments, obtaining the values of the intermediate symbols may incur on the order of g times g XORs of symbols. Since g is at least P, the number of XORs of symbols maybe at least P times P, so if the overall number of XORs of symbols is to be kept linear in K, a good choice is to set the number P to be proportional to the square root of K. The specific embodiment of Appendix A chooses P to be of the order of $2.5*sqrt(K)$, and keeps in line with this observation. This is a good choice for P, as with this choice of P, typically the number of OTF inactivations is fairly small, varying from around P to very close to or equal to zero.

Another quantity of interest is the average number, I, of inactivated intermediate symbol neighbors there are for an encoded symbol, or for a static symbol. Step 1445 of the decoding process in FIG. 27 may need as many as I XORs of symbols on average per unrecovered intermediate symbols to accomplish this step. If I is large, then this number of XORs may be too many for the memory and computational resources of the processes executing the decoding or the encoding process. On the other hand, if I is too small, then the matrix EL−2 of FIG. 25 may not have full rank, and decodability may be jeopardized.

A more detailed analysis reveals that an important aspect of permanent inactivation is to make the matrix PI of FIG. 15 behave in such a way that the columns are linearly independent of one another, i.e., the matrix is full rank as much as is possible. It is well-known to those of skill in the art that if PI is a random binary matrix, then full rank to the limits possible may be achieved. On the other hand, PI may have on average in each column a fraction of ones that is inversely proportional to the square root of K and still satisfy the same rank properties as that of a purely random matrix. For this reason, the specific embodiment in Appendix A chooses I to be a number between 2 and 3, and thus with the choice of P proportional to the square root of K, this means that the number of ones in each column of PI is on average inversely proportional to square root of K.

There are many variants of these methods, as one skilled in the art will recognize upon reading this disclosure. For example, XOR may be replaced with other operators, e.g., linear operators over larger finite fields, or the operators may be a mixture of different operators, e.g., some linear operators over larger finite fields for some of the operations and other linear operators over smaller larger finite fields for others of the operations.

Specific Example with Reference to Appendix A

As detailed above, without permanent inactivations (i.e., predetermined decisions as to which encoded symbols would not be part of a matrix manipulation that would be part of determining a sequence for a chain reaction decoding), the number of OTF inactivations might be quite random and cause potential problems in terms of memory consumption. Where the number of source symbols is very large and the overhead is very small, the error probability can be unacceptably close to 1.

Because of the high error probability for small overheads, it can become increasingly difficult to find good systematic information when the number of source symbols is large. Herein, systematic information refers to information needed to provide to the encoder and decoder in order to be able to construct a systematic code in the sense of Shokrollahi III. Moreover, whenever systematic information is obtained, it is to be expected that the behavior of the code is very far from its average behavior, because on "average" the code should fail at zero overhead.

Some of the parameters for the construction of a chain reaction code with permanent inactivation may include the degree distribution Ω used for the LT encoder 250 of FIG. 4, the parameters for the PI encoder 240, the determination of the number of permanently inactivated symbol, the determination of the number of redundant static symbols and their structure, and the particular way random numbers may be generated and shared between encoder 115 and decoder 155 in FIG. 1.

Encoders and Decoders that Use the RQ Code

A preferred embodiment of a code, hereafter referred to as "the RQ code", that uses the methods described herein is specified in great detail in Section 5 of Appendix A. The remainder of Appendix A describes one method of applying the RQ code to the reliable delivery of objects over broadcast or multicast networks.

The RQ code uses the methods described previously and below to implement a systematic code, meaning that all the source symbols are among the encoded symbols that can be generated, and thus encoded symbols can be considered to be a combination of the original source symbols and repair symbols generated by the encoder.

Although some of the previous codes have good properties, there are some improvements that would increase their practical application. Two potential improvements of importance are a steeper overhead-failure curve and a larger number of supported source symbols per source block. The overhead is the difference between the number of encoded symbols received and the number of source symbols in the source block, e.g., an overhead of 2 means that K+2 encoded symbols are received to decode a source block with K source symbols. The failure probability at a given overhead is the probability that the decoder fails to completely recover the source block when the number of received encoded symbols corresponds to that overhead. The overhead-failure curve is a plot of how the failure probability drops as a function of increasing overhead, starting at overhead zero. An overhead-failure curve is better if the failure probability of the decoder drops off fast, or steeply, as a function of overhead.

A random binary code has an overhead-failure probability curve where the failure probability drops by essentially a factor of two for each additonal overhead symbol, with unworkable computational complexity, but the subject of the current discussion is limited to the overhead-failure probability curve, and not computational complexity). In some applications, this is a sufficient overhead-failure curve, but for some other applications, a steeper overhead-failure curve is preferred. For example, in a streaming application, the range of the number of source symbols in a source block can be wide, e.g., K=40, K=200, K=1,000, K=10,000. To provide a good streaming experience the failure probability may be required to be low, e.g., a failure probability of $10^{-5}$ or $10^{-6}$. Since bandwidth is often at a premium for streaming applications, the percentage of repair symbols sent as a fraction of the source symbols should be minimized. Suppose, for example, that the network over which the stream is sent should be protected against up to 10% packet loss when using source blocks with K=200, and the failure probability is required to be at most $10^{-6}$. A random binary code requires an overhead of at least 20 to achieve a failure probability of $10^{-6}$, i.e., the receiver needs 220 encoded symbols to decode with this failure probability. A total of 245 encoded symbols need to be sent for each source block to meet the requirements, since ceil(220/(1−0.1))=245. Thus, the repair symbols add an extra 22.5% to the bandwidth requirements for the stream.

The RQ code described herein and in Section 5 of Appendix A achieves a failure probability that is smaller than $10^{-2}$, $10^{-4}$, and $10^{-6}$ for overheads 0, 1, and 2, respectively, for values of K=K' for all supported values of K' and for values of K=1 and K=K'+1 for all but the final supported value of K. Tests have been done for a variety of loss probabilties, e.g., loss probabilities of 10%, 20%, 50%, 70%, 90% and 95%.

For the example above using the RQ code, an overhead of 2 is sufficient to achieve a failure probability of $10^{-6}$, and thus only a total of 225 encoded symbols need to be sent for each source block to meet the requirements, since ceil(202/(1−0.1))=225. In this case, the repair symbols add an extra 12.5% to the bandwidth requirements for the stream, i.e., 10% less bandwidth overhead than required by a random binary code. Thus, the RQ code improved overhead-failure curve has some very positive practical consequences.

There are applications where support for a large number of source symbols per source block is desirable. For example, in a mobile file broadcast application, it is advantageous from a network efficiency point of view to encode the file as a single source block or, more generally, to partition the file into as few source blocks as is practical. Suppose for example that a file of 50 million bytes is to be broadcast, and that the available size within each packet for carrying an encoded symbol is one thousand bytes. To encode the file as a single source block requires that a value of K=50,000 be supported. (Note that there are sub-blocking techniques as described previously that allow decoding using substantially less memory).

There are a few reasons that the number of source symbols supported for a code might be limited. One typical reason is that computational complexity becomes unreasonable as K increases, such as for Reed-Solomon codes, but this is not the case for codes such as chain reaction codes. Another reason might be that the failure probability at zero overhead increases to almost 1 as K increases, making it harder to find systematic indices that yield a good systematic code construction. The failure probability at zero overhead can dictate the difficulty of deriving a good code construction, because this essentially the probability that when a systematic index is chosen randomly that the resulting systematic code construction has the property that the first K encoded symbols are able to decode the K source symbols.

Because the overhead-failure curve for the the RQ code design is so steep for all values of K, it is easily possible to find good systematic indices and thus to support much larger values of K. The RQ code as described in Section 5 of Appendix A supports values of K up to 56,403, and also supports a total number of encoded symbols up to 16,777,216 per source block. These limits on supported values for the RQ code were set due to practical considerations based on perceived application requirements, and not due to limitations of the RQ code design. Other embodiments beyond those shown in Appendix A might have different values.

The RQ code limits the number of different source block sizes that are supported as follows. Given a source block with K source symbols to be encoded or decoded, a K' value is selected based on the table shown in Section 5.6 of Appendix A. The first column in the table lists the possible values for K'. The value of K' selected is the smallest value among the possibilities such that K≤K'. The K source symbols C'(0), ..., C'(K−1) are padded with K'−K symbols C'(K), ..., C'(K'−1) with values set to zeroes to produce a source block comprising K' source symbols C'(0), ..., C'(K'−1), and then encoding and decoding are performed on this padded source block.

The above approach has the benefit of reducing the number of systematic indices that need to be supported, i.e., only a few hundred instead of tens of thousands. There is no disadvantage in terms of the overhead-failure probability for K, as it is the same as the overhead-failure curve for the selected K': Given the value of K, the decoder can compute the value of K', and set the values of C'(K), ..., C'(K'−1) to zeroes, and thus it only has to decode the remaining K of the K' source symbols of the source block. The only potential disadvantages are that slightly more memory or computational resources might be needed for encoding and decoding with slightly more source symbols. However, the spacing between consecutive values of K' is roughly 1% for larger values of K', and thus the potential disadvantage is negligible.

Because of the padding of the source block from K to K', the identifier for encoded symbols C'(0), C'(1), ... within the RQ code is called the Internal Symbol Identifier, abbreviated to ISI, where C'(0), ..., C'(K'−1) are the source symbols and C'(K'), C'(K'+1), ... are the repair symbols.

External applications employing the encoder and decoder use an Encoded Symbol Identifier, also called an Encoding Symbol Identifier, abbreviated to ESI, that ranges from 0 to K−1 to identify the original source symbols C'(0), ..., C'(K−1) and that continues K, K+1, ... to identify repair symbols C'(K'), C'(K'+1), .... Thus, a repair symbol C'(X) identified with ISI X within the RQ code is identified externally with an ESI X−(K'−K). This is described in more detail in Section 5.3.1 of Appendix A.

The encoding and decoding for the RQ codes is defined by two types of relationships: constraint relationships among the intermediate symbols and LT-PI relationships between the intermediate symbols and the encoded symbols. The constraint relationships correspond to the relationships among the intermediate symbols defined by the SE matrix as for example shown in FIG. 12 or FIG. 15. The LT-PI relationships correspond to the relationships between the intermediate symbols and the encoded symbols defined by the LT matrix and PI matrix as for example shown in FIG. 12 or FIG. 15.

Encoding proceeds by determining the intermediate symbol values based on: (1) the source symbol values; (2) LT-PI relationships between the source source symbols and the intermediate symbols; and (3) the constraint relationships among the intermediate symbols. The values of repair symbols can be generated from the intermediate symbols based on LT-PI relationships between the intermediate symbols and the repair symbols.

Similarly, decoding proceeds by determining the intermediate symbol values based on: (1) the received encoded symbol values; (2) LT-PI relationships between the received encoded symbols and the intermediate symbols; and (3) the constraint relationships among the intermediate symbols. The values of missing source symbols can be generated from the intermediate symbols based on LT-PI relationships between the intermediate symbols and the missing source symbols. Thus, encoding and decoding are essentially symmetric procedures.

Example Hardware Components

Figure 30:
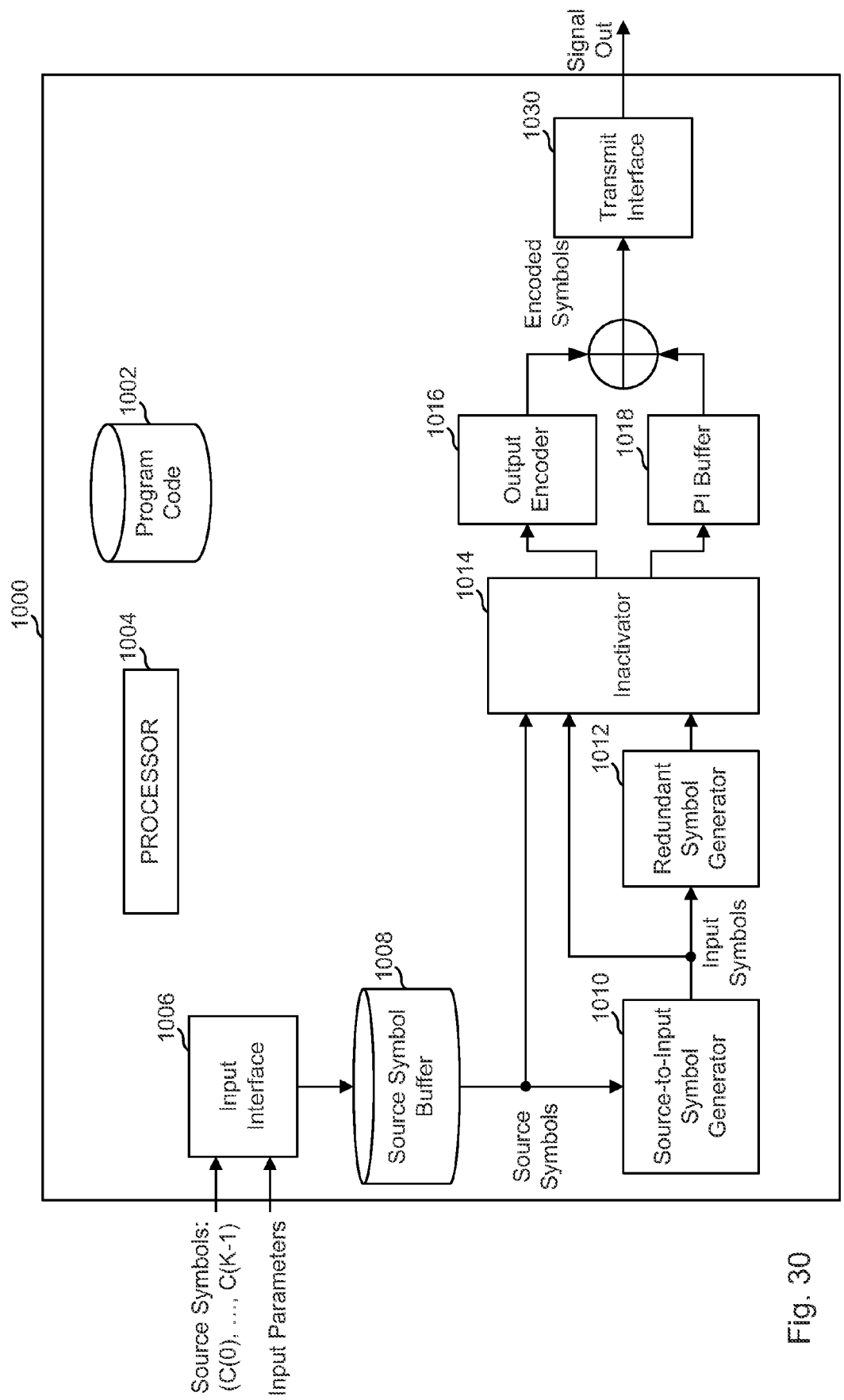
FIG. 30 illustrates an example encoding system that might be implemented as hardware modules, software modules, or portions of program code stored in a program store and executed by a processor, possibly as a collective unit of code not separated as shown in the figure.
Figure 31:
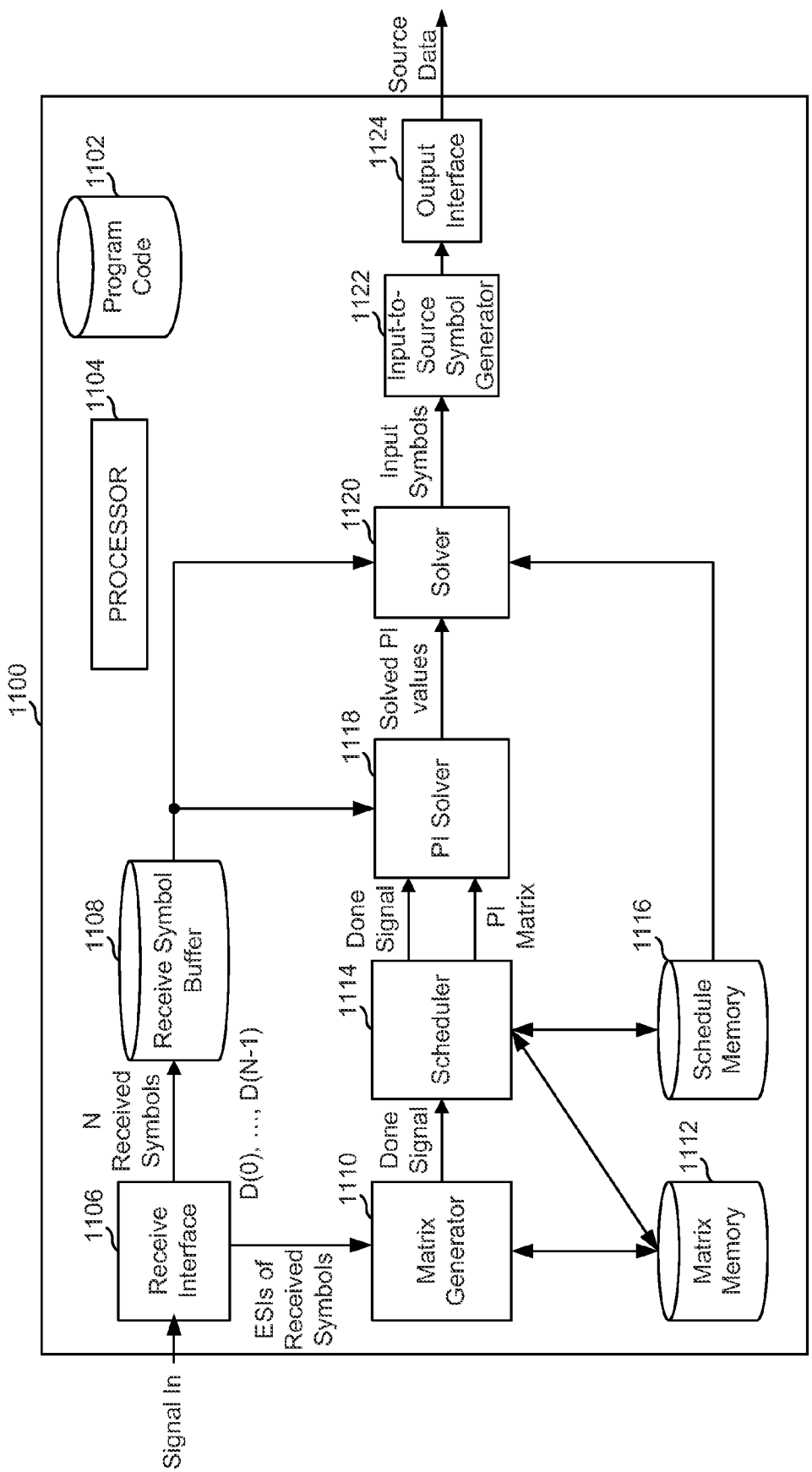
FIG. 31 illustrates an example decoding system that might be implemented as hardware modules, software modules, or portions of program code stored in a program store and executed by a processor, possibly as a collective unit of code not separated as shown in the figure.

FIGS. 30-31 illustrate block diagrams of hardware that might be used to implement methods described above. Each element can be hardware, program code or instructions executed by a general purpose or custom-purpose processor or a combination.

FIG. 30 illustrates an example encoding system 1000, that might be implemented as hardware modules, software modules, or portions of program code stored in a program store 1002 and executed by a processor 1004, possibly as a collective unit of code not separated as shown in the figure. Encoding system 1000 receives a signal in, conveying source symbols and parameter information, and outputs a signal conveying that information.

An input interface 1006 stores the incoming source symbols into a source symbol buffer 1008. A source-to-intermediate symbol generator 1010 generates intermediate symbols from the source symbols. This can be a pass-through in some embodiments and a decoder module in other embodiments (such as a "systematic" embodiment).

A redundant symbol generator 1012 generates redundant symbols from the source symbols. This can be implemented as a chain reaction coder, an LDPC coder, an HDPC coder, or similar. An inactivator 1014 receives the source symbols, intermediate symbols and/or redundant symbols, as the case may be, and stores some of them, the permanently inactivated symbols, in a PI buffer 1018 and provides the others to an output encoder 1016. This process might only be logically, rather than physically.

An operator 1020, such as an XOR operator, operates on one or more encoded symbols from output encoder 1016 (one, in certain embodiments) and one or more of the PI symbols from PI buffer 1018 (one, in certain embodiments), and the result of the operation is provided to a transmit interface 1030 that outputs the signal from system 1000.

FIG. 31 illustrates an example decoding system 1100, that might be implemented as hardware modules, software modules, or portions of program code stored in a program store 1102 and executed by a processor 1104, possibly as a collective unit of code not separated as shown in the figure. Some process might only be logically, rather than physically, implemented.

Decoding system 1100 takes in an input signal and possibly other information and outputs source data, if it is able to. The signal in is provided to a receive interface 1106 that stores received symbols in a buffer 1108. The ESIs of received symbols is provided to a matrix generator 1110 that generates matrixes as described herein, in dependence on the particular symbols received, and stores the results in a matrix memory 1112.

A scheduler 1114 can read matrix details from matrix memory 1112 and generates a schedule, stored in a schedule memory 1016. Schedule 1114 might also generate a done signal and convey a PI matrix to a PI solver 1118 when complete. PI solver 1118 provides solved PI symbol values to a solver 1120, which also used the schedule, to decode the intermediate symbols from the received symbols, schedule and PI symbols.

The intermediate symbols are provided to an intermediate-to-source symbol generator 1122, which could be an encoder or pass-through. The output of intermediate-to-source symbol generator 1122 is provided to an output interface 1124 that outputs the source data, or what source data is available for output.

Other Considerations

In certain situations, there might be a need for enhanced decodability. In examples provided elsewhere herein, while encoded symbols had both LT neighbors and PI neighbors, the LDPC symbols only had LT neighbors or PI neighbors that were not among the HDPC symbols. In some instances, decodability is improved if LDPC symbols also have PI neighbors that include the HDPC symbols. With neighbors among all of the PI symbols, including the HDPC symbols, the decoding worth of the LDPC symbols might be more similar to that of the encoded symbols. As explained elsewhere herein, symbols that depend on the LT symbols (which can be easy to encode and decode) and also depend on the PI symbols, including the HDPC symbols (which can provide high reliability decoding), so that both advantages might be present.

In an example, each LDPC symbol has two PI neighbors, i.e., an LDPC symbol's value depends on the values of two PI symbols.

Decodability might also be improved, in some situations, reducing the occurrences of duplicate encoded symbols, where two encoded symbols are duplicates if they have exactly the same overall neighbor set, where the overall neighbor set for an encoded symbol is comprised of the LT neighbor set and the PI neighbor set. Duplicate encoded symbols with the same overall neighbor set carry exactly the same information about the intermediate source block from which they were generated, and thus there is no better chance at decoding from having received more than one duplicate encoded symbols than there is from having received one of the duplicate encoded symbols, i.e., reception of more than one duplicate symbol adds to the reception overhead and only one of the encoded symbols among the duplicates is useful for decoding.

A preferable property is that each received encoded symbol is not a duplicate of any other received encoded symbol, since this means that each received encoded symbol may be useful for decoding. Thus, it might be preferred to reduce the number of such duplications or reduce the probability of occurrence of duplicates.

One approach is to limit the number of LT neighbors that each encoded symbol can have. For example, if there are W possible neighbors, the maximum number of neighbors might be limited to W−2. This reduces the chance that overall neighborhood sets would be duplicated, in some cases, because the neighborhood set comprising all W possible neighbors would not be allowed. Where the constraint is Deg[v]=min(d, W−2), there are W*(W−1)/2 different neighborhood sets of degree W−2. Thus, it can be less likely that duplicate overall neighbor sets are generated for encoded symbols. Other constraints, such as min(d, W−Wg) for some Wg other than Wg=2, or some other constraint, might be used instead.

Another technique, which can be used alone or with the above duplicate-reducing technique, is to choose more than one PI neighbor for each encoded symbol, so that it is less likely that there are duplicate PI neighbors for encoded symbols, and thus less likely that duplicate overall neighbor sets are generated for encoded symbols. The PI neighbors can be generated in similar ways to how the LT neighbors are generated, for example by first generating a (d1, a1, b1) as shown in the Appendix A, Section 5.3.5.4 according to the code snippet below:

```
if (d < 4) then {d1 = 2 + Rand[y, 3, 2]} else {d1 = 2};
a1 = 1 + Rand[y, 4, P1−1];
b1 = Rand[y, 5, P1];
```

Note that in this example, there is a non-trivial random degree distribution defined on the number of PI neighbors d1 and that distribution depends on the chosen number of LT neighbors d, and the number of PI neighbors is likely to be greater when the number of LT neighbors is smaller. This provides the property that the overall degree of the encoded symbol is such that it reduces the chance that duplicate encoded symbols will be generated and thus received.

The encoded symbol value might be generated using the neighbors defined by (d1, a1, b1) as shown in Appendix A, Section 5.3.5.3, and by the following code snippet:

```
while (b1 >= P) do {b1 = (b1+a1) % P1};
    result = result ^ C[W + b1];
For j = 1, ..., d1−1 do
    b1 = (b1+a1) % P1;
    while (b1 >= P) do {b1 = (b1+a1) % P1};
    result = result ^ C[W + b1];
Return result;
```

To support these decodability features or separately to provide for decodability, a different systematic index J(K') for values of K' might be used, such as the one shown in Table 2 of Section 5.6 in Appendix A.

An example of a process that is performable in a transmission and/or reception system to generate systematic index J(K') is illustrated as follows. For each K' in the list of possible K', one process that could be performed, typically by an appropriately programmed circuit or processor, is to check a number of indices for suitability. For example, the circuit/processor might check, for J=1 ... 1000 [or some other limit], whether the following criteria are met with respect to possible systematic index J:
  (a) Is decoding possible at zero overhead from the K' source symbols?
      If Yes, record the number of on-the-fly inactivations
  (b) Are there duplicate overall neighbor sets among the first K'/0.06 possible encoded symbols (with ESIs 0, ..., K'/0.06)? [Other thresholds might be used instead.]
  (c) Is the decode failure probability below 0.007 [or some other threshold] when decoding using the first K' received encoded symbols within 10,000 runs [or some other test] when each encoded symbol is lost with probability 0.93 [or some other threshold] in each run independently of the other encoded symbols?

The circuit/processor then chooses among the possible systematic indices J that satisfy criteria (a), (b) and (c) above, choosing the systematic index that recorded an average number of on-the-fly inactivations in step (a).

Note that there are many variations of the above selection criteria. For example, in some cases it might be preferable to choose the systematic index that satisfies (a), (b) and (c) above and yields the fewest number of decode failures in step (c) within the specified number of runs. As another example, a combination of the number of on-the-fly inactivations and the decode failure probability might be taken into consideration when choosing a systematic index. As another example, multiple systematic indices for each K' value might be available, and then one of them is chosen randomly within particular applications.

The systematic indices for the K' values listed in Table 2 in Section 5.6 of Appendix A is one potential list of systematic indices for the code described in Appendix A.

Variations of a Sub-Blocking Process

Sub-blocking, dividing blocks into smaller units, physically or logically, for further processing, is known for various purposes. For example, it is used in IETF RFC 5053. It is also known from U.S. Pat. No. 7,072,971. One of the primary uses of the sub-blocking method is to allow a large block of data to be protected as a single entity by an FEC code, while at the same time using a much smaller amount of memory than the size of the data block at a receiver to recover the data block using an FEC decoder.

One method for choosing the number of sub-blocks described in IETF RFC 5053 provides a good source block partition and sub-block partition for many reasonable settings of parameters, but it may produce a solution in some circumstances that may not strictly satisfy an upper bound on the sub-block size WS (although even in these cases it produces solutions where the sub-block size is a modest factor larger than the given constraint WS on the sub-block size). As another example, in draft-luby-rmt-bb-fec-raptorg-object-00 (where the maximum number of source symbols in a source block is much larger than in IETF RFC 5053), in Section 4.2, the recipe below is provided to calculate T, Z, and N, where T is the symbol size, Z is the number of source blocks into which the file (or data block) is partitioned, and N is the number of sub-blocks. Also, P' is the packet payload size for symbols, F is the file size in bytes, K'_max is the maximum number of source symbols supported (e.g., 56,404), Al is an alignment factor specifying that symbols or sub-symbols should be multiples of Al bytes in size to allow more efficient decoding, e.g., Al=4 for a modern CPU is preferred, and WS is the desired upper bound on the sub-block size in bytes.

Note that the derivation of the parameters T, Z, and N can be done at a sender or an alternative server based on the values of F, Al, and P'. The receiver only needs to know the values of F, Al, T, Z, and N in order to determine the sub-block and source block structure of the file or data block in received packets pertaining to the file or data block. The receiver can determine P' from the size of received packets. Note that sent and received packets also typically contain other information that identifies the contents of the packet, e.g., an FEC Payload ID that is typically 4 bytes in size and that carries the source block number (SBN), and the encoded symbol identifier (ESI) of the first symbol carried in the packet.

A previous method described in Section 4.2 of draft-luby-rmt-bb-fec-raptorg-object-00 to calculate T, Z, N is to set them at the following values:
T=P'
Kt=ceil(F/T)
Z=ceil(Kt/K'_max)
N=min{ceil(ceil(Kt/Z)*T/WS), T/Al}

In these calculations, ceil( ) is a function that outputs the smallest integer greater than or equal to its input, and floor( ) is a function that outputs the largest integer less than or equal to its input. Also, min( ) is a function that outputs the minimum of its inputs.

One issue for some settings of parameters with this way of deriving source blocks and sub-block partitioning is that if T/Al is smaller than ceil(ceil(Kt/Z)*T/WS), then the upper bound on the sub-block size W may not be respected.

A potential secondary issue is that this allows sub-symbols to be as small as Al, which is typically set to 4 bytes, and may be too small to be efficient in practice. Typically, the smaller the sub-symbol size, the more processing overhead there is to decode or encode sub-blocks. Furthermore, especially at a receiver, a smaller sub-symbol size means that more sub-blocks need to be de-multiplexed and decoded, and this can consume receiver resources such as CPU cycles and memory accesses. On the other hand, a smaller allowable sub-symbol size means that a source block can be partitioned into more sub-blocks that respect a specified upper bound WS on sub-block size. Thus, smaller sub-symbols allow a larger source block to be supported, and thus the FEC protection provided across this source block yields better protection and better network efficiency. In practice, in many cases it is preferable to ensure that sub-symbols are at least a specified minimum size, which provides the opportunity for a better balance between processing requirements and memory requirements at a receiver and the efficient usage of network resources.

As an example of the derived parameters using the previous method described in Section 4.2 of draft-luby-rmt-bb-fec-raptorg-object-00 to calculate T, Z, N:

Input:
F=56,404 KB
P'=1 KB=1,024 bytes
WS=128 KB
Al=4
K'_max=56,404
Calculations:
T=1 KB
Kt=56,404
Z=1
N=256 (due to the second input to the min function)

In this example, there will be one source block, comprising 256 sub-blocks, where each sub-block is approximately 220 KB (larger than WS) with at least some sub-blocks having sub-symbol size 4 bytes (extremely small).

A third issue is that an AL–FEC solution may not support all possible numbers of source symbols, i.e., it may only support a selected list of K' values, where K' is a supported number of source symbols in a source block, and then if the actual number of source symbols K desired in a source block is not among the K' values then K is padded up to the nearest K' value, which means that the size of the source block that is used can be somewhat larger than the calculated K value from the above.

We now describe new sub-blocking methods, which are improvements on the previous methods described above. For the purposes of description, a module for sub-blocking might take as its inputs data to be partitioned, F, and values including WS, Al, SS and P', where the meaning of those variables is described in more detail below.

WS represents a provided constraint on the maximum size sub-block, possibly in units of bytes, that is decodable in working memory at a receiver. Al represents a memory alignment parameter. Since a receiver memory might work more efficiently if symbols and sub-symbols are aligned in memory along memory alignment boundaries, it might be useful to track Al and store values in multiples of Al bytes. For example, typically Al=4, as many memory devices naturally address data in memory on four byte boundaries. Other values of Al are also possible, e.g., Al=2 or Al=8. Typically, Al might be set to the least common multiple memory alignment of all the many possible receivers. For example, if some receivers support 2-byte memory alignment but other receivers support 4-byte memory alignment, then Al=4 would be recommended.

The parameter SS is determined based on the preferred lower bound on sub-symbol size, such that the lower bound on the sub-symbol size is SS*Al bytes. It may be preferable to have the sub-symbol size be a multiple of Al, since decoding operations are typically performed on sub-symbols.

What follows is a detailed explanation of a method for partitioning data F into Z source blocks and then the partitioning of those Z source blocks into N sub-blocks. In this description, P' refers to a variable stored in memory (or implied) representing the available bytes within packets for symbols that are to be sent, and it is assumed that P' is a multiple of Al. T is a variable representing the size of the symbols that are to be placed within sent packets. Other variables can be inferred from the text.

New Sub-Blocking Method to Determine T, Z and N
 T=P'
 Kt=ceil(F/T);
 N_max=floor(T/(SS*Al));
 For all n=1, . . . , N_max
  KL(n) is the maximum K' value supported as a possible number of source symbols in a source block that satisfies
  K'≤WS/(Al*(ceil(T/(Al*n))));
 Z=ceil(Kt/KL(N_max));
 N=minimum n such that ceil(Kt/Z)≤KL(n);

Once these parameters have been determined, then the size of each of the Z source blocks, and the sizes of the sub-symbols of the N sub-blocks of each source block can be determined as described in IETF RFC 5053, i.e., Kt=ceil(F/T), (KL, KS, ZL, ZS)=Partition[Kt, Z], and (TL, TS, NL, NS)=Partition[T/Al, N].

Kt is the number of source symbols in the file. In a sub-block module, the Kt source symbols are partitioned into Z source blocks, ZL source blocks with KL source symbols each and ZS source blocks with KS source symbols each. Then, KL is rounded up to KL', where KL' is the smallest supported number of source symbols that is at least KL (and an additional KL'−KL zero-padding symbols are added to the source block for purposes of encoding and decoding, but these additional symbols are typically not sent or received), and similarly KS is rounded up to KS', where KS' is the smallest supported number of source symbols that is at least KS (and an additional KS'−KS zero-padding symbols are added to the source block for purposes of encoding and decoding, but these additional symbols are typically not sent or received).

These calculations (performed by the sub-block module, another software module, or hardware) ensure that the numbers of source symbols for the source blocks are as equal as possible, subject to the constraint that their numbers total to the number, Kt, of source symbols in the file. These calculations also ensure that the sizes of the sub-symbols for the sub-blocks are as equal as possible subject to the constraint that they are multiples of Al and that their sizes total the symbol size.

Then, the sub-symbol parameters TL, TS, NL and NS are calculated, where there are NL sub-blocks that use the larger sub-symbol size TL*Al and there are NS sub-blocks that use the smaller sub-symbol size TS*Al. The function Partition[I, J] is implemented in software or hardware and is defined as the function with an output that is a sequence of four integers (IL, IS, JL, JS), where IL=ceil(I/J), IS=floor(I/J), JL=I−IS*J, and JS=J−JL.

Some of the properties of these new methods are worth noting. A sub-block module can determine a lower bound derived on the smallest sub-symbol size used. From the above equations, it is known that TS=floor(T/(Al*N)), where TS*Al is the smallest sub-symbol size used since TS≤TL. Note that the smallest sub-symbol is used when N=N_max. Using X/(floor(Y))≥X/Y for positive X and Y, TS is at least floor(T/(Al*floor(T/(SS*Al)))), which is in turn at least floor(SS)=SS. Because of these facts, the smallest sub-symbol size produced by the partitioning method described herein will be at least TS*Al=SS*Al, as desired.

A sub-block module can determine an upper bound derived on the largest sub-block size. The largest sub-block size used is TL*Al*KL', where KL' is the smallest K' value in the table above that is at least KL=ceil(Kt/Z). Note that, by the definition of N, KL'≤KL(N), and TL=ceil(T/(Al*N)). Since KL(N)≤WS/(Al*(ceil(T/(Al*N)))), it follows that WS≥KL(N)*Al*ceil(T/(Al*N))≥KL'*Al*TL.

A variable N_max can represent the largest number of sub-symbols into which a source symbol of size T can be partitioned. Setting N_max to floor(T/(SS*Al)) ensures that the smallest sub-symbol size is at least SS*Al. KL(n) is the largest number of source symbols in a source block that can be supported when symbols of the source block are partitioned into n sub-symbols each, to ensure that each of the sub-blocks of the source block is of size at most WS.

The number Z of source blocks can be chosen to be as small as possible, subject to the constraint that the number of source symbols in each source block is at most KL(N_max), which ensures that each source symbol can be partitioned into sub-symbols of size at least SS*Al and that the resulting sub-blocks are of size at most WS. The sub-block module determines, from the value of Z, the number of source blocks and the numbers of symbols in each of the Z source blocks.

Note that if any smaller value of Z is used than produced by this partitioning method, then either there would be a sub-block of one of the source blocks that is larger than WS or else there would be a sub-block of one of the source blocks that had a sub-symbol size smaller than SS*Al. Also, the smallest of the source blocks that this partitioning method produces is as large as possible subject to these two constraints, i.e., there is no other method to partition the file or data block into source blocks that respects both constraints such that the smallest source block is larger than the smallest source block produced by this partitioning method. Thus, in this sense the value of Z produced by this partitioning method is optimal.

The number N of sub-blocks into which a source block is partitioned can be chosen to be as small as possible subject to the constraint that, for each sub-block, the size of the sub-symbols of the sub-block times the number of source symbols in the source block which the sub-block partitions is at most WS.

Note that if any smaller value of N is used than produced by this partitioning method from the value of Z, then there would be at least one sub-block whose size would exceed WS. Also, the smallest sub-symbol size that this partitioning method produces from the given value of Z is as large as possible subject to the constraint that the largest sub-block size should not exceed WS, i.e., there is no other method to produce sub-blocks of the source blocks determined by the value of Z that respects the largest sub-block constraint such that the smallest sub-symbol size is larger than the smallest sub-symbol size produced by this partitioning method. Thus, in this sense the value of N produced by this partitioning method is optimal.

In the following examples, it is assumed that all possible K' values are supported as a number of source symbols in a source block.

EXAMPLE 1

Inputs:
SS=5
Al=4 bytes
(Min sub-symbol size=20 bytes)
WS=128 KB=131,072 bytes
P'=1,240 bytes
F=6 MB=6,291,456 bytes
Calculations:
T=1,240 bytes
Kt=5,074
N_max=62
KL(N_max)=6,553
Z=1
KL=ceil(Kt/Z)=5,074
N=52 (KL(N)=5,461)
TL=6, larger sub-symbol=24 bytes
TS=5, smaller sub-symbol=20 bytes
TL*AL*KL=121,776

EXAMPLE 2

Inputs:
SS=8
Al=4 bytes
(Min sub-symbol size=32 bytes)
WS=128 KB=131,072 bytes
P'=1 KB=1,024 bytes
F=56,404 KB=57,757,696 bytes
Calculations:
T=1,024 bytes
Kt=56,404
N_max=32
KL(N_max)=4,096
Z=14
KL=ceil(Kt/Z)=4,029
N=32 (KL(N)=4,096)
TL=8, larger sub-symbol=32 bytes
TS=8, smaller sub-symbol=32 bytes
TL*AL*KL=128,928

There are many variants of the above methods. For example, for some FEC code it is desirable to have at least a minimum number of source symbols in a source block to minimize the source block reception overhead of the FEC code. Since for really small file sizes or data block sizes F the size of the source symbol might become too small, there might also be a maximum number of source symbols into which a packet is partitioned. For example, in IETF RFC 5053, the desired minimal number of source symbols in a source block is Kmin=1024 and the maximum number of source symbols into which a packet is partitioned is Gmax=10.

Below is another variant of the new sub-blocking method described above that takes into account the additional parameters Kmin and Gmax as just described, where G is the number of symbols for a source block carried in each packet, performable by a subblocking module or more generally some module or software or hardware at an encoder, decoder, transmitter and/or receiver.

In this variant, each packet carries the ESI of the first symbol in the packet and then each subsequent symbol in the packet implicitly has an ESI that is one larger than the preceding symbol in the packet.

New Sub-Blocking Method to Determine G, T, Z and N
   G=min(ceil(P'*Kmin/F), floor(P'/(SS*Al)), Gmax);
   T=floor(P'/(Al*G))*Al;
   Kt=ceil(F/T);
   N_max=floor(T/(SS*Al));
   For all n=1, . . . , N_max
      KL(n) is the maximum K' value supported as a possible number of source symbols in a source block that satisfies
      K'≤WS/(Al*(ceil(T/(Al*n))));
   Z=ceil(Kt/KL(N_max));
   N=minimum n such that ceil(Kt/Z)≤KL(n);

Note that by the way G is calculated, it is guaranteed that the symbol size is at least SS*Al, i.e., the symbol size is at least the minimum sub-symbol size. Note also that it should be the case that SS*Al is at least P' to ensure that the symbol size can be at least SS*Al (and if it is not, then G will evaluate to zero).

EXAMPLE 3

Input:
SS=5
Al=4 bytes
(Min sub-symbol size=20 bytes)
WS=256 KB=262,144 bytes
P'=1,240 bytes
F=500 KB=512,000 bytes
Kmin=1,024
Gmax=10
Calculations:
G=3
T=412
Kt=1,243
N_max=20
KL(N_max)=10,992
Z=1
KL=ceil(Kt/Z)=1,243
N=2 (KL(N)=1,260)
TL=52, larger sub-symbol=208 bytes
TS=51, smaller sub-symbol=204 bytes
TL*AL*KL=258,544

As has now been described, these new methods introduce a constraint on the smallest sub-symbol size used for any sub-block. This disclosure provides new methods for sub-blocking that respect this additional constraint, while at the same time strictly respecting a constraint on the maximum sub-block size. The methods produce source blocking and sub-blocking solutions that satisfy the objectives of partitioning a file or data block into as few source blocks as possible subject to a constraint on the smallest sub-symbol size, and then subject to this split into as few sub-blocks as possible subject to a constraint on the maximum sub-block size.

Variations

In some applications, it may be acceptable to not be able to decode all of the source symbols, or to be able to decode all of source symbols, but with a relatively low probability. In such applications, a receiver can stop attempting to decode all of the source symbols after receiving K+A encoded symbols. Or, the receiver can stop receiving encoded symbols after receiving less than K+A encoded symbols. In some applications, the receiver may even only receive K or less encoded symbols. Thus, it is to be understood that in some embodiments of the present invention, the desired degree of accuracy need not be complete recovery of all the source symbols.

Further, in some applications where incomplete recovery is acceptable, the data can be encoded such that all of the source symbols cannot be recovered, or such that complete recovery of the source symbols would require reception of many more encoded symbols than the number of source symbols. Such an encoding would generally require less computational expense, and may thus be an acceptable way to decrease the computational expense of encoding.

It is to be understood that the various functional blocks in the above-described figures may be implemented by a combination of hardware and/or software, and that in specific implementations some or all of the functionality of some of the blocks may be combined. Similarly, it is also to be understood that the various methods taught herein may be implemented by a combination of hardware and/or software.

The above description is illustrative and not restrictive. Many variations of the invention will become apparent to those of skill in the art upon review of this disclosure. The scope of the invention should, therefore, be determined not with reference to the above description, but instead should be determined with reference to the appended claims along with their full scope of equivalents.

What is claimed is:

1. A method of electronically transmitting data via one or more transmitters capable of outputting an electronic signal, wherein the data to be transmitted is represented by an ordered set of source symbols and the data is transmitted as a sequence of encoded symbols representing at least a portion of the electronic signal, the method comprising:
obtaining, in an electronically readable form, the ordered set of source symbols;
generating a set of intermediate symbols from the ordered set of source symbols, wherein the source symbols can be regenerated from the set of intermediate symbols;
designating sets of the intermediate symbols such that each intermediate symbol is designated as a member of one of the sets of intermediate symbols and there are at least a first set of intermediate symbols and a second set of intermediate symbols, and wherein each set of intermediate symbols has associated with it distinct encoding parameters and has as members at least one intermediate symbol; and
generating a plurality of encoded symbols, wherein an encoded symbol is generated from one or more of the intermediate symbols, wherein at least one encoded symbol is generated, directly or indirectly, from a plurality of intermediate symbols selected from a plurality of the sets of intermediate symbols.

2. The method of claim 1, wherein the first set of intermediate symbols are designated as symbols for belief propagation decoding and the second set of intermediate symbols are designated as symbols to be inactivated for belief propagation decoding.

3. The method of claim 1, wherein each encoded symbol is generated from a combination of a first symbol generated from one or more of the first set of intermediate symbols and a second symbol generated from one or more of the second set of intermediate symbols.

4. The method of claim 3, wherein the distinct encoding parameters comprise at least distinct degree distributions, such that each encoded symbol is generated from a combination of a first symbol generated from one or more of the first set of intermediate symbols having a first degree distribution and a second symbol generated from one or more of the second set of intermediate symbols having a second degree distribution different from the first degree distribution.

5. The method of claim 3, wherein the first symbol is generated using a chain reaction encoding process applied to the first set of intermediate symbols.

6. The method of claim 3, wherein the second symbol is an XOR of a fixed number of symbols chosen randomly from the second set of intermediate symbols.

7. The method of claim 3, wherein the second symbol is an XOR of a first number of symbols chosen randomly from the second set of intermediate symbols, and wherein the first number depends on a second number equal to a number of the symbols chosen from the first set to generate the first symbol.

8. The method of claim 3, wherein the combination is the XOR of the first symbol and the second symbol.

9. The method of claim 1, wherein the intermediate symbols comprise the ordered set of source symbols and a set of redundant source symbols generated from the ordered set of source symbols.

10. The method of claim 9, wherein at least some of the redundant symbols are generated using a GF[2] operations and other redundant symbols are generated using GF[256] operations.

11. The method of claim 1, wherein the intermediate symbols are generated, during encoding, from the source symbols using a decoding process, wherein the decoding process is based on a linear set of relations between the intermediate symbols and the source symbols.

12. The method of claim 11, wherein at least some of the linear relations are relations over GF[2] and other linear relations are relations over GF[256].

13. The method of claim 1, wherein the number of distinct encoded symbols that can be generated from a given ordered set of source symbols is independent of the number of source symbols in that ordered set.

14. The method of claim 1, wherein an average number of symbol operations performed to generate an encoded symbol is bounded by a constant independent of the number of source symbols in that ordered set.

15. The method of claim 1, wherein the first set of symbols is more than an order of magnitude larger than the second set of symbols.

16. A method of receiving data from a source, wherein the data is received at a destination over a packet communication channel, and wherein the data representable by a set of encoded symbols derived from an ordered set of source symbols representing the data sent from the source to the destination, the method comprising:
    obtaining the set of received encoded symbols;
    decoding a set of intermediate symbols from the set of received encoded symbols;
    associating each of the intermediate symbols with a set of intermediate symbols, wherein the intermediate symbols are associated into at least two sets, and wherein one set is designated as a set of permanently inactive symbols for purposes of scheduling a decoding process to recover the intermediate symbols from the received encoded symbols; and
    recovering at least some of the source symbols of the ordered set of source symbols from the set of intermediate symbols according to the decoding process.

17. The method of claim 16, wherein the decoding process comprises at least a first decoding phase, wherein a set of reduced encoded symbols are generated that depend on a second set of permanently inactive symbols and a third set of dynamically inactive symbols that is a subset of the first set of symbols, and a second decoding phase, wherein the set of reduced encoded symbols is used to decode the second set of permanently inactive symbols and the third set of dynamically inactive symbols, and a third decoding phase, wherein the decoded second set of permanently inactive symbols and the third set of dynamically inactive symbols and the set of received encoded symbols is used to decode at least some of the remaining intermediate symbols that are in the first set of symbols.

18. The method of claim 17, wherein the first decoding phase uses belief propagation decoding combined with inactivation decoding, and/or the second decoding phase uses Gaussian elimination.

19. The method of claim 17, wherein the third decoding phase uses back substitution or a back sweep followed by a forward sweep.

20. The method of claim 17, wherein the decoding process operates on the third set of dynamically inactive symbols considering that the number of symbols in third set of dynamically inactive symbols is less than 10% of the number of source symbols and/or less than 10% of the number of symbols in the second set of permanently inactive symbols.

21. The method of claim 16, wherein the received encoded symbols are operated on as LDPC code generated symbols or Reed-Solomon code generated symbols.

22. The method of claim 16, wherein each received encoded symbol of the set of received encoded symbols is operated on as being a combination of a first symbol generated from one or more of the first set of symbols and a second symbol generated from one or more of the second set of symbols.

23. The method of claim 22, wherein each received encoded symbol is operated on as the combination being an XOR of the first symbol and the second symbol.

24. The method of claim 22, wherein each received encoded symbol is operated on as the second symbol being an XOR of a fixed number of symbols that was chosen randomly from the second set.

25. The method of claim 22, wherein each received encoded symbol is operated on as the second symbol being an XOR of a first number of symbols that was chosen randomly from the second set, wherein the first number of symbols depends on the second number of symbols that was chosen from the first set to generate the first symbol.

26. The method of claim 22, wherein the decoding process operates as if the first symbol was chosen based on a chain reaction code from the first set of symbols.

27. The method of claim 16, wherein the decoding process operates as if the size of the second set of permanently inactive symbols is proportional to the square root of the number of source symbols.

28. The method of claim 16, wherein the decoding process operates as if the intermediate symbols comprise the ordered set of source symbols and a set of redundant symbols generated from the ordered set of source symbols.

29. The method of claim 28, wherein the decoding process operates as if at least some of the redundant symbols were generated using GF[2] operations and other redundant symbols were generated using GF[256] operations.

30. The method of claim 16, wherein the decoding process operates as if the intermediate symbols comprise the ordered set of source symbols.

31. The method of claim 16, wherein the decoding process operates as if the intermediate symbols are symbols that were generated from the source symbols using a decoding process based on a linear set of relations between the intermediate symbols and the source symbols.

32. The method of claim 31, wherein the decoding process operates as if at least some of the linear relations are relations over GF[2] and other linear relations are relations over GF[256].

33. The method of claim 16, wherein the decoding process operates as if the number of different possible encoded symbols that can be received is independent of the number of source symbols in the ordered set.

34. The method of claim 16, wherein an average number of symbol operations performed to decode the set of source symbols from the set of received encoded symbols is bounded by a constant times the number of source symbols, wherein the constant is independent of the number of source symbols.

35. The method of claim 16, wherein the decoding process operates as if the number of symbols in the first set of symbols is more than an order of magnitude larger than the number of symbols in the second set of permanently inactive symbols.

36. The method of claim 16, wherein the decoding process operates such that recovery of all of the set of K source symbols from a set of N=K+A encoded symbols, for some K, N and A, has a probability of success of at least a lower bound of $1-(0.01)^{(A+1)}$ for A=0, 1 or 2, with the lower bound being independent of the number of source symbols.

37. A method for serving a file using a server coupled to a data network, wherein serving includes organizing data of the file into one or more blocks, generating one or more encoded symbols for a block based on the data of the block, and wherein at least one block is physically or logically organized into a plurality of sub-blocks and at least one encoded symbol is physically or logically organized into a plurality of sub-symbols, the method comprising:

partitioning an input file into an integer number of blocks, wherein each block includes at least one sub-block, and wherein each sub-block includes at least one source symbol;

determining a value, WS, representing a maximum size for a sub-block based on a memory constraint;

determining a value SS, wherein SS*AL represents a lower bound for sub-symbol size, in units of a preferred memory unit size, AL;

determining which blocks of the integer number of blocks is to be organized into a plurality of sub-blocks, and for each such block, organizing the block into a plurality of sub-blocks having a size determined by the available space within packets for encoded symbols that are to be sent, a symbol size that is to be used within each sent packet, in a manner to ensure that a number of source symbols for source blocks is equal within a threshold and the number is equal to the number, Kt, of source symbols in the file and to ensure that the sub-symbol size of each sub-block is at most SS*AL and to ensure that the size of each sub-block is at most WS;

generating encoded symbols from blocks, wherein sub-symbols are generated from sub-blocks such that each encoded symbol depends on data from one block; and outputting the generated encoded symbols.

38. A method for recovering a block of data at a receiver using a client coupled to a data network, wherein a block includes a grouping of one or more sub-blocks, the method comprising:

receiving a plurality of encoded symbols generated from the block, wherein each encoded symbol includes a plurality of sub-symbols generated from at least one sub-block using a common set of operations;

determining a value, WS, representing a maximum size for a sub-block based on a memory constraint;

determining a value SS, wherein SS*AL represents a lower bound for sub-symbol size, in units of a preferred memory unit size, AL;

determining which blocks of the integer number of blocks organized into a plurality of sub-blocks, and for each such block, organizing the block into a plurality of sub-blocks having a size determined by a first parameter set by a sender representing available space within packets, a second parameter representing a symbol size used within each packet, the parameters being such that a number of source symbols for source blocks is equal within a threshold and the number is equal to the number, Kt, of source symbols in the file;

decoding blocks from received encoded symbols, wherein sub-blocks are decoded from sub-symbols and the sub-blocks form blocks, wherein the sub-symbol size of each sub-block is at most SS*AL and the size of each sub-block is at most WS; and outputting the decoded blocks.

39. An apparatus for encoding data to be transmitted via one or more transmitters capable of outputting a signal, the apparatus comprising:

memory; and a processor;

the memory and processor configured to perform operations comprising:

obtaining an ordered set of source symbols;

generating a set of intermediate symbols from the ordered set of source symbols, wherein the source symbols can be regenerated from the set of intermediate symbols;

designating sets of the intermediate symbols such that each intermediate symbol is designated as a member of one of the sets of intermediate symbols and there are at least a first set of intermediate symbols and a second set of intermediate symbols, and wherein each set of intermediate symbols has associated with it distinct encoding parameters and has as members at least one intermediate symbol; and generating a plurality of encoded symbols, wherein an encoded symbol is generated from one or more of the intermediate symbols, wherein at least one encoded symbol is generated, directly or indirectly, from a plurality of intermediate symbols selected from a plurality of the sets of intermediate symbols.

40. The apparatus of claim 39, wherein the memory and processor are configured to perform operations such that the first set of intermediate symbols are designated as symbols for belief propagation decoding and the second set of intermediate symbols are designated as symbols to be inactivated for belief propagation decoding.

41. The apparatus of claim 39, wherein the memory and processor are configured to perform operations such that each encoded symbol is generated from a combination of a first symbol generated from one or more of the first set of intermediate symbols and a second symbol generated from one or more of the second set of intermediate symbols.

42. The apparatus of claim 41, wherein the memory and processor are configured to perform operations such that the distinct encoding parameters comprise at least distinct degree distributions, such that each encoded symbol is generated from a combination of a first symbol generated from one or more of the first set of intermediate symbols having a first degree distribution and a second symbol generated from one or more of the second set of intermediate symbols having a second degree distribution different from the first degree distribution.

43. The apparatus of claim 41, wherein the memory and processor are configured to perform operations such that the first symbol is generated using a chain reaction encoding process applied to the first set of intermediate symbols.

44. The apparatus of claim 41, wherein the memory and processor are configured to perform operations such that the second symbol is an XOR of a fixed number of symbols chosen randomly from the second set of intermediate symbols.

45. The apparatus of claim 41, wherein the memory and processor are configured to perform operations such that the second symbol is an XOR of a first number of symbols chosen randomly from the second set of intermediate symbols, and the first number depends on a second number equal to a number of the symbols chosen from the first set to generate the first symbol.

46. The apparatus of claim 41, wherein the memory and processor are configured to perform operations such that the combination is the XOR of the first symbol and the second symbol.

47. The apparatus of claim 39, wherein the memory and processor are configured to perform operations such that the intermediate symbols comprise the ordered set of source symbols and a set of redundant source symbols generated from the ordered set of source symbols.

48. The apparatus of claim 47, wherein the memory and processor are configured to perform operations such that at least some of the redundant symbols are generated using a GF[2] operations and other redundant symbols are generated using GF[256] operations.

49. The apparatus of claim 39, wherein the memory and processor are configured to perform operations such that the intermediate symbols are generated, during encoding, from the source symbols using a decoding process, and the decoding process is based on a linear set of relations between the intermediate symbols and the source symbols.

50. The apparatus of claim 49, wherein the memory and processor are configured to perform operations such that at least some of the linear relations are relations over GF[2] and other linear relations are relations over GF[256].

51. The apparatus of claim 39, wherein the memory and processor are configured to perform operations such that the number of distinct encoded symbols that can be generated from a given ordered set of source symbols is independent of the number of source symbols in that ordered set.

52. The apparatus of claim 39, wherein the memory and processor are configured to perform operations such that an average number of symbol operations performed to generate an encoded symbol is bounded by a constant independent of the number of source symbols in that ordered set.

53. The apparatus of claim 39, wherein the memory and processor are configured to perform operations such that the first set of symbols is more than an order of magnitude larger than the second set of symbols.

54. An apparatus for decoding data a set of received encoded symbols, the set of received encoded symbols derived from an ordered set of source symbols, the apparatus comprising:
memory; and
a processor;
the memory and processor configured to perform operations comprising:
obtaining the set of received encoded symbols;
decoding a set of intermediate symbols from the set of received encoded symbols;
associating each of the intermediate symbols with a set of intermediate symbols, wherein the intermediate symbols are associated into at least two sets, and wherein one set is designated as a set of permanently inactive symbols for purposes of scheduling a decoding process to recover the intermediate symbols from the received encoded symbols; and
recovering at least some of the source symbols of the ordered set of source symbols from the set of intermediate symbols according to the decoding process.

55. The apparatus of claim 54, wherein the memory and processor are configured to perform operations such that the decoding process comprises at least a first decoding phase, and a set of reduced encoded symbols are generated that depend on a second set of permanently inactive symbols and a third set of dynamically inactive symbols that is a subset of the first set of symbols, and a second decoding phase, and the set of reduced encoded symbols is used to decode the second set of permanently inactive symbols and the third set of dynamically inactive symbols, and a third decoding phase, and the decoded second set of permanently inactive symbols and the third set of dynamically inactive symbols and the set of received encoded symbols is used to decode at least some of the remaining intermediate symbols that are in the first set of symbols.

56. The apparatus of claim 55, wherein the memory and processor are configured to perform operations such that the first decoding phase uses belief propagation decoding combined with inactivation decoding, and/or the second decoding phase uses Gaussian elimination.

57. The apparatus of claim 55, wherein the memory and processor are configured to perform operations such that the third decoding phase uses back substitution or a back sweep followed by a forward sweep.

58. The apparatus of claim 55, wherein the memory and processor are configured to perform operations such that the decoding process operates on the third set of dynamically inactive symbols considering that the number of symbols in third set of dynamically inactive symbols is less than 10% of the number of source symbols and/or less than 10% of the number of symbols in the second set of permanently inactive symbols.

59. The apparatus of claim 54, wherein the memory and processor are configured to perform operations such that the received encoded symbols are operated on as LDPC code generated symbols or Reed-Solomon code generated symbols.

60. The apparatus of claim 54, wherein the memory and processor are configured to perform operations such that each received encoded symbol of the set of received encoded symbols is operated on as being a combination of a first symbol generated from one or more of the first set of symbols and a second symbol generated from one or more of the second set of symbols.

61. The apparatus of claim 60, wherein the memory and processor are configured to perform operations such that each received encoded symbol is operated on as the combination being an XOR of the first symbol and the second symbol.

62. The apparatus of claim 60, wherein the memory and processor are configured to perform operations such that each received encoded symbol is operated on as the second symbol being an XOR of a fixed number of symbols that was chosen randomly from the second set.

63. The apparatus of claim 60, wherein the memory and processor are configured to perform operations such that each received encoded symbol is operated on as the second symbol being an XOR of a first number of symbols that was chosen randomly from the second set, and the first number of symbols depends on the second number of symbols that was chosen from the first set to generate the first symbol.

64. The apparatus of claim 60, wherein the memory and processor are configured to perform operations such that the decoding process operates as if the first symbol was chosen based on a chain reaction code from the first set of symbols.

65. The apparatus of claim 54, wherein the memory and processor are configured to perform operations such that the decoding process operates as if the size of the second set of permanently inactive symbols is proportional to the square root of the number of source symbols.

66. The apparatus of claim 54, wherein the memory and processor are configured to perform operations such that the decoding process operates as if the intermediate symbols comprise the ordered set of source symbols and a set of redundant symbols generated from the ordered set of source symbols.

67. The apparatus of claim 66, wherein the memory and processor are configured to perform operations such that the decoding process operates as if at least some of the redundant symbols were generated using GF[2] operations and other redundant symbols were generated using GF[256] operations.

68. The apparatus of claim 54, wherein the memory and processor are configured to perform operations such that the decoding process operates as if the intermediate symbols comprise the ordered set of source symbols.

69. The apparatus of claim 54, wherein the memory and processor are configured to perform operations such that the decoding process operates as if the intermediate symbols are symbols that were generated from the source symbols using a decoding process based on a linear set of relations between the intermediate symbols and the source symbols.

70. The apparatus of claim 69, wherein the memory and processor are configured to perform operations such that the decoding process operates as if at least some of the linear relations are relations over GF[2] and other linear relations are relations over GF[256].

71. The apparatus of claim 54, wherein the memory and processor are configured to perform operations such that the decoding process operates as if the number of different possible encoded symbols that can be received is independent of the number of source symbols in the ordered set.

72. The apparatus of claim 54, wherein the memory and processor are configured to perform operations such that an average number of symbol operations performed to decode the set of source symbols from the set of received encoded symbols is bounded by a constant times the number of source symbols, and the constant is independent of the number of source symbols.

73. The apparatus of claim 54, wherein the memory and processor are configured to perform operations such that the decoding process operates as if the number of symbols in the first set of symbols is more than an order of magnitude larger than the number of symbols in the second set of permanently inactive symbols.

74. The apparatus of claim 54, wherein the memory and processor are configured to perform operations such that the decoding process operates such that recovery of all of the set of K source symbols from a set of N=K+A encoded symbols, for some K, N and A, has a probability of success of at least a lower bound of $1-(0.01)^{(A+1)}$ for A=0, 1 or 2, with the lower bound being independent of the number of source symbols.

75. An apparatus for serving a file using a server coupled to a data network, wherein serving includes organizing data of the file into one or more blocks, generating one or more encoded symbols for a block based on the data of the block, and wherein at least one block is physically or logically organized into a plurality of sub-blocks and at least one encoded symbol is physically or logically organized into a plurality of sub-symbols, the apparatus comprising:
  memory; and
  a processor;
  the memory and processor configured to perform operations comprising:
    partitioning an input file into an integer number of blocks, wherein each block includes at least one sub-block, and wherein each sub-block includes at least one source symbol;
    determining a value, WS, representing a maximum size for a sub-block based on a memory constraint;
    determining a value SS, wherein SS*AL represents a lower bound for sub-symbol size, in units of a preferred memory unit size, AL;
    determining which blocks of the integer number of blocks is to be organized into a plurality of sub-blocks, and for each such block, organizing the block into a plurality of sub-blocks having a size determined by the available space within packets for encoded symbols that are to be sent, a symbol size that is to be used within each sent packet, in a manner to ensure that a number of source symbols for source blocks is equal within a threshold and the number is equal to the number, Kt, of source symbols in the file and to ensure that the sub-symbol size of each sub-block is at most SS*AL and to ensure that the size of each sub-block is at most WS;
    generating encoded symbols from blocks, wherein sub-symbols are generated from sub-blocks such that each encoded symbol depends on data from one block; and
    outputting the generated encoded symbols.

76. An apparatus for recovering a block of data at a receiver using a client coupled to a data network, wherein a block includes a grouping of one or more sub-blocks, the apparatus comprising:
  memory; and
  a processor;
  the memory and processor configured to perform operations comprising:
    receiving a plurality of encoded symbols generated from the block, wherein each encoded symbol includes a plurality of sub-symbols generated from at least one sub-block using a common set of operations;
    determining a value, WS, representing a maximum size for a sub-block based on a memory constraint;
    determining a value SS, wherein SS*AL represents a lower bound for sub-symbol size, in units of a preferred memory unit size, AL;
    determining which blocks of the integer number of blocks organized into a plurality of sub-blocks, and for each such block, organizing the block into a plurality of sub-blocks having a size determined by a first parameter set by a sender representing available space within packets, a second parameter representing a symbol size used within each packet, the parameters being such that a number of source symbols for source blocks is equal within a threshold and the number is equal to the number, Kt, of source symbols in the file;
    decoding blocks from received encoded symbols, wherein sub-blocks are decoded from sub-symbols and the sub-blocks form blocks, wherein the sub-symbol size of each sub-block is at most SS*AL and the size of each sub-block is at most WS; and
    outputting the decoded blocks.

77. A non-transitory processor-readable storage medium having stored thereon processor-executable instructions configured to cause a processor of a computing device to perform operations for encoding data to be transmitted via one or more transmitters capable of outputting a signal, the operations comprising:
  obtaining an ordered set of source symbols;
  generating a set of intermediate symbols from the ordered set of source symbols, wherein the source symbols can be regenerated from the set of intermediate symbols;
  designating sets of the intermediate symbols such that each intermediate symbol is designated as a member of one of the sets of intermediate symbols and there are at least a first set of intermediate symbols and a second set of intermediate symbols, and wherein each set of intermediate symbols has associated with it distinct encoding parameters and has as members at least one intermediate symbol; and generating a plurality of encoded symbols, wherein an encoded symbol is generated from one or more of the intermediate symbols, wherein at least one encoded symbol is generated, directly or indirectly, from a plurality of intermediate symbols selected from a plurality of the sets of intermediate symbols.

78. The non-transitory processor-readable storage medium of claim 77, wherein the stored processor-executable instructions are configured to cause the processor to perform operations such that the first set of intermediate symbols are designated as symbols for belief propagation decoding and the second set of intermediate symbols are designated as symbols to be inactivated for belief propagation decoding.

79. The non-transitory processor-readable storage medium of claim 77, wherein the stored processor-executable instructions are configured to cause the processor to perform operations such that each encoded symbol is generated from a combination of a first symbol generated from one or more of the first set of intermediate symbols and a second symbol generated from one or more of the second set of intermediate symbols.

80. The non-transitory processor-readable storage medium of claim 79, wherein the stored processor-executable instructions are configured to cause the processor to perform operations such that the distinct encoding parameters comprise at least distinct degree distributions, such that each encoded symbol is generated from a combination of a first symbol generated from one or more of the first set of intermediate symbols having a first degree distribution and a second symbol generated from one or more of the second set of intermediate symbols having a second degree distribution different from the first degree distribution.

81. The non-transitory processor-readable storage medium of claim 79, wherein the stored processor-executable instructions are configured to cause the processor to perform operations such that the first symbol is generated using a chain reaction encoding process applied to the first set of intermediate symbols.

82. The non-transitory processor-readable storage medium of claim 79, wherein the stored processor-executable instructions are configured to cause the processor to perform operations such that the second symbol is an XOR of a fixed number of symbols chosen randomly from the second set of intermediate symbols.

83. The non-transitory processor-readable storage medium of claim 79, wherein the stored processor-executable instructions are configured to cause the processor to perform operations such that the second symbol is an XOR of a first number of symbols chosen randomly from the second set of intermediate symbols, and the first number depends on a second number equal to a number of the symbols chosen from the first set to generate the first symbol.

84. The non-transitory processor-readable storage medium of claim 79, wherein the stored processor-executable instructions are configured to cause the processor to perform operations such that the combination is the XOR of the first symbol and the second symbol.

85. The non-transitory processor-readable storage medium of claim 77, wherein the stored processor-executable instructions are configured to cause the processor to perform operations such that the intermediate symbols comprise the ordered set of source symbols and a set of redundant source symbols generated from the ordered set of source symbols.

86. The non-transitory processor-readable storage medium of claim 85, wherein the stored processor-executable instructions are configured to cause the processor to perform operations such that at least some of the redundant symbols are generated using a GF[2] operations and other redundant symbols are generated using GF[256] operations.

87. The non-transitory processor-readable storage medium of claim 77, wherein the stored processor-executable instructions are configured to cause the processor to perform operations such that the intermediate symbols are generated, during encoding, from the source symbols using a decoding process, and the decoding process is based on a linear set of relations between the intermediate symbols and the source symbols.

88. The non-transitory processor-readable storage medium of claim 87, wherein the stored processor-executable instructions are configured to cause the processor to perform operations such that at least some of the linear relations are relations over GF[2] and other linear relations are relations over GF[256].

89. The non-transitory processor-readable storage medium of claim 77, wherein the stored processor-executable instructions are configured to cause the processor to perform operations such that the number of distinct encoded symbols that can be generated from a given ordered set of source symbols is independent of the number of source symbols in that ordered set.

90. The non-transitory processor-readable storage medium of claim 77, wherein the stored processor-executable instructions are configured to cause the processor to perform operations such that an average number of symbol operations performed to generate an encoded symbol is bounded by a constant independent of the number of source symbols in that ordered set.

91. The non-transitory processor-readable storage medium of claim 77, wherein the stored processor-executable instructions are configured to cause the processor to perform operations such that the first set of symbols is more than an order of magnitude larger than the second set of symbols.

92. A non-transitory processor-readable storage medium having stored thereon processor-executable instructions configured to cause a processor of a computing device to perform operations decoding data a set of received encoded symbols, the set of received encoded symbols derived from an ordered set of source symbols, the operations comprising:
obtaining the set of received encoded symbols;
decoding a set of intermediate symbols from the set of received encoded symbols;
associating each of the intermediate symbols with a set of intermediate symbols, wherein the intermediate symbols are associated into at least two sets, and wherein one set is designated as a set of permanently inactive symbols for purposes of scheduling a decoding process to recover the intermediate symbols from the received encoded symbols; and
recovering at least some of the source symbols of the ordered set of source symbols from the set of intermediate symbols according to the decoding process.

93. The non-transitory processor-readable storage medium of claim 92, wherein the stored processor-executable instructions are configured to cause the processor to perform operations such that the decoding process comprises at least a first decoding phase, and a set of reduced encoded symbols are generated that depend on a second set of permanently inactive symbols and a third set of dynamically inactive symbols that is a subset of the first set of symbols, and a second decoding phase, and the set of reduced encoded symbols is used to decode the second set of permanently inactive symbols and the third set of dynamically inactive symbols, and a third decoding phase, and the decoded second set of permanently inactive symbols and the third set of dynamically inactive symbols and the set of received encoded symbols is used to decode at least some of the remaining intermediate symbols that are in the first set of symbols.

94. The non-transitory processor-readable storage medium of claim 93, wherein the stored processor-executable instructions are configured to cause the processor to perform operations such that the first decoding phase uses belief propagation decoding combined with inactivation decoding, and/or the second decoding phase uses Gaussian elimination.

95. The non-transitory processor-readable storage medium of claim 93, wherein the stored processor-executable instructions are configured to cause the processor to perform operations such that the third decoding phase uses back substitution or a back sweep followed by a forward sweep.

96. The non-transitory processor-readable storage medium of claim 93, wherein the stored processor-executable instructions are configured to cause the processor to perform operations such that the decoding process operates on the third set of dynamically inactive symbols considering that the number of symbols in third set of dynamically inactive symbols is less than 10% of the number of source symbols and/or less than 10% of the number of symbols in the second set of permanently inactive symbols.

97. The non-transitory processor-readable storage medium of claim 92, wherein the stored processor-executable instructions are configured to cause the processor to perform operations such that the received encoded symbols are operated on as LDPC code generated symbols or Reed-Solomon code generated symbols.

98. The non-transitory processor-readable storage medium of claim 92, wherein the stored processor-executable instructions are configured to cause the processor to perform operations such that each received encoded symbol of the set of received encoded symbols is operated on as being a combination of a first symbol generated from one or more of the first set of symbols and a second symbol generated from one or more of the second set of symbols.

99. The non-transitory processor-readable storage medium of claim 98, wherein the stored processor-executable instructions are configured to cause the processor to perform operations such that each received encoded symbol is operated on as the combination being an XOR of the first symbol and the second symbol.

100. The non-transitory processor-readable storage medium of claim 98, wherein the stored processor-executable instructions are configured to cause the processor to perform operations such that each received encoded symbol is operated on as the second symbol being an XOR of a fixed number of symbols that was chosen randomly from the second set.

101. The non-transitory processor-readable storage medium of claim 98, wherein the stored processor-executable instructions are configured to cause the processor to perform operations such that each received encoded symbol is operated on as the second symbol being an XOR of a first number of symbols that was chosen randomly from the second set, wherein the stored processor-executable instructions are configured to cause the processor to perform operations such that the first number of symbols depends on the second number of symbols that was chosen from the first set to generate the first symbol.

102. The non-transitory processor-readable storage medium of claim 98, wherein the stored processor-executable instructions are configured to cause the processor to perform operations such that the decoding process operates as if the first symbol was chosen based on a chain reaction code from the first set of symbols.

103. The non-transitory processor-readable storage medium of claim 92, wherein the stored processor-executable instructions are configured to cause the processor to perform operations such that the decoding process operates as if the size of the second set of permanently inactive symbols is proportional to the square root of the number of source symbols.

104. The non-transitory processor-readable storage medium of claim 92, wherein the stored processor-executable instructions are configured to cause the processor to perform operations such that the decoding process operates as if the intermediate symbols comprise the ordered set of source symbols and a set of redundant symbols generated from the ordered set of source symbols.

105. The non-transitory processor-readable storage medium of claim 98, wherein the stored processor-executable instructions are configured to cause the processor to perform operations such that the decoding process operates as if at least some of the redundant symbols were generated using GF[2] operations and other redundant symbols were generated using GF[256] operations.

106. The non-transitory processor-readable storage medium of claim 92, wherein the stored processor-executable instructions are configured to cause the processor to perform operations such that the decoding process operates as if the intermediate symbols comprise the ordered set of source symbols.

107. The non-transitory processor-readable storage medium of claim 92, wherein the stored processor-executable instructions are configured to cause the processor to perform operations such that the decoding process operates as if the intermediate symbols are symbols that were generated from the source symbols using a decoding process based on a linear set of relations between the intermediate symbols and the source symbols.

108. The non-transitory processor-readable storage medium of claim 107, wherein the stored processor-executable instructions are configured to cause the processor to perform operations such that the decoding process operates as if at least some of the linear relations are relations over GF[2] and other linear relations are relations over GF[256].

109. The non-transitory processor-readable storage medium of claim 92, wherein the stored processor-executable instructions are configured to cause the processor to perform operations such that the decoding process operates as if the number of different possible encoded symbols that can be received is independent of the number of source symbols in the ordered set.

110. The non-transitory processor-readable storage medium of claim 92, wherein the stored processor-executable instructions are configured to cause the processor to perform operations such that an average number of symbol operations performed to decode the set of source symbols from the set of received encoded symbols is bounded by a constant times the number of source symbols, and the constant is independent of the number of source symbols.

111. The non-transitory processor-readable storage medium of claim 92, wherein the stored processor-executable instructions are configured to cause the processor to perform operations such that the decoding process operates as if the number of symbols in the first set of symbols is more than an order of magnitude larger than the number of symbols in the second set of permanently inactive symbols.

112. The non-transitory processor-readable storage medium of claim 92, wherein the stored processor-executable instructions are configured to cause the processor to perform operations such that the decoding process operates such that recovery of all of the set of K source symbols from a set of N=K+A encoded symbols, for some K, N and A, has a probability of success of at least a lower bound of $1-(0.01)\hat{\,}(A+1)$ for A=0, 1 or 2, with the lower bound being independent of the number of source symbols.

113. A non-transitory processor-readable storage medium having stored thereon processor-executable instructions configured to cause a processor of a computing device to perform operations for serving a file using a server coupled to a data network, wherein serving includes organizing data of the file into one or more blocks, generating one or more encoded symbols for a block based on the data of the block, and wherein at least one block is physically or logically organized into a plurality of sub-blocks and at least one encoded symbol is physically or logically organized into a plurality of sub-symbols, the operations comprising:

partitioning an input file into an integer number of blocks, wherein each block includes at least one sub-block, and wherein each sub-block includes at least one source symbol;

determining a value, WS, representing a maximum size for a sub-block based on a memory constraint;

determining a value SS, wherein SS*AL represents a lower bound for sub-symbol size, in units of a preferred memory unit size, AL;

determining which blocks of the integer number of blocks is to be organized into a plurality of sub-blocks, and for each such block, organizing the block into a plurality of sub-blocks having a size determined by the available space within packets for encoded symbols that are to be sent, a symbol size that is to be used within each sent packet, in a manner to ensure that a number of source symbols for source blocks is equal within a threshold and the number is equal to the number, Kt, of source symbols in the file and to ensure that the sub-symbol size of each sub-block is at most SS*AL and to ensure that the size of each sub-block is at most WS;

generating encoded symbols from blocks, wherein sub-symbols are generated from sub-blocks such that each encoded symbol depends on data from one block; and outputting the generated encoded symbols.

114. A non-transitory processor-readable storage medium having stored thereon processor-executable instructions configured to cause a processor of a computing device to perform operations for recovering a block of data at a receiver using a client coupled to a data network, wherein a block includes a grouping of one or more sub-blocks, the operations comprising:

receiving a plurality of encoded symbols generated from the block, wherein each encoded symbol includes a plurality of sub-symbols generated from at least one sub-block using a common set of operations;

determining a value, WS, representing a maximum size for a sub-block based on a memory constraint;

determining a value SS, wherein SS*AL represents a lower bound for sub-symbol size, in units of a preferred memory unit size, AL;

determining which blocks of the integer number of blocks organized into a plurality of sub-blocks, and for each such block, organizing the block into a plurality of sub-blocks having a size determined by a first parameter set by a sender representing available space within packets, a second parameter representing a symbol size used within each packet, the parameters being such that a number of source symbols for source blocks is equal within a threshold and the number is equal to the number, Kt, of source symbols in the file;

decoding blocks from received encoded symbols, wherein sub-blocks are decoded from sub-symbols and the sub-blocks form blocks, wherein the sub-symbol size of each sub-block is at most SS*AL and the size of each sub-block is at most WS; and outputting the decoded blocks.

\* \* \* \* \*